(12) United States Patent
Hennick et al.

(10) Patent No.: US 7,878,403 B2
(45) Date of Patent: Feb. 1, 2011

(54) IMAGE SENSOR BASED OPTICAL READER

(75) Inventors: Robert J. Hennick, Cayuga, NY (US);
Charles P. Barber, Fayetteville, NY (US); Eric C. Coleman, Liverpool, NY (US); Michael A. Ehrhart, Liverpool, NY (US); Colleen P. Gannon, Jordan, NY (US); Robert C. Gardiner, Fayetteville, NY (US); William H. Havens, Syracuse, NY (US); Vivian L. Hunter, Baldwinsville, NY (US); Melvin D. McCall, Homer, NY (US); Thomas Ruhlman, Skaneateles, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 0 days.

(21) Appl. No.: 12/467,861

(22) Filed: May 18, 2009

(65) Prior Publication Data

US 2009/0236424 A1    Sep. 24, 2009

Related U.S. Application Data

(60) Division of application No. 11/517,013, filed on Sep. 6, 2006, now Pat. No. 7,533,824, which is a division of application No. 10/093,135, filed on Mar. 7, 2002, now Pat. No. 7,270,274, which is a continuation-in-part of application No. 09/802,579, filed on Mar. 8, 2001, now Pat. No. 6,601,768, which is a continuation-in-part of application No. 09/411,936, filed on Oct. 4, 1999, now abandoned.

(60) Provisional application No. 60/301,036, filed on Jun. 26, 2001, provisional application No. 60/327,249, filed on Oct. 5, 2001, provisional application No. 60/322,776, filed on Sep. 11, 2001, provisional application No. 60/328,855, filed on Oct. 12, 2001, provisional application No. 60/345,523, filed on Nov. 9, 2001.

(51) Int. Cl.
*G06K 7/10* (2006.01)

(52) U.S. Cl. .............................. 235/462.11; 235/462.2; 235/462.21

(58) Field of Classification Search ............ 235/462.11, 235/462.2, 462.21, 462.45
See application file for complete search history.

(56) References Cited

U.S. PATENT DOCUMENTS 3,718,761 A    2/1973    Myer (Continued)

FOREIGN PATENT DOCUMENTS

DE    1233038 B    1/1967

(Continued)

OTHER PUBLICATIONS

Office action of Corresponding Japanese Patent Application No. JP2002-571699, dated May 2, 2008, (2 pages) including English translation of Office action of Corresponding Japanese Patent Application No. JP2002-571699, dated May 2, 2008, (3 pages).

(Continued)

*Primary Examiner*—Ahshik Kim
(74) *Attorney, Agent, or Firm*—Marjama, Muldoon, Blasiak & Sullivan LLP

(57) ABSTRACT

An optical reader can include an image sensor. In one embodiment an optical reader can be configured to have different operating modes, the different operating modes optimizing the reader for reading different indicia. In another embodiment an optical reader can comprise a multiple color emitting light source. In another embodiment an optical reader can be provided in a specialized form factor including an enlarged head portion and an elongated body portion extending from the head portion.

29 Claims, 40 Drawing Sheets

U.S. PATENT DOCUMENTS

| | | |
|---|---|---|
| 4,085,423 A | 4/1978 | Tsunoda et al. |
| 4,092,698 A | 5/1978 | Brefka |
| 4,158,194 A | 6/1979 | McWaters et al. |
| 4,315,245 A | 2/1982 | Nakahara et al. |
| 4,471,384 A | 9/1984 | Sato et al. |
| 4,488,679 A | 12/1984 | Bockholt et al. |
| 4,570,057 A | 2/1986 | Chadima, Jr. et al. |
| 4,721,473 A | 1/1988 | DelGuidice et al. |
| 4,743,773 A | 5/1988 | Katana et al. |
| 4,818,847 A | 4/1989 | Hara et al. |
| 4,823,277 A | 4/1989 | Reed |
| 4,832,003 A | 5/1989 | Yabe |
| 4,847,490 A | 7/1989 | Nishikama et al. |
| 4,900,907 A | 2/1990 | Matusima et al. |
| 4,918,297 A | 4/1990 | Kurimoto et al. |
| 4,953,539 A | 9/1990 | Nakamura et al. |
| 5,010,241 A | 4/1991 | Butterworth |
| 5,019,699 A | 5/1991 | Koenck |
| 5,023,447 A | 6/1991 | Masuko et al. |
| 5,059,778 A | 10/1991 | Zouzoulas et al. |
| 5,100,479 A | 3/1992 | Wise et al. |
| 5,132,525 A | 7/1992 | Swartz et al. |
| 5,155,401 A | 10/1992 | Kanaya et al. |
| 5,171,985 A | 12/1992 | Kawaguchi et al. |
| 5,187,612 A | 2/1993 | Plesko |
| 5,210,406 A | 5/1993 | Beran et al. |
| 5,254,844 A | 10/1993 | Krichever et al. |
| 5,280,161 A | 1/1994 | Niwa et al. |
| 5,280,162 A | 1/1994 | Marwin |
| 5,286,960 A | 2/1994 | Longacre, Jr. et al. |
| 5,291,008 A | 3/1994 | Havens et al. |
| 5,291,009 A | 3/1994 | Roustaei |
| 5,291,028 A | 3/1994 | Droge et al. |
| 5,294,783 A | 3/1994 | Hammond, Jr. et al. |
| 5,296,689 A | 3/1994 | Reddersen et al. |
| 5,308,962 A | 5/1994 | Havens et al. |
| 5,319,182 A | 6/1994 | Havens et al. |
| 5,331,176 A | 7/1994 | Sant'Anselmo et al. |
| 5,340,971 A | 8/1994 | Rockstein et al. |
| 5,359,185 A | 10/1994 | Hanson |
| 5,371,347 A | 12/1994 | Plesko |
| 5,378,883 A | 1/1995 | Batterman et al. |
| 5,420,411 A | 5/1995 | Salatto, Jr. et al. |
| 5,430,286 A | 7/1995 | Hammond, Jr. et al. |
| 5,449,892 A | 9/1995 | Yamada et al. |
| 5,468,950 A | 11/1995 | Hanson |
| 5,469,291 A | 11/1995 | Plesko |
| 5,473,149 A | 12/1995 | Miwa et al. |
| 5,476,387 A | 12/1995 | Ramey et al. |
| 5,484,994 A | 1/1996 | Roustaei |
| 5,504,317 A | 4/1996 | Takahashi et al. |
| 5,504,367 A | 4/1996 | Arackellian et al. |
| 5,506,394 A | 4/1996 | Plesko |
| 5,510,607 A | 4/1996 | Ishikawa et al. |
| 5,519,198 A | 5/1996 | Plesko |
| 5,521,366 A | 5/1996 | Wang et al. |
| 5,550,364 A | 8/1996 | Rudeen |
| 5,550,366 A | 8/1996 | Roustaei |
| 5,550,367 A | 8/1996 | Plesko |
| 5,550,675 A | 8/1996 | Komatsu et al. |
| 5,569,902 A | 10/1996 | Wood et al. |
| 5,572,006 A | 11/1996 | Wang et al. |
| 5,589,679 A | 12/1996 | Dvorkis et al. |
| 5,596,442 A | 1/1997 | Plesko |
| 5,596,446 A | 1/1997 | Plesko |
| 5,598,007 A | 1/1997 | Bunce et al. |
| 5,600,116 A | 2/1997 | Seo et al. |
| 5,602,379 A | 2/1997 | Uchimura et al. |
| 5,612,530 A | 3/1997 | Sanders et al. |
| 5,621,203 A | 4/1997 | Swartz et al. |
| 5,623,137 A | 4/1997 | Powers et al. |
| 5,646,390 A | 7/1997 | Wang et al. |
| 5,656,805 A | 8/1997 | Plesko |
| 5,684,104 A | 11/1997 | Funk et al. |
| 5,684,290 A | 11/1997 | Arackellian et al. |
| 5,691,834 A | 11/1997 | Plesko |
| 5,697,699 A | 12/1997 | Seo et al. |
| 5,702,059 A | 12/1997 | Chu et al. |
| 5,703,349 A | 12/1997 | Meyerson et al. |
| 5,714,745 A | 2/1998 | Ju et al. |
| 5,714,746 A | 2/1998 | Dvorkis et al. |
| 5,723,868 A | 3/1998 | Hammond, Jr. et al. |
| 5,734,153 A | 3/1998 | Swartz et al. |
| 5,736,725 A | 4/1998 | Danielson |
| 5,743,633 A | 4/1998 | Chau et al. |
| 5,744,815 A | 4/1998 | Gurevich et al. |
| 5,745,176 A | 4/1998 | Lebens |
| 5,750,976 A | 5/1998 | Eastman et al. |
| 5,753,908 A | 5/1998 | Christensen |
| 5,756,981 A | 5/1998 | Roustaei et al. |
| 5,763,864 A | 6/1998 | O'Hagan et al. |
| 5,777,314 A | 7/1998 | Roustaei |
| 5,777,743 A | 7/1998 | Bacchi et al. |
| 5,780,834 A | 7/1998 | Havens et al. |
| 5,783,811 A | 7/1998 | Feng et al. |
| 5,784,102 A | 7/1998 | Hussey et al. |
| 5,786,582 A | 7/1998 | Roustaei et al. |
| 5,786,586 A | 7/1998 | Pidhirny et al. |
| 5,793,033 A | 8/1998 | Feng et al. |
| 5,804,809 A | 9/1998 | Eastman et al. |
| 5,811,774 A | 9/1998 | Ju et al. |
| 5,811,784 A | 9/1998 | Tausch et al. |
| 5,814,803 A | 9/1998 | Olmstead et al. |
| 5,815,200 A | 9/1998 | Ju et al. |
| 5,818,028 A | 10/1998 | Meyerson et al. |
| 5,821,513 A | 10/1998 | O'Hagan et al. |
| 5,821,518 A | 10/1998 | Sussmeier et al. |
| 5,828,052 A * | 10/1998 | Reynolds et al. ....... 235/472.01 |
| 5,831,261 A | 11/1998 | Plesko |
| 5,834,754 A | 11/1998 | Feng et al. |
| 5,837,985 A | 11/1998 | Karpen |
| 5,841,121 A | 11/1998 | Koenck |
| 5,850,078 A | 12/1998 | Giordano et al. |
| 5,859,417 A | 1/1999 | Dvorkis et al. |
| 5,864,128 A | 1/1999 | Plesko |
| 5,872,354 A | 2/1999 | Hanson |
| 5,877,487 A | 3/1999 | Tani et al. |
| 5,880,450 A | 3/1999 | Katoh et al. |
| 5,880,452 A | 3/1999 | Plesko |
| 5,886,338 A | 3/1999 | Arackellian et al. |
| 5,894,348 A | 4/1999 | Bacchi et al. |
| 5,902,988 A | 5/1999 | Durbin |
| 5,902,997 A | 5/1999 | Kropp et al. |
| 5,912,451 A | 6/1999 | Gurevich et al. |
| 5,917,171 A | 6/1999 | Sasai et al. |
| 5,920,061 A | 7/1999 | Feng |
| 5,932,860 A | 8/1999 | Plesko |
| 5,942,743 A | 8/1999 | Schmidt et al. |
| 5,949,054 A | 9/1999 | Karpen et al. |
| 5,949,057 A | 9/1999 | Feng |
| 5,962,836 A | 10/1999 | Tani et al. |
| 5,992,744 A | 11/1999 | Smith et al. |
| 5,992,746 A | 11/1999 | Suzuki et al. |
| 5,992,751 A | 11/1999 | Laser |
| 5,992,753 A | 11/1999 | Xu |
| 6,000,612 A | 12/1999 | Xu |
| 6,010,073 A | 1/2000 | Bianchi et al. |
| 6,019,286 A | 2/2000 | Li et al. |
| 6,029,893 A | 2/2000 | Tan et al. |
| 6,034,379 A | 3/2000 | Bunte et al. |
| 6,039,255 A | 3/2000 | Seo et al. |
| 6,042,013 A | 3/2000 | Fork |
| 6,045,047 A | 4/2000 | Pidhirny et al. |
| 6,052,236 A | 4/2000 | Nakasuji et al. |

| | | | |
|---|---|---|---|
| 6,060,722 A | 5/2000 | Havens et al. | |
| 6,062,475 A | 5/2000 | Feng | |
| 6,092,728 A | 7/2000 | Li et al. | |
| 6,105,869 A | 8/2000 | Scharf et al. | |
| 6,118,569 A | 9/2000 | Plesko | |
| 6,119,939 A | 9/2000 | Schwartz et al. | |
| 6,123,261 A | 9/2000 | Roustaei | |
| 6,123,263 A | 9/2000 | Feng | |
| 6,129,276 A | 10/2000 | Jelen et al. | |
| 6,129,283 A | 10/2000 | Imade et al. | |
| 6,141,046 A | 10/2000 | Roth et al. | |
| 6,145,743 A | 11/2000 | Dvorkis et al. | |
| 6,152,371 A | 11/2000 | Schwartz et al. | |
| 6,164,544 A | 12/2000 | Schwartz et al. | |
| 6,168,079 B1 | 1/2001 | Becker et al. | |
| 6,179,208 B1 | 1/2001 | Feng | |
| 6,179,444 B1 | 1/2001 | Plesko | |
| 6,191,406 B1 | 2/2001 | Nelson et al. | |
| 6,223,986 B1 | 5/2001 | Bobba et al. | |
| 6,223,988 B1 | 5/2001 | Batterman et al. | |
| 6,275,388 B1 | 8/2001 | Hennick et al. | |
| 6,283,374 B1 | 9/2001 | Fantone et al. | |
| 6,315,204 B1 | 11/2001 | Knighton et al. | |
| 6,332,573 B1 | 12/2001 | Gu et al. | |
| 6,340,114 B1 | 1/2002 | Correa et al. | |
| 6,347,163 B2 | 2/2002 | Roustaei | |
| 6,360,949 B1 | 3/2002 | Shepard et al. | |
| 6,371,374 B1 | 4/2002 | Schwartz et al. | |
| 6,398,112 B1 | 6/2002 | Li et al. | |
| 6,547,139 B1 | 4/2003 | Havens et al. | |
| 6,550,679 B2 | 4/2003 | Hennick et al. | |
| 6,601,768 B2 | 8/2003 | McCall et al. | |
| 6,607,128 B1 | 8/2003 | Schwartz et al. | |
| 6,629,641 B2 | 10/2003 | Tsikos et al. | |
| 6,634,558 B1 | 10/2003 | Patel et al. | |
| 6,661,521 B1 | 12/2003 | Stern | |
| 6,669,093 B1 | 12/2003 | Meyerson et al. | |
| 6,681,994 B1 | 1/2004 | Koenck | |
| 6,688,523 B1 | 2/2004 | Koenck | |
| 6,732,929 B2 | 5/2004 | Good et al. | |
| 6,786,414 B2 | 9/2004 | Tsikos et al. | |
| 6,808,114 B1 | 10/2004 | Palestini et al. | |
| 6,817,525 B2 | 11/2004 | Piva et al. | |
| 6,830,184 B2 | 12/2004 | Tsikos et al. | |
| 6,832,725 B2 | 12/2004 | Gardiner et al. | |
| 6,837,437 B2 | 1/2005 | Tsikos et al. | |
| 6,843,417 B1 | 1/2005 | Philyaw et al. | |
| 6,877,664 B1 | 4/2005 | Oliva et al. | |
| 6,889,904 B2 | 5/2005 | Bianculli et al. | |
| 7,075,663 B2 | 7/2006 | Canini et al. | |
| 7,090,132 B2 | 8/2006 | Havens et al. | |
| 7,270,274 B2 | 9/2007 | Hennick et al. | |
| 7,533,824 B2 | 5/2009 | Hennick et al. | |
| 2002/0066851 A1 | 6/2002 | Hennick et al. | |
| 2003/0089776 A1 | 5/2003 | Hennick et al. | |
| 2004/0195328 A1 | 10/2004 | Barber et al. | |

FOREIGN PATENT DOCUMENTS

| | | |
|---|---|---|
| DE | 1240149 B | 5/1967 |
| DE | 2445727 | 4/1976 |
| EP | 101939 A2 | 3/1984 |
| EP | 431831 | 6/1991 |
| EP | 516927 | 12/1992 |
| EP | 548951 | 6/1993 |
| EP | 905537 | 3/1999 |
| EP | 944017 | 9/1999 |
| EP | 974924 A2 | 1/2000 |
| EP | 1079466 A2 | 2/2001 |
| EP | 1111538 A1 | 6/2001 |
| EP | 1128314 A1 | 8/2001 |
| EP | 1128315 A1 | 8/2001 |
| JP | 54021869 | 2/1979 |
| JP | 54021871 | 2/1979 |
| JP | 54109425 | 8/1979 |
| JP | 56101256 | 8/1981 |
| JP | 56151140 | 11/1981 |
| JP | 62139465 | 6/1987 |
| JP | 61231912 | 4/1988 |
| JP | 1086220 | 3/1989 |
| JP | 01-239519 A | 9/1989 |
| JP | 2041496 | 2/1990 |
| JP | 02264383 | 10/1990 |
| JP | 3228193 A | 10/1991 |
| JP | 4333187 A | 11/1992 |
| JP | 4367085 | 12/1992 |
| JP | 5096227 | 4/1993 |
| JP | 05267629 | 10/1993 |
| JP | 05-307630 A | 11/1993 |
| JP | 6089358 A | 3/1994 |
| JP | 630853 | 4/1994 |
| JP | 6096246 | 4/1994 |
| JP | 7011942 | 1/1995 |
| JP | 07-073266 A | 3/1995 |
| JP | 9035856 | 2/1997 |
| JP | 10069516 A | 3/1998 |
| JP | 11215302 | 8/1999 |
| JP | 11515124 | 12/1999 |
| JP | 2000-029979 A | 1/2000 |
| JP | 2000137787 A | 5/2000 |
| JP | 2000253242 | 9/2000 |
| WO | WO-9308539 A1 | 4/1993 |
| WO | WO-94-19764 A1 | 9/1994 |
| WO | WO-9427250 A1 | 11/1994 |
| WO | WO-9512177 A1 | 5/1995 |
| WO | WO-9535506 A2 | 12/1995 |
| WO | WO-9701828 | 1/1997 |
| WO | WO-9705560 A1 | 2/1997 |
| WO | WO-9715024 | 4/1997 |
| WO | WO-9728512 | 8/1997 |
| WO | WO-9941545 | 8/1999 |
| WO | WO-9964980 | 12/1999 |
| WO | WO-0113158 | 2/2001 |
| WO | WO-0126035 | 4/2001 |
| WO | WO-0126036 | 4/2001 |
| WO | WO-02073953 A2 | 9/2002 |

OTHER PUBLICATIONS

Office Action dated Jul. 17, 2007, Japanese Patent Application 2002-571699 (original with appended English translation), 7 pages.
PCT International Search Report. International App. #PCT/US02/07161. International Filing Date Aug. 3, 2002. International Pub. #WO 02/073953A2. (International Search Report, International Publication, PCT Written Opinion & Inter. Prelim. Exam Report att.).
PCT International Search Report. International App.#PCT/US00/27289. International Filing Date Oct. 4, 2000. International Pub. #WO 01/026036A3. (International Search Report, International Publication, PCT Written Opinion & Inter. Prelim. Exam Report att.).
The State Intellectual Property Office Of The People's Republic of China. China Application No. 00815975.0 filed Oct. 4, 2000. (Aug. 2, 2004 First Office Action attached).
Welch Allyn Data Collection, Inc. (D/B/A Hand Held Products). Imageteam (TM) 4250 2D Series Image Engine Integration Manual. Revision A dated Jun. 20, 2000. Published in Skaneateles Falls, NY.
Institute of Electrical and Electronics Engineers, Inc., Eric R. Fossum, "Digital Camera System on a Chip," Reprint, IEEE Micro, vol. 18, No. 3, May/Jun. 1998, 9 pages.
Delphion, Patent Family Report for U.S. Patent No. 2003/0089776, www.delphion.com, 4 pgs., 2005.
Delphion, Patent Family Report for U.S. Patent No. 6,601,768, www.delphion.com, 7 pgs., 2005.
Report Summarizing References of Record in Applications of Which Priority is Claimed.
Declaration by Applicant's Representative, Jan. 19, 2006. 2 pages.

Claims filed with new U.S. Divisional Patent Application No. (not yet assigned), (8 pgs), application filed Sep. 6, 2006, Express Mail Label EV887058516US.

Japanese Patent Office Notification of Reasons for Rejection for Japanese Patent Application No. 2007-042849 dated Sep. 24, 2009 (9 pages).

Japanese Patent Office Interrogation for Japanese Patent Application No. 2002-571699 dated Nov. 10, 2009.

USPTO, U.S. Appl. No. 09/411,936, Office Action Dated Jan. 31, 2002, 5 pgs.

USPTO, U.S. Appl. No. 09/411,936, Office Action dated Oct. 7, 2002, 6 pgs.

USPTO, U.S. Appl. No. 09/411,936 Office Action dated Apr. 9, 2003, 6 pgs.

USPTO, U.S. Appl. No. 09/411,936, Office Action dated Aug. 12, 2004, 6 pgs.

USPTO, U.S. Appl. No. 10/092,789, Office Action dated Aug. 19, 2003, 9 pgs.

USPTO, U.S. Appl. No. 10/092,789, Office Action dated Jan. 28, 2004, 10 pgs.

USPTO, U.S. Appl. No. 10/093,136, Office Action dated Jul. 11, 2003, 9 pgs.

USPTO, U.S. Appl. No. 10/093,136, Office Action dated Jan. 7, 2004, 8 pgs.

USPTO, U.S. Appl. No. 10/093,136, Office Action dated Aug. 4, 2004, 2 pgs.

USPTO, U.S. Appl. No. 10/093,140, Office Action dated Aug. 6, 2003, 9 pgs.

USPTO, U.S. Appl. No. 10/093,140, Office Action dated Mar. 1, 2004, 8 pgs.

USPTO, U.S. Appl. No. 10/093,167, Office Action dated Jul. 17, 2003, 8 pgs.

USPTO, U.S. Appl. No. 10/093,167, Office Action dated Jan. 26, 2004, 8 pgs.

USPTO, U.S. Appl. No. 10/375,711, Office Action dated Sep. 10, 2003, 7 pgs.

USPTO, U.S. Appl. No. 10/445,524, Office Action dated Feb. 23, 2004, 4 pgs.

USPTO, U.S. Appl. No. 10/445,524, Office Action dated May 28, 2004, 9 pgs.

USPTO, U.S. Appl. No. 10/458,353, Office Action dated Jul. 28, 2004, 7 pgs.

USPTO, U.S. Appl. No. 10/609,095, Office Action dated Sep. 23, 2004, 5 pgs.

USPTO, U.S. Appl. No. 10/613,208, Office Action dated Dec. 2, 2004, 6 pgs.

USPTO, U.S. Appl. No. 10/613,208, Office Action dated Jun. 30, 2005, 6 pgs.

USPTO, U.S. Appl. No. 10/613,208, Office Action dated May 31, 2006, 2 pgs.

USPTO, U.S. Appl. No. 10/613,208, Office Action dated Jun. 21, 2006, 2 pgs.

USPTO, U.S. Appl. No. 10/613,208, Office Action dated May 30, 2007, 2 pgs.

USPTO, U.S. Appl. No. 10/613,208, Office Action dated Sep. 26, 2007, 2 pgs.

USPTO, U.S. Appl. No. 10/861,329, Office Action dated Apr. 18, 2006, 4 pgs.

USPTO, U.S. Appl. No. 10/861,329, Office Action dated Oct. 6, 2006, 7 pgs.

USPTO, U.S. Appl. No. 11/600,591, Office Action dated Aug. 28, 2007, 4 pgs.

USPTO, U.S. Appl. No. 09/111,476, Office Action dated Feb. 25, 1999, 8 pgs.

USPTO, U.S. Appl. No. 09/658,811, Office Action dated Mar. 14, 2002, 8 pgs.

USPTO, U.S. Appl. No. 09/658,811, Office Action dated Dec. 18, 2002, 6 pgs.

USPTO, U.S. Appl. No. 09/658,811, Office Action Dated Apr. 23, 2003, 2 pgs.

USPTO, U.S. Appl. No. 09/111,583, Office Action dated Nov. 15, 1999, 11 pgs.

USPTO, U.S. Appl. No. 09/111,583, Office Action dated May 3, 2000, 10 pgs.

USPTO, U.S. Appl. No. 09/704,017, Office Action dated May 23, 2001, 7 pgs.

USPTO, U.S. Appl. No. 09/704,017, Office Action dated Jan. 11, 2002, 3 pgs.

USPTO, U.S. Appl. No. 10/079,366, Office Action dated Jul. 17, 2002, 9 pgs.

USPTO, U.S. Appl. No. 10/079,366, Office Action dated Feb. 10, 2003, 6 pgs.

USPTO, U.S. Appl. No. 10/079,366, Office Action dated May 27, 2003, 3 pgs.

Japanese Patent Office, Notice of Grounds for Rejection Office Action, dated Oct. 12, 2010 (4pgs.).

* cited by examiner

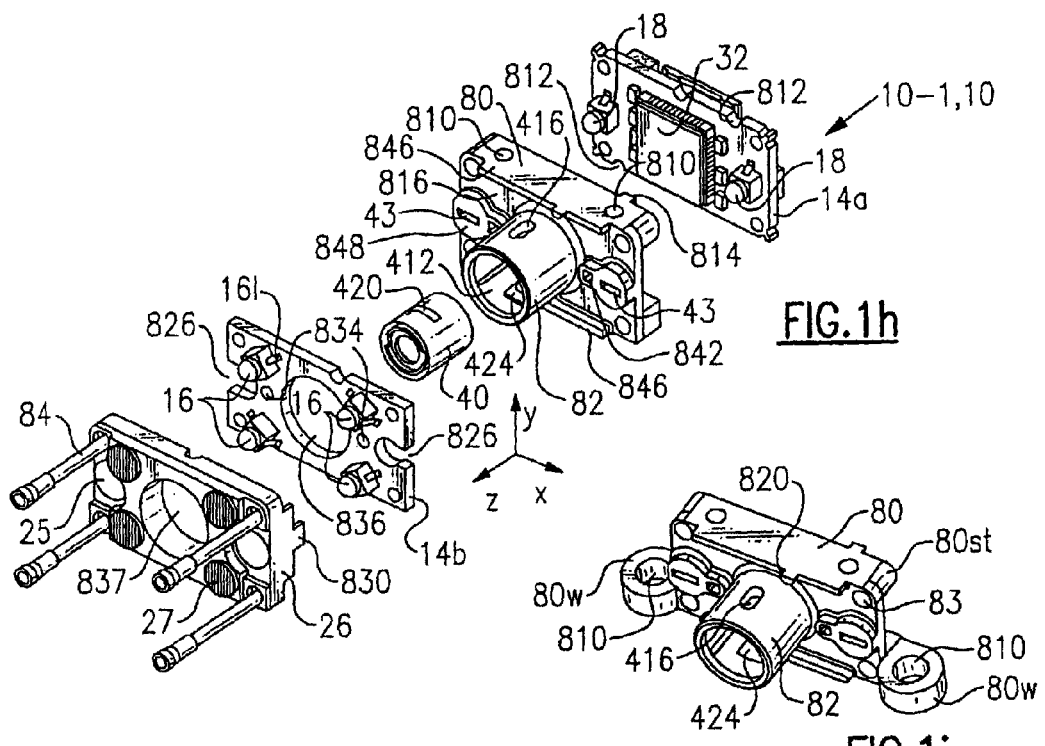
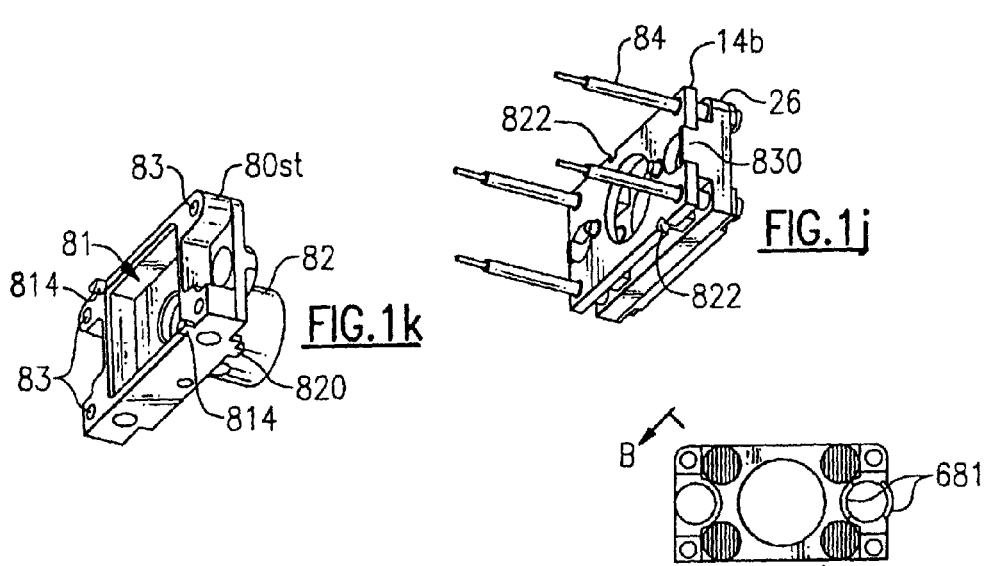
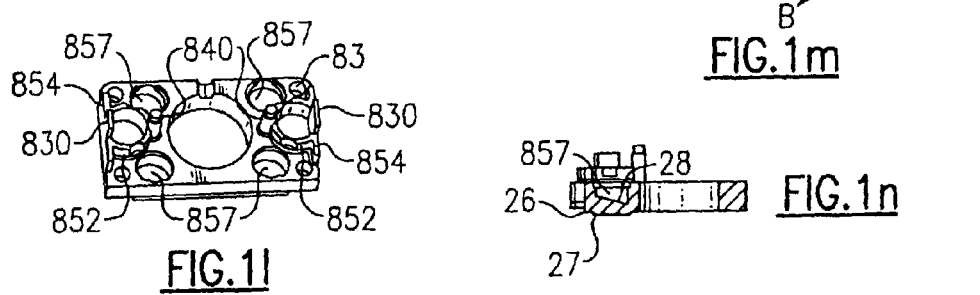

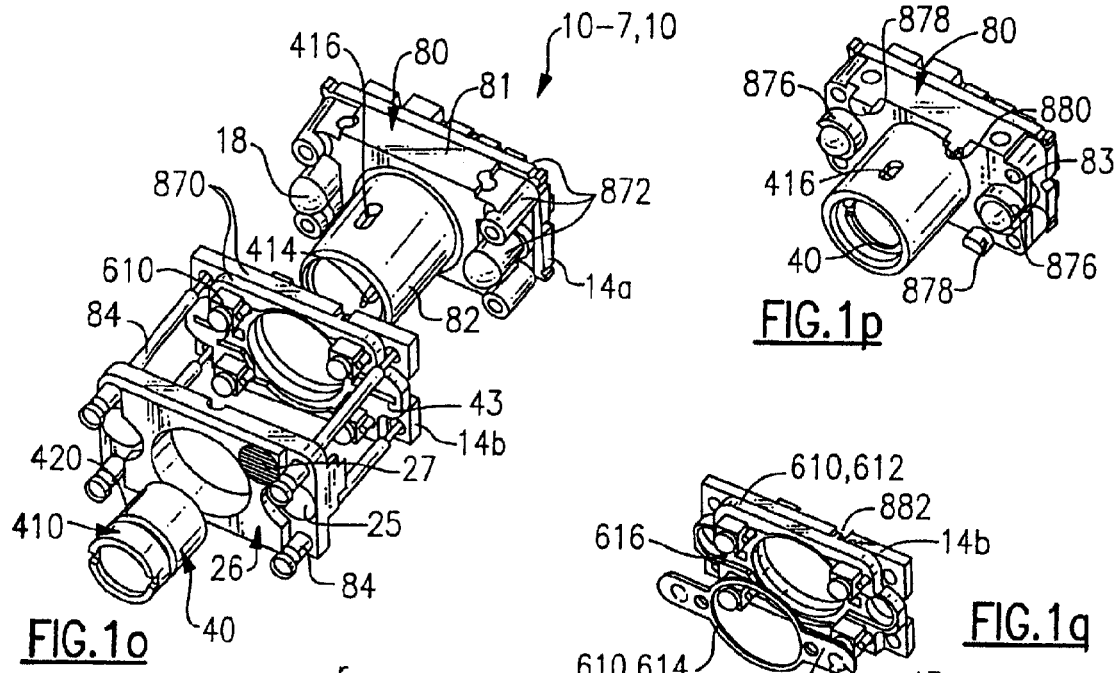
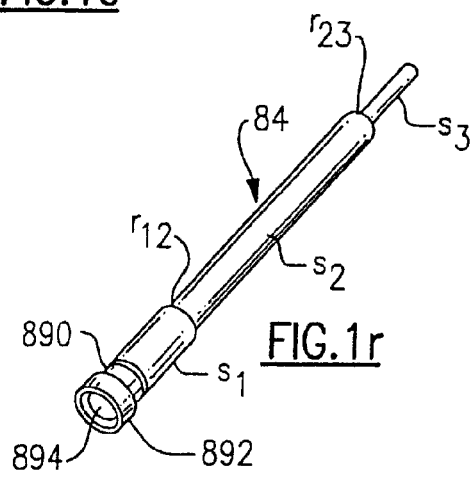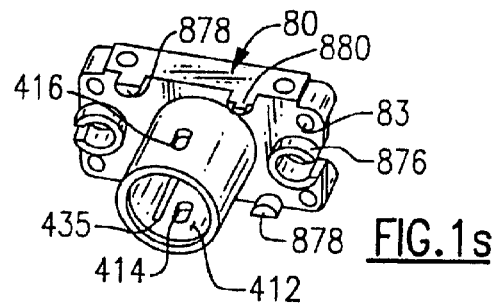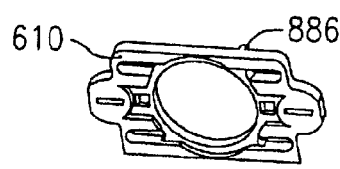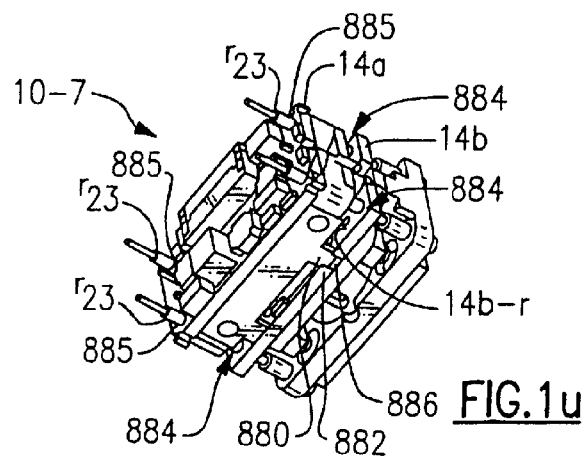

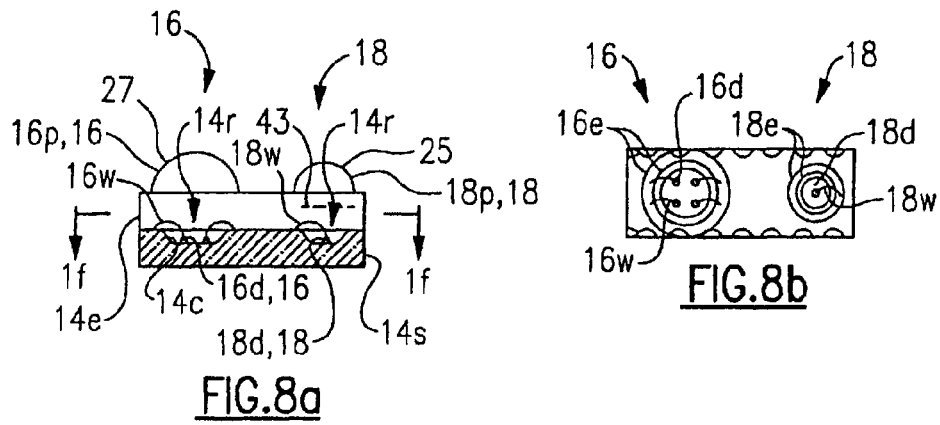
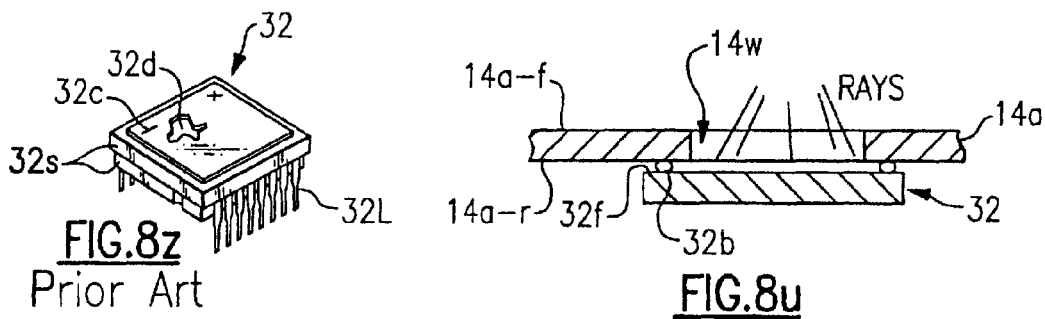
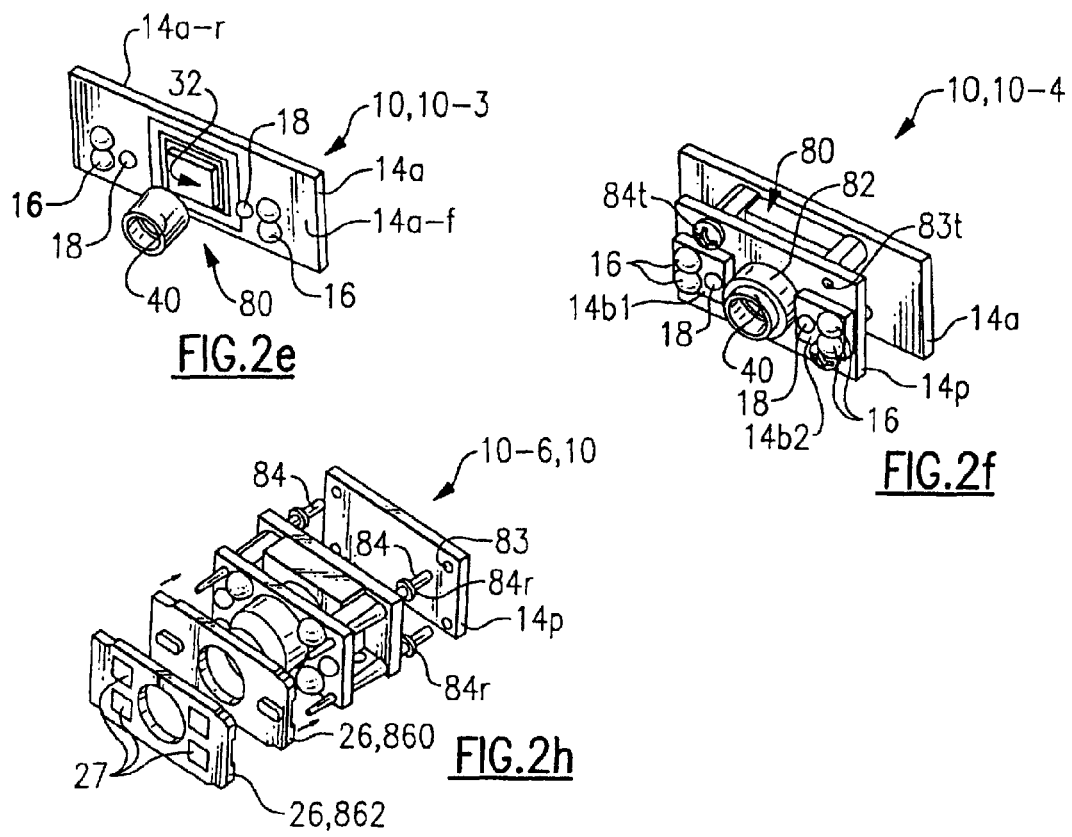

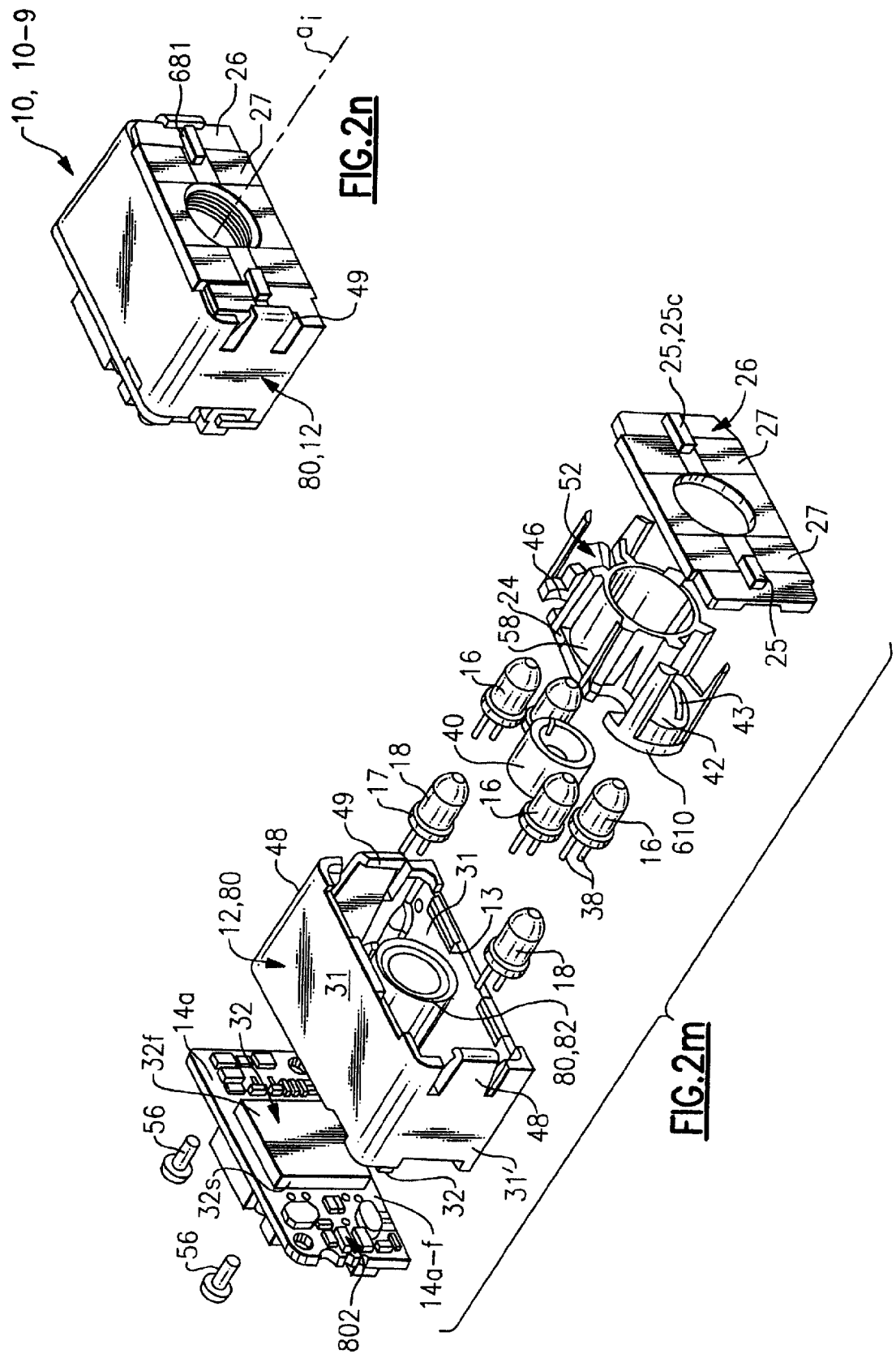

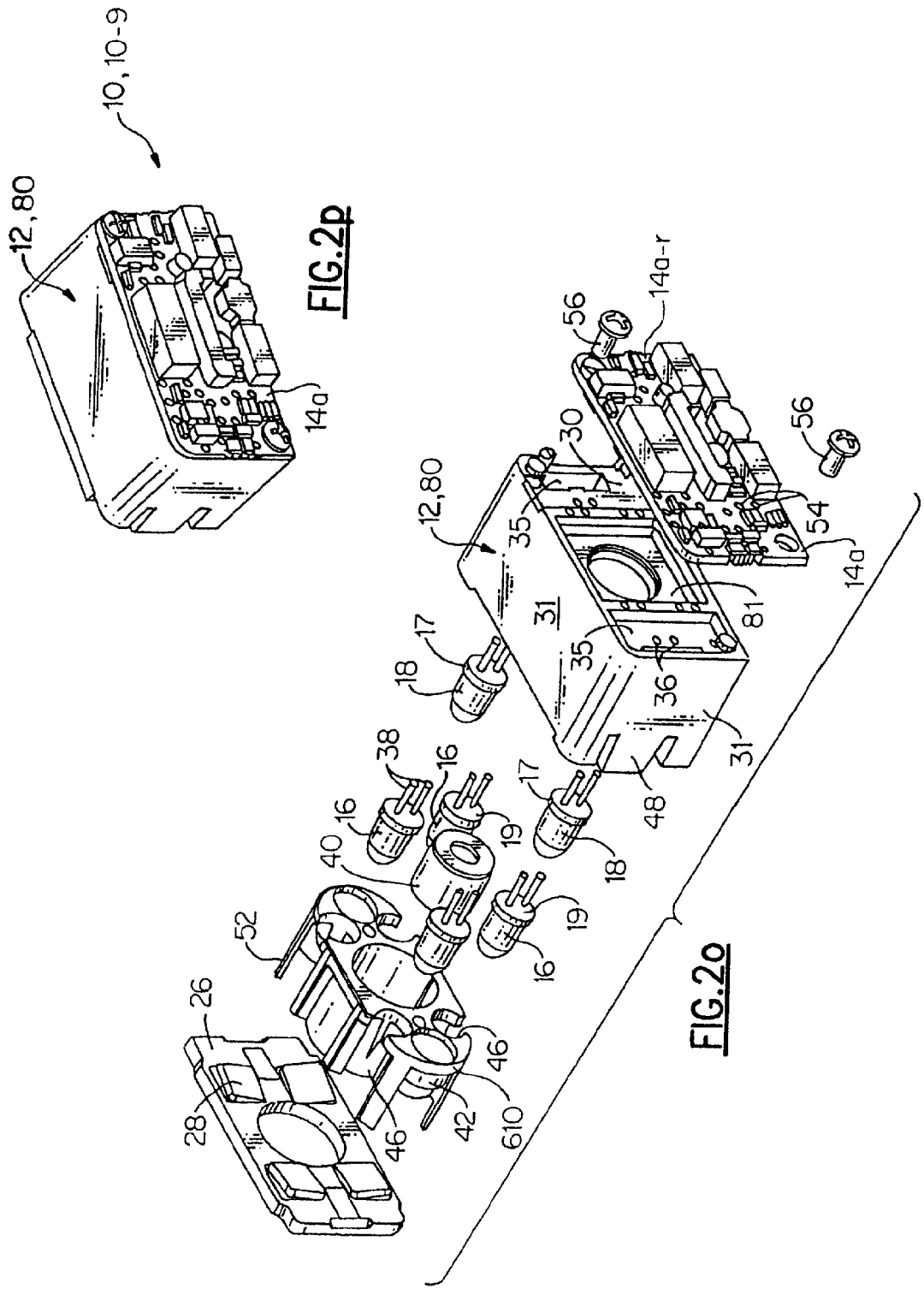

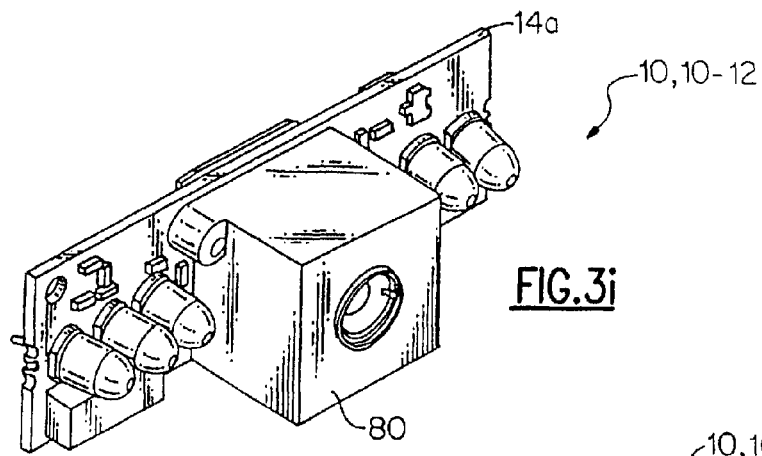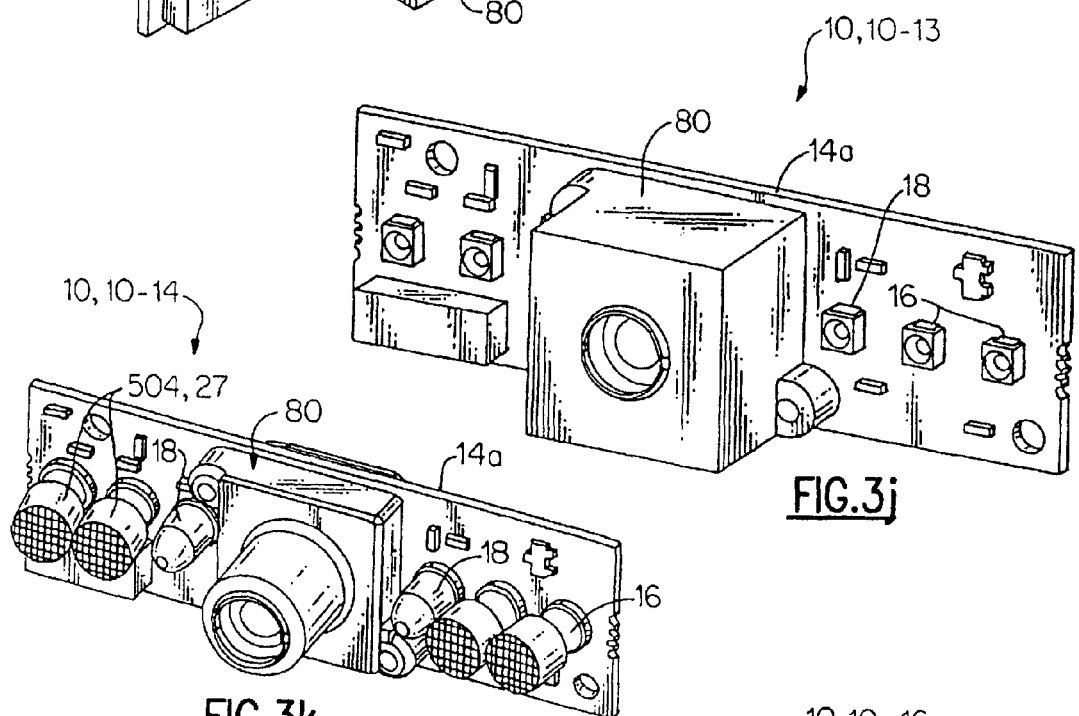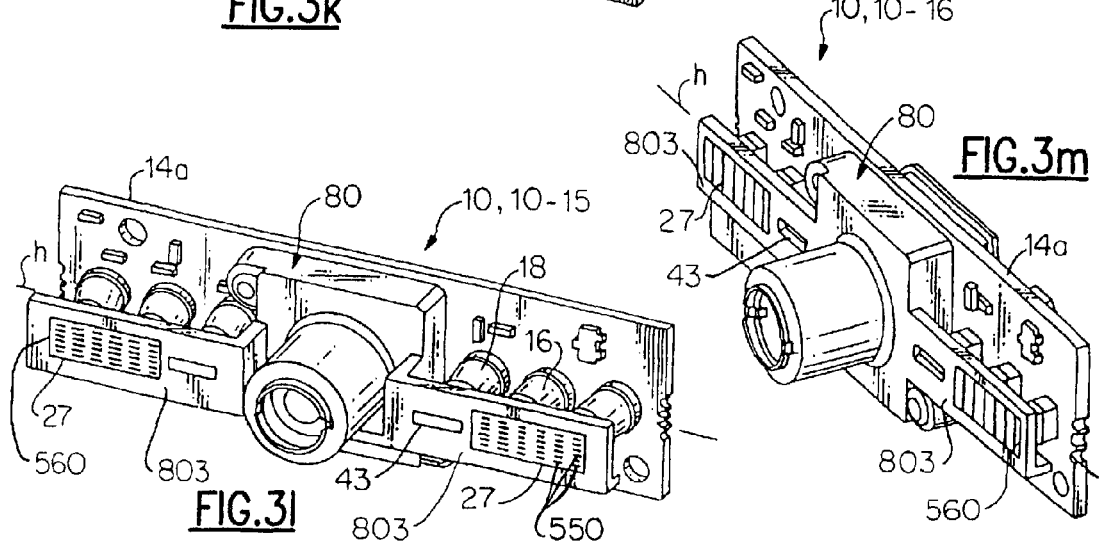

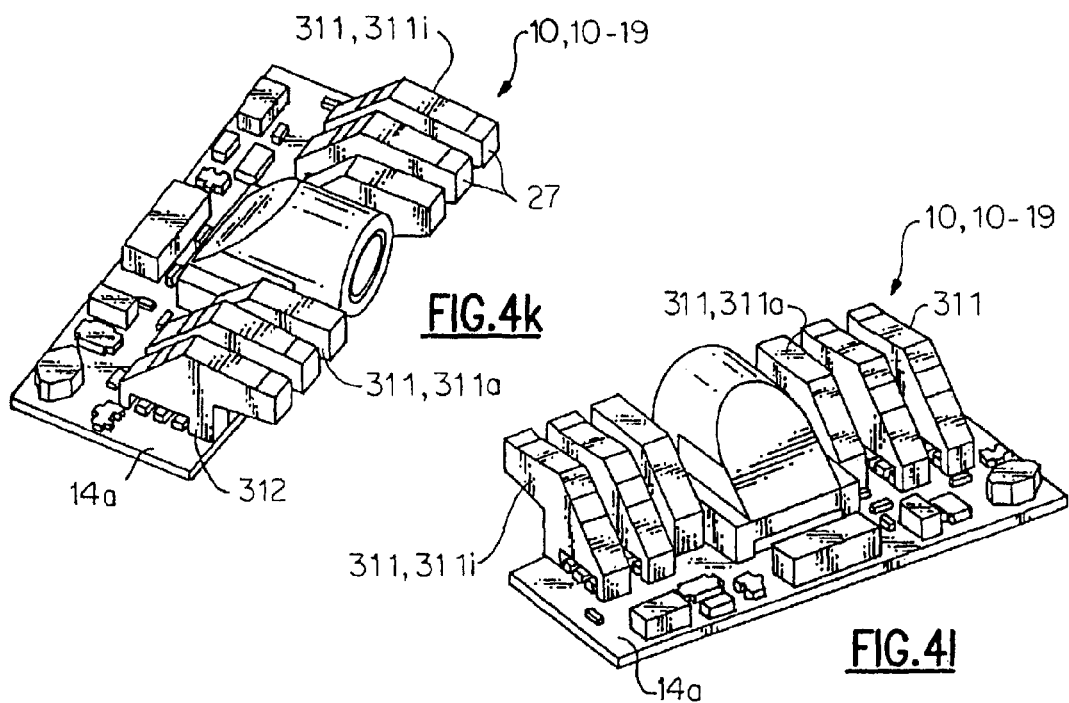
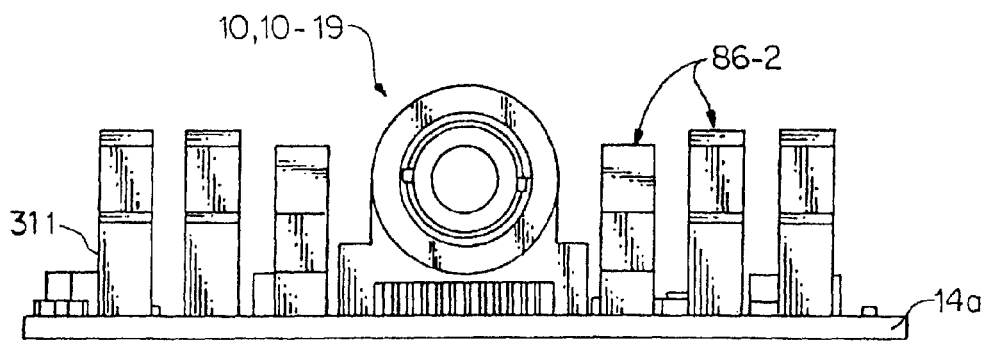
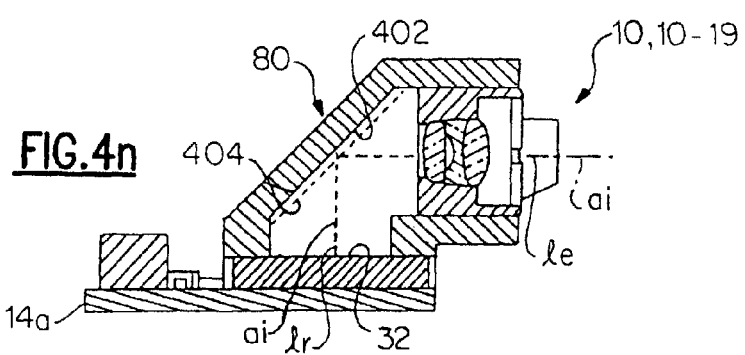

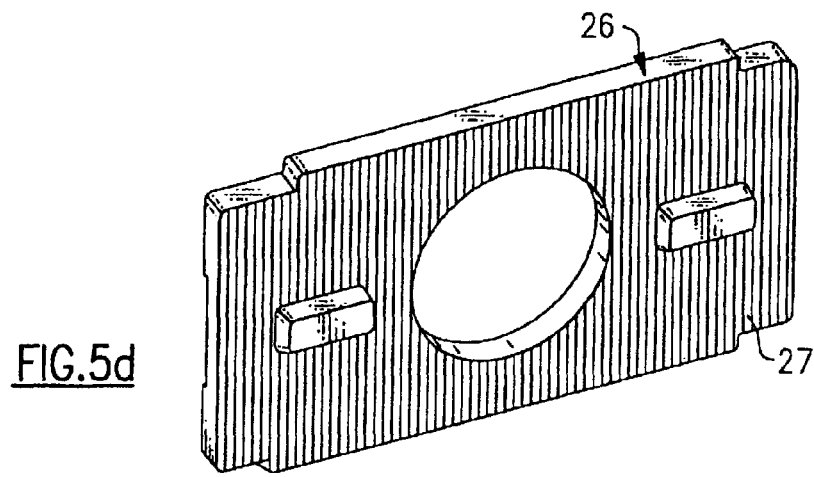
FIG.5d
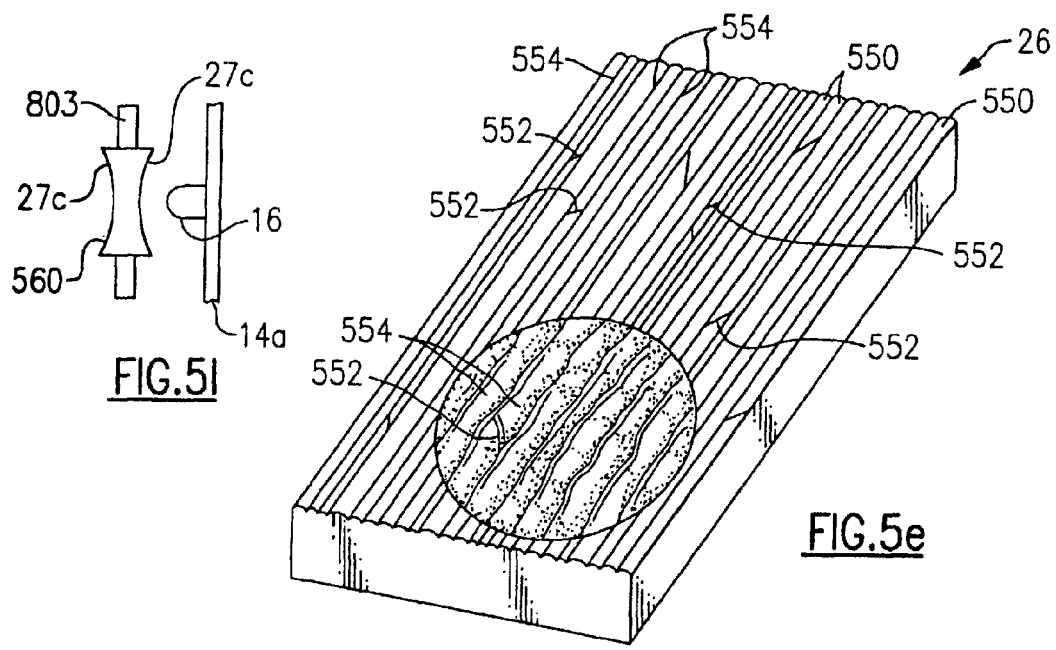
FIG.5I
FIG.5e
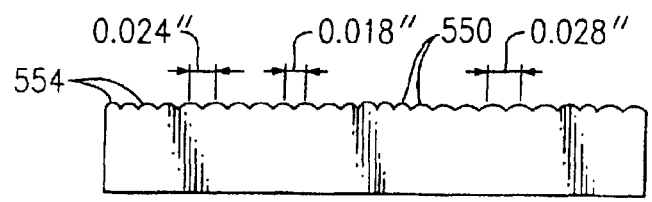
FIG.5f

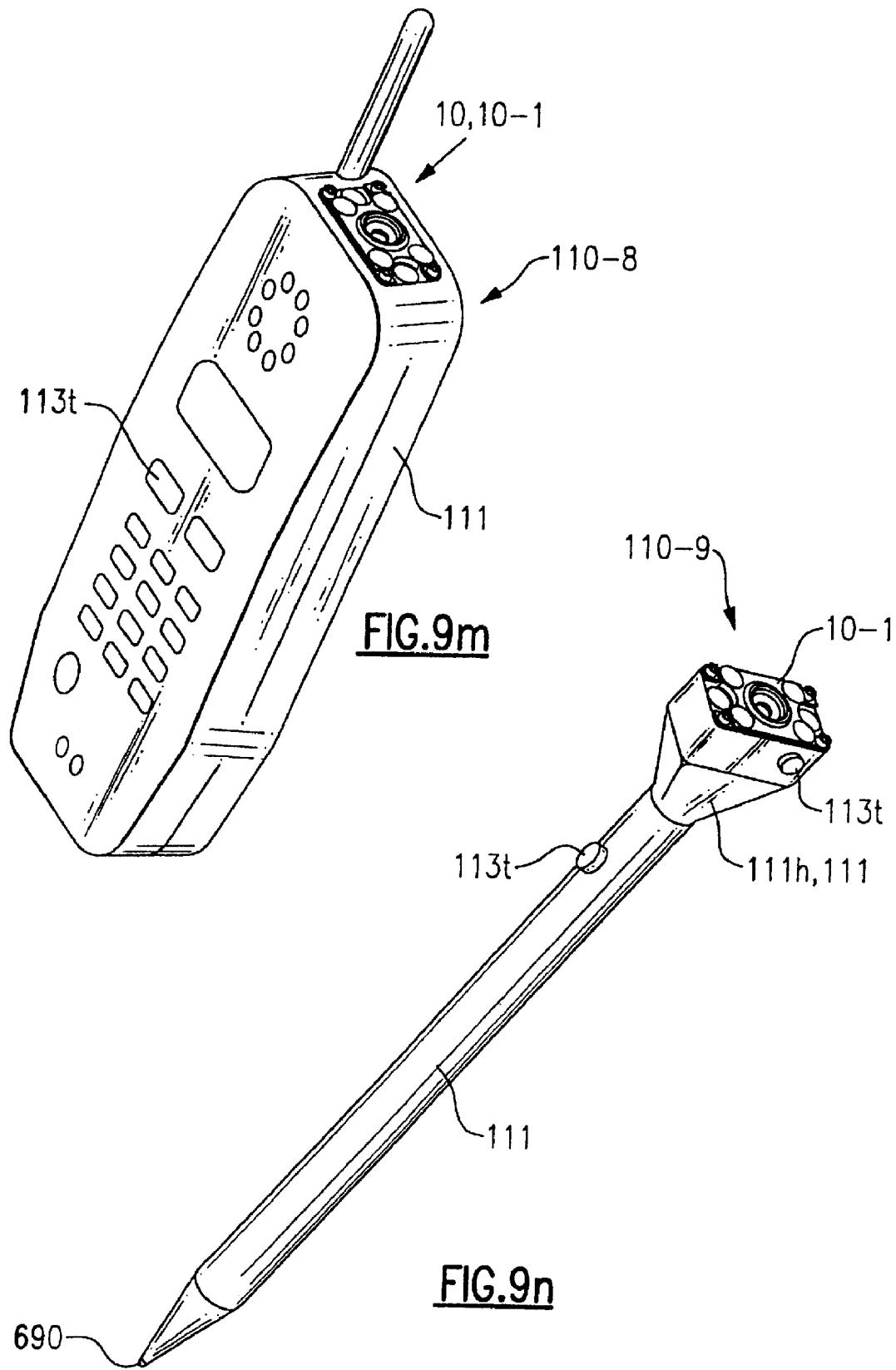

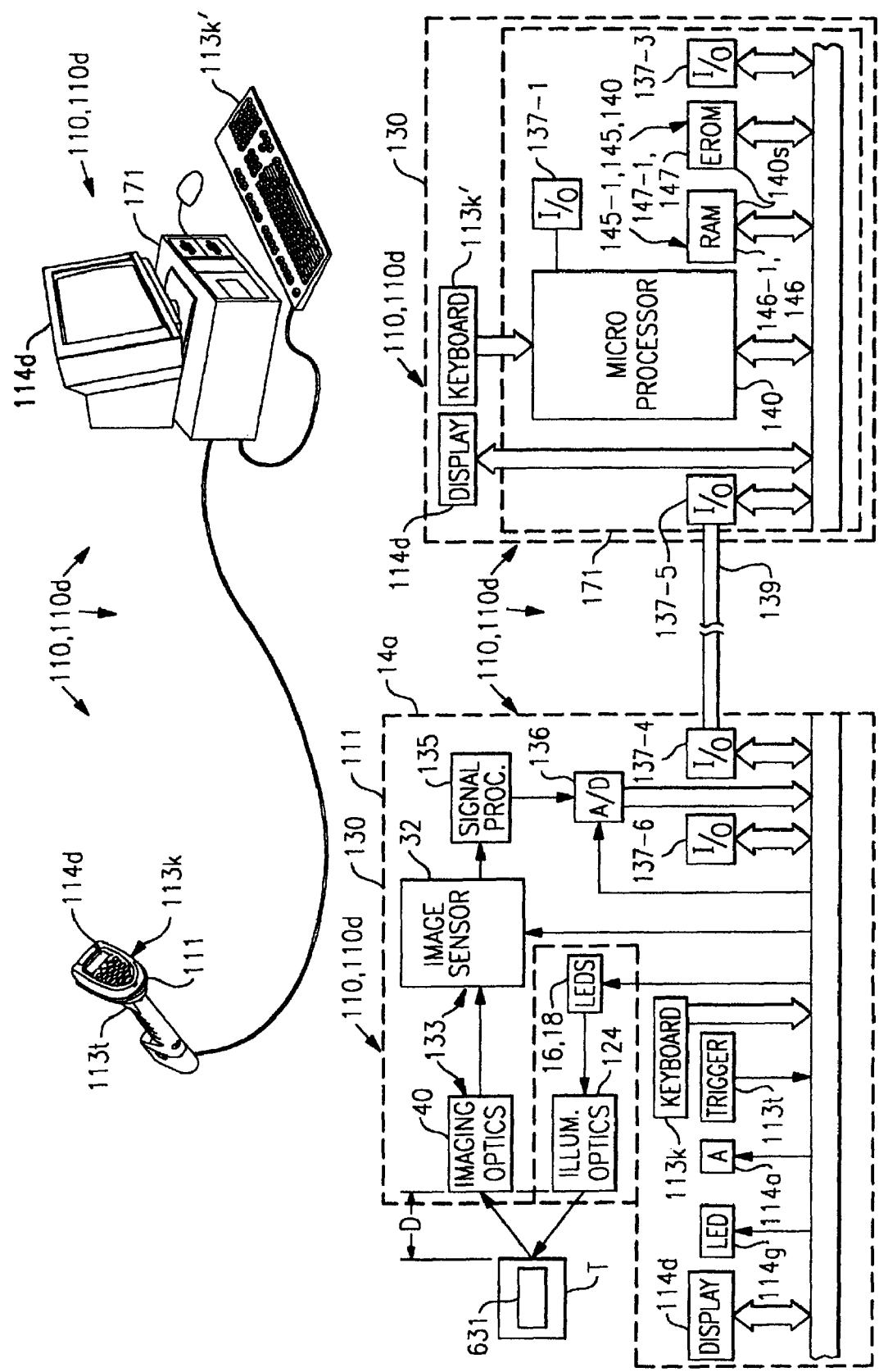

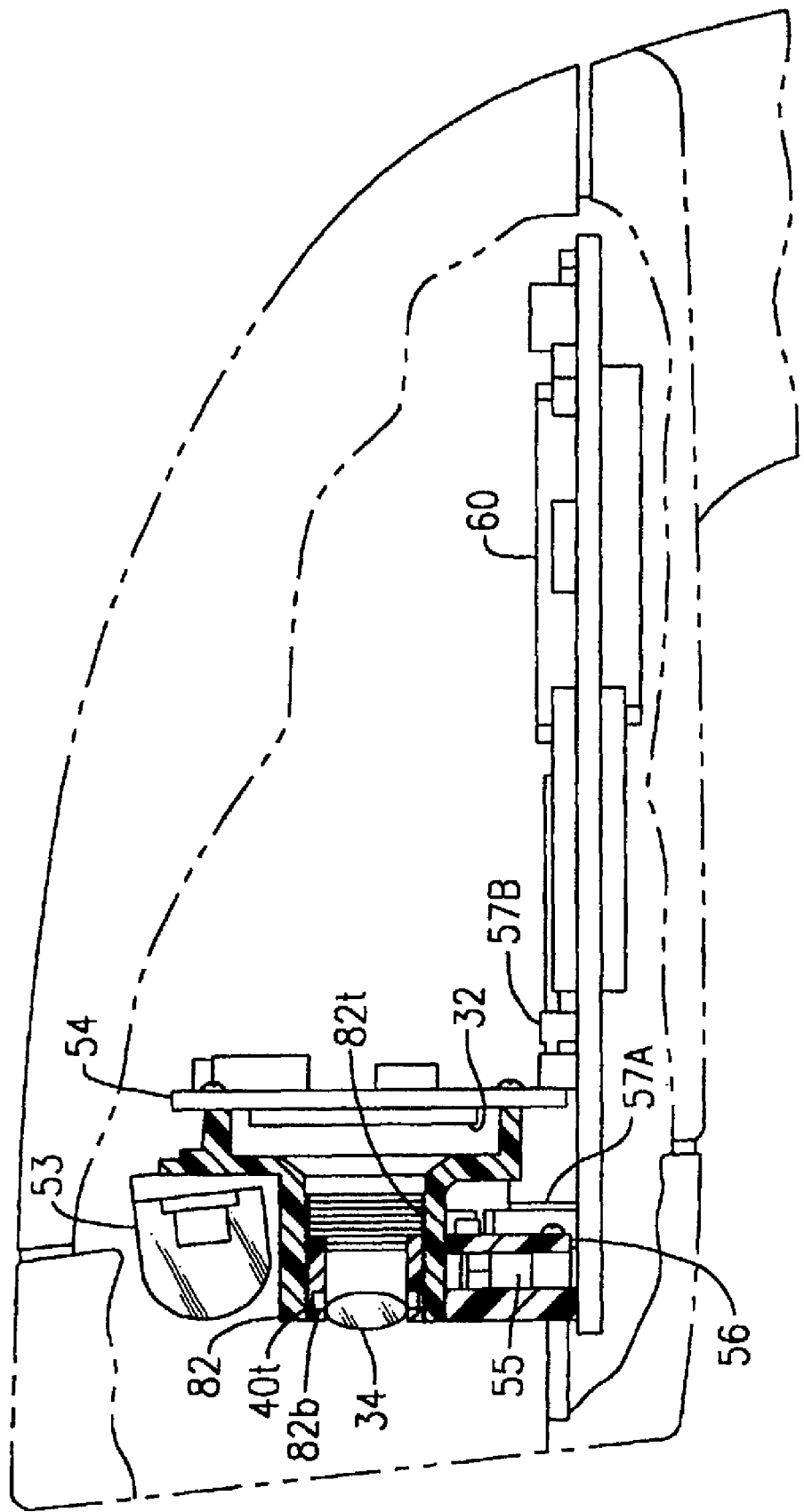

IMAGE SENSOR BASED OPTICAL READER

CROSS REFERENCE TO RELATED APPLICATIONS

This application is a divisional of U.S. patent application Ser. No. 11/517,013, filed Sep. 6, 2006, (now U.S. Patent Publication No. 2007/0040034) which is a divisional of U.S. patent application Ser. No. 10/093,135, filed Mar. 7, 2002, entitled "Imaging Module Comprising Support Post For Optical Reader" (now U.S. Patent Publication No. 2003/0089776) which is a continuation-in-part of U.S. patent application Ser. No. 09/802,579, filed Mar. 8, 2001, entitled "Imaging Module for Optical Reader Comprising Refractive Diffuser," (now U.S. Pat. No. 6,601,768) which is a continuation-in-part of U.S. patent application Ser. No. 09/411,936, filed Oct. 4, 1999, entitled "Imaging Module for Optical Reader" (now abandoned). The priorities of U.S. patent application Ser. Nos. 11,517,013, 10/093,135, 09/802,579 and 09/411,936 are claimed and each of the above applications are incorporated in their entireties herein by reference. The aforementioned U.S. patent application Ser. No. 10/093,135 filed Mar. 7, 2002 also claims priority of the following five provisional applications: U.S. Application No. 60/301,036, filed Jun. 26, 2001, entitled "Data Collection Miniature Imaging Module and Aimer Device," U.S. Application No. 60/327,249, filed Oct. 5, 2001, entitled "Multicolor Optical Reader Illumination," U.S. Application No. 60/322,776, filed Sep. 11, 2001, entitled "Data Collection Miniature Imaging Module and Aimer Device," U.S. Application No. 60/328,855 filed Oct. 12, 2001, entitled "Optical Reader Comprising Conductive Support Posts," and U.S. Application No. 60/345,523, filed Nov. 9, 2001, entitled "Optical Reader Module Comprising Alignment Elements." The contents of each of the above five provisional applications is relied upon and incorporated herein by reference. The benefit of each of the above five provisional application's respective priority is hereby expressly claimed in accordance with 35 U.S.C. §119(e).

FIELD OF THE INVENTION

The invention relates to optical reader devices in general and particularly to an image sensor based optical reader.

BACKGROUND OF THE PRIOR ART

Certain problems have been noted with laser based imaging modules such as bar code reading apparatuses for optical readers. A major problem noted with laser based bar code reading apparatuses is their lack of durability. Laser scan engine modules require a moving mirror which is delicately mounted. Mirror mount structure can easily be misaligned or broken by sudden impact of a housing incorporating the module on a rigid object.

The mechanical complexity of a laser scanner based imaging module increases significantly if the module must generate 2D image signals. There is a need for an improved image sensor based optical reader.

SUMMARY OF THE INVENTION

An optical reader can include an image sensor. In one embodiment an optical reader can be configured to have different operating modes, the different operating modes optimizing the reader for reading different indicia. In another embodiment an optical reader can comprise a multiple color emitting light source. In another embodiment an optical reader can be provided in a specialized form factor including an enlarged head portion and an elongated body portion extending from the head portion.

BRIEF DESCRIPTION OF THE DRAWINGS

FIG. 1h is a perspective assembly view of the imaging module shown in FIG. 1a;

FIGS. 1-1L are perspective views of various component parts of the imaging module shown in FIG. 1a; FIG. 1m is a front view of an optical plate of an imaging module as shown in FIG. 1a. FIG. 1m is a front view of an optical plate of the imaging module as shown in FIG. 1a;

FIG. 1n is a cross sectional view of the optical plate shown in FIG. 1m looking in the direction indicated by lines b of FIG. 1m;

FIG. 1o is a perspective assembly view of an alternatively designed imaging module of the invention;

FIGS. 1p and 1q are partial assembly views showing alternatively designed component parts of an imaging module of the invention;

FIG. 1r is an exploded view of a support post according to the invention;

FIG. 1s a perspective view of an embodiment of a support assembly of the invention;

FIG. 1t is a perspective view of an aperture plate in accordance with one embodiment of the invention;

FIG. 1u is a perspective view of an assembled imaging module as shown in the assembly state view of FIG. 1o;

FIGS. 2b-2d are top, front, and side views of the module shown in FIG. 2a;

FIGS. 2e, 2f, 2g, and 2h show perspective views of alternative imaging modules according to the invention;

FIGS. 2m and 2o are assembly state views of an imaging module of the invention including a support assembly having a frame;

FIGS. 2n and 2p are front and rear perspective views of the assembled module shown in FIGS. 2m and 2o;

FIG. 3b is a cutaway perspective view of the module shown in FIG. 3a;

FIG. 3c is a side view of the module of FIG. 3a;

FIG. 3d is a rear perspective view of the module of FIG. 3a;

FIGS. 3*i*, 3*j*, 3*k*, 3*l*, and 3*m* are perspective views of alternative imaging modules according to the invention;

FIGS. 4*k*, 4*l*, 4*m*, and 4*n* are front perspective, rear perspective, front, and cutaway side views of a module according to the invention including folded receive optics and light pipe target illumination;

FIG. 5*d* is an exploded perspective view of an optical plate of the invention including cylindrical microlenses;

FIG. 5*e* is an exploded partial view depicting a surface of the optical plate shown in FIG. 5*d*;

FIG. 5*f* is a cross sectional exploded top view of the optical plate of FIG. 5*d*;

FIG. 5L is a partial cutaway side view of an imaging module of the invention including a solitary horizontal row of light sources;

FIG. 8*a* is a side view of a circuit board according to the invention having surface integrated LEDs integrated therein;

FIG. 8*b* a top view of a circuit board according to the invention having surface integrated LEDs integrated therein;

FIG. 8*u* is a side view of a printed circuit board having an image sensor window in accordance with the invention whereas

FIG. 8*z* is a perspective view of a traditional prior art image sensor chip;

FIGS. 10*a*-10*e* are electrical circuit diagrams associated with the invention, depicting electrical circuitry which can at least partially be incorporated on a printed circuit board of an imaging module according to the invention, whereas

FIG. 11 is an internal side view of a prior art imaging module.

DETAILED DESCRIPTION OF THE INVENTION

Figure 1A:
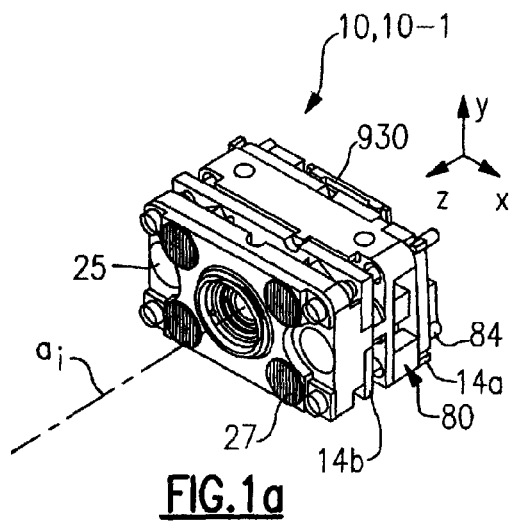
FIGS. 1a-1b show front and rear perspective views of an imaging module according to the invention.
Figure 1B:
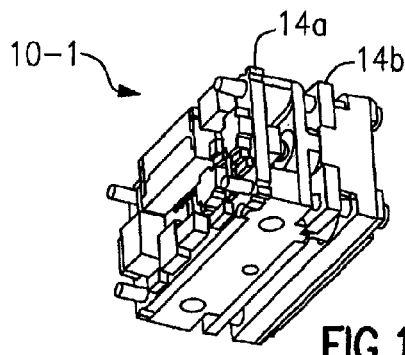
Figure 1C:
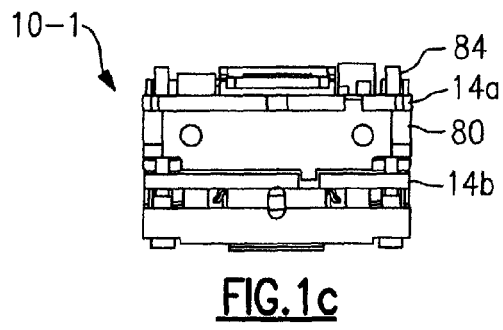
FIGS. 1c-1g are top, bottom, front, back, and side views of an imaging module according to the invention.
Figure 1D:
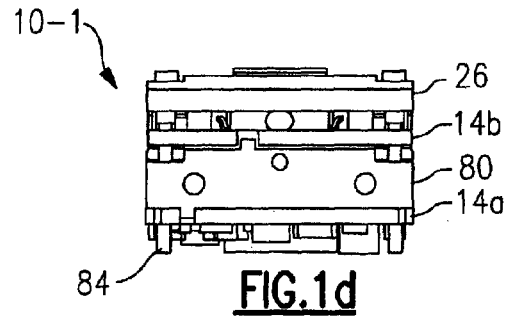
Figure 1E:
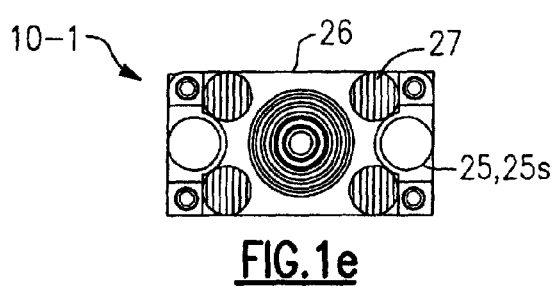

In accordance with its major aspects and broadly stated, the invention is an imaging module including a printed circuit board, an image sensor electrically connected to the printed circuit board, a support assembly for supporting at least one optical element, and an illumination system for generating an illumination pattern onto a target. The illumination system may include illumination light sources and diffusers for diffusing light from the illumination light sources. The module may further include an aiming system having an aiming light source, an aperture for stopping light from the aiming light source, and an optical element for projecting an aiming pattern into target area. For the reduction of the size of the module either or both of the illumination and aiming systems may include light redirecting elements such as mirrors or prisms.

In another aspect, the imaging module may include support posts for supporting various components of the imaging module. The module may include a first circuit board carrying an image sensor, a second circuit board carrying at least one light source, a support assembly interposed between the first and second circuit boards, and aligned post holes on each of the first circuit board, second circuit board, and support assembly for accommodating several support posts which, when accommodated in the post holes, support the structure including the support assembly interposed between two circuit boards. The support posts may be made electrically conductive so as to avoid a need to provide an additional electrical connector between the first and second circuit boards.

In another aspect, the imaging module may incorporate an aiming system including a light source, an aperture and an optical element positioned optically forward of the aperture wherein the aiming system projects a crisp and sharp aiming pattern onto a target over a wide range of distances. In one embodiment, an aiming system is configured so that a lens aperture effect results in a crisp sharp aiming pattern over a wide range of distances including distances at which the aiming pattern is less than optimally focused. In another embodiment an aiming system is configured so that light emanating from a thin aperture is imaged in such a manner that a crisp, sharp aiming pattern is defined over a wide range of distances. The aiming pattern in one embodiment includes sharply defined lateral edges which are useful in sighting target indicia.

In still another aspect, the module of the invention can include at least one multiple color emitting light source comprising a plurality of different colored LED dies each independently drivable so that the overall color emitted by the light source can be controlled and varied. The multiple color emitting light source can be controlled so that the color emitted by the light source is optimized for imaging or reading in a present application environment of the module. Further, the module can be configured so that control of the multiple color emitting light source automatically varies depending on a sensed condition, such a color present in a field of view of the module, the distance of the module to a target, and/or a predetermined criteria being met so that feedback is provided to a user. The module in a further aspect can include illumination light sources and aiming light sources which project light in different wavelength emission bands.

With the substantial size reductions made possible with architectures according to the invention, the positioning between a lens assembly and an image sensor can significantly affect the performance of the module. Accordingly, an imaging module in accordance with the invention may be adapted so that a position of a lens assembly can be finely adjusted relative to a position of an image sensor. A retainer and lens assembly according to the invention are complimentarily configured so that the lens assembly is slidably received in the retainer. The retainer includes two apertures defined in sidewalls thereof. The first aperture accommodates a fixture pin for use in finely adjusting the position of the lens assembly within the retainer. The second aperture accommodates an adhesive material for adhesively bonding the lens assembly to the retainer. Adhesive material may further be applied in the first aperture.

In a still further aspect of the invention, a module according to the invention can include aiming and illumination light sources having improved architectures. Light sources incorporated in the module can include surface integrated LEDs in which part of the light source is defined by a printed circuit board. Use of surface integrated LEDs in a module appropriately configures substantially reduces a dimension of the module in at least one plane. The module can also incorporate side leaded surface mount LEDs which can be firmly benched against a printed circuit board to achieve precision alignment of the LEDs without additional aligning members or alignment aiding assembly steps.

In yet another aspect of the invention, a module according to the invention can include one or more heat sink structures for reducing a temperature of the module. In another aspect, support posts of the module are utilized for purposes other than structurally supporting and electrically connecting members of the module. The support posts can be utilized to attach additional structural members (e.g. PCBs, optical plates, heat sink structures) which can be considered part of the module when they are attached. The support posts can also be utilized in mounting, supporting, or stabilizing the module in a housing interior member or on another member on which the module may be attached. The module may further include an "unpackaged" image sensor which is manufactured to be devoid of at least one of its traditional components so that a further size reduction of the module is realized. In a still further aspect of the module, the module may include a flexible circuit board so that the shape of the module can be varied, rendering the module fittable into a variety of cavity configurations. The module can also include light pipes for directing light from a light source into a target area.

With the significant miniaturization achievable with module architectures according to the invention, the module can readily be fittable into instrument or device housings of small size which become optical readers with the module installed therein. Modules according to the invention can be installed for example in gun style reader housings, personal data assistants (PDAs), portable data terminals (PDTs), mobile telephones, calculators, wrist watches, finger worn "ring scanners," writing implements such as pens, and numerous other devices.

Further description of the invention is broken down into the following eight subheadings: (A) General Imaging Module Architectures and Assembly, (B) Illumination Systems; (C) Aiming Systems, (D) Illumination Device Architectures; (E) Illumination/Aiming Color Emission Control and Coordination; (F) Receive Optics, (G) Packaging of Electronics; and (H) Applications, Operating Environment, and Control Circuit Functionality. It will be understood that the above subheadings are intended to provide a general separation the various topics discussed in the specification only, and that description of certain features of the invention is in several instances included under more than one subheading.

A. General Module Architectures and Assembly Method

A first embodiment of an imaging module according to the invention are shown in FIGS. 1a-1g. Imaging module 10, 10-1 includes a first circuit board 14a carrying an image sensor 32 typically provided by an image sensor chip and aiming light sources 18, and a second circuit board 14b carrying illumination light sources 16. The first and second circuit boards 14a and 14b are supported by a support assembly 80. Support assembly 80 in module 10-1 includes a containment section 81 for containing image sensor 32 and an integrated retainer section 82 for retaining a lens assembly 40. Support assembly 80 of module 10-1 along with first circuit board 14a and second circuit board 14b further include post holes 83 for receiving support posts 84. Module 10-1 includes four support posts 84, each of which extends through first circuit board 14a, support assembly 80, and second circuit board 14b, and thereby aids in holding of the various components of module together. Imaging module 10-1 further includes optical plate 26 which carries various emit optical elements. Optical plate 26 of module 10-1 includes illumination optics 27, 28 (see FIG. 1n) for aiding in the development of a substantially uniform illumination pattern over a target area corresponding to a field of view of image sensor 32, and aiming optics 25 for aiding in the projection of an aiming pattern in a target area. Both second circuit board 14b and optical plate include central apertures 836, 837 for accommodating retainer section 82 when they are moved toward support assembly 80. With the architectures described, substantial miniaturization of the imaging module achieved. Module 10-1 may have a width dimension of about 0.810 in., a height dimension of about 0.450 in., and a depth dimension of about 0.560 in. Aiming and illumination light sources 16, 18 of module 10-1 are provided by surface mounted and back benched LEDs having side-extending leads or "gull wings."

Further aspects of imaging module 10-1 are described with reference to FIGS. 1h through 1n. In FIG. 1h an assembly diagram illustrating components of module 10-1 in an unassembled state are described. In FIG. 1h it is seen that first circuit board 14a carries image sensor 32 provided by a image sensor chip, and a pair of aiming light sources 18 provided by LEDs. Support assembly 80 of module 10-1 includes containment section 81, which as best seen by the internal view of FIG. 1k, provides containment for image sensor 32, preventing damage thereto, and preventing stray light rays from reaching image sensor 32. Support assembly 80 further includes an integrated retainer section 82 for retaining a lens assembly 40 as will be described in further detail herein. Referring to further aspects of support assembly 80, support assembly 80 of module 10-1 includes integrated struts 80st, having formed therein post holes 83 as have been discussed herein, and apertures 43, for aiding in the formation of an aiming pattern as will be described in further detail herein.

Still further, shown by FIG. 1i, support assembly 80 can include integrated mounting wings 80w, for aiding in the mounting of imaging module 10-1 on a member external to module 10-1, such as a member located on an interior of a portable optical reader housing, a PDA, a PDT, or a cellular phone, etc. Second circuit board 14b and optical plate 26 each includes a central aperture 836 and 837 for accommodating retainer 82. Mounting wings 80w include screw holes 810 for receiving mounting screws. Screw holes 810 may also be included in support assembly main body as are labeled in FIG. 1h. Support assembly 80 in the embodiment of FIG. 1i is a one piece unit comprising a containment section 81 a retainer section 82, struts 80st, aiming apertures 43, and mounting wings 80w.

Referring to FIGS. 1h, 1j, 1k, and 1L together it is seen that each of printed circuit board 14a, support assembly 80, printed circuit board 14b, and optical plate 26 includes a plurality of key structures which interlock a complementary key structure of its neighboring component part or parts. In particular, first circuit board 14a includes a pair of key apertures 812 which receive key pins 81h of support assembly 80. Forward end 816 of support assembly 80 also includes key pins 820 which are matingly received by key apertures 822 of second circuit board 14b. Second circuit board 14b further includes lateral key apertures 826 for receiving key side pins 830 of optical plate 26, and center key holes 834 for receiving key center pins 840 of optical plate 26. Key center pins 840 as best seen in FIGS. 1j and 1i penetrate straight though key holes 834 of printed circuit board 146 and are received by key holes 842 of support assembly 80. The various key structures described herein above aid in properly aligning the various component parts of module 10-1 and greatly reduce the amount of shifting between component parts of module 10-1 in the XY plane after the component parts are assembled. Module 10-1 further includes elements which aid achieving proper Z-direction spacing between component parts of module 10-1. As seen in FIG. 1h support assembly 80 includes a pair of top and bottom integrated spacer ridges 846 for aiding in properly spacing support assembly 80 with second printed circuit board 14b. Aperture defining member 848 of support 80 is also raised and flattened to aid achieving proper spacing between assembly 80 and board 14b. Optical plate 26 also includes various spacing aiding members. Specifically, optical plate 26 includes a spacer ring 852 and a spacer ridge 854. Spacer ring 852 and spacer ridge 854 are sized and configured so that when optical plate 26 is pushed toward printed circuit board 14b, proper spacing between plate 26 and board 14b is achieved. Proper Z direction spacing between components of module can also be aided with use of support post ring spacers and or steps to be described herein. Referring to further aspects of module 10-1, plate 28 includes cavities 857 which receive LEDs 16. By receiving LEDs 16, cavities 857 provide a further reduction in the depth dimension of module 10-1. While imaging module described herein are in most cases shown as supporting a 2D image sensor, it will be appreciated that the architectures of the imaging modules herein described are also useful for supporting 1D image sensors.

Figure 2G:
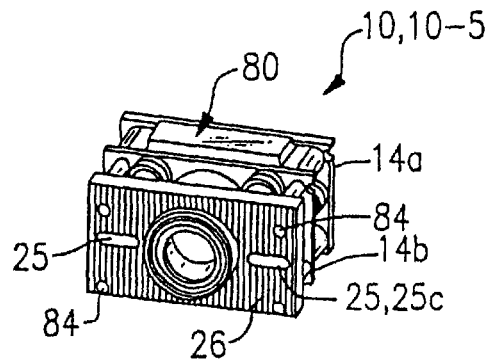
Figure 2A:
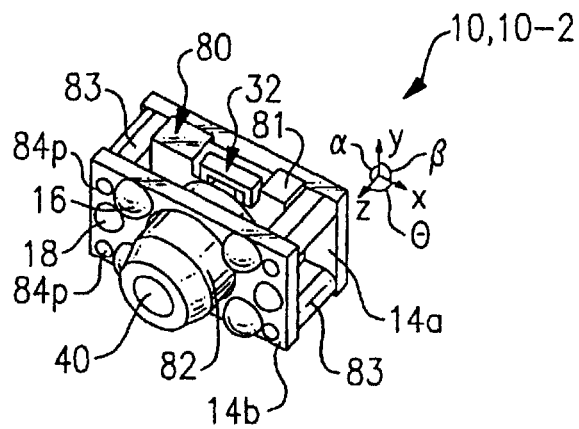
FIG. 2a is a perspective view of an imaging module according to the invention including surface integrated LEDs.

One variation of imaging module 10-1 according to the invention is shown in FIG. 2a. Like module 10-1, module 10-2 in the embodiment of FIGS. 2a-2c includes a support assembly 80, a first circuit board 14a, a second circuit board 14b, and support posts 84 for structurally supporting the above components. However, module 10-2 does not include a lens plate 26 as in module 10-1. Further, unlike module 10-1, module 10-2 includes surface integrated LEDs wherein dies of LEDs are deposited directly onto a printed circuit board. Aiming LEDs 18 and illumination LEDs 16 of module 10-2 shown in FIGS. 2a-2d are provided by surface integrated LEDs. Support assembly 80 in the embodiment of FIG. 2a includes a barrel shaped retainer section 82 and a containment section 81. Retainer section 82 retains a lens assembly 40 which may include a single element or a multiple element imaging lens incorporated in a lens barrel. Containment section 81 contains an image sensor 32 as will be described in further detail herein. Support assembly 80 further includes struts 80st on which printed circuit board 14a and circuit board 14b may be benched. Struts 80st of assembly 80 as in module 10-1 may be formed integral with remaining components of assembly 80 or else struts 80st as shown my module 10-2 may be formed separate from assembly components e.g. 81 and 82. Module 10-2 is shown as being devoid of optical plate 26 as is described herein. The functions provided by plate 26 could be wholly or partially be provided by a member not incorporated into module 10-2 (such as a member of a reader housing 111), or else the functionality of optical plate 26 could wholly or partially be incorporated directly into light sources 16, 18 of module as will be described herein.

Further variations of module 10 are shown in FIGS. 2e and 2f. In the embodiment of FIG. 2e, imaging module 10-3 includes a single PCB 14a instead of first and second PCBs as shown in FIG. 1a (module 10-1) and FIG. 2a (module 10-2). Surface integrated aiming LEDs 18 and illumination LEDs 16 are mounted on the front side 14f of PCB 14 while processing circuitry, e.g. control circuit 140, or a part of thereof is mounted on a rear side 14a-r of PCB 14a. A support assembly 80 including a containment section 81 and retainer section 82 for holding lens barrel 40 in the embodiment of FIG. 2e can have the same general configuration assembly 80 shown in FIG. 2f.

Another variation of an imaging module according to the invention is shown in FIG. 2f. In the embodiment of module 10-4, 10 shown in FIG. 2f, support posts 84 are replaced by threaded screws 84t which are threaded into screw holes 83t of PCB and support assembly 80 for securing of the component part of module 10. It is seen further that PCB 14b having surface integrated illumination and aiming LEDs 16, 18 can be replaced by the combination shown of a planar member 14p which may be a PCB having a pair of PCBs 14b1 and 14b2 back mounted thereon, wherein each of the PCBs 14b1 and 14b2 comprise surface integrated illumination LEDs 16 and surface integrated aiming LEDs 18 as are described herein. Of course, any one of the surface integrated LEDs shown and described herein can be replaced by e.g. a traditional leaded LED, a surface mount LED, a side leaded, surface mount LED, as are described herein.

In the embodiment of FIG. 2g, module, 10-5 like module 10-1 includes an optical plate 26 mounted forward of circuit board 14b and supported on support posts 84. Optical plate 26 of the type included in module 10-5 of FIG. 2g is described in more detail herein with reference to FIGS. 5d, 5e, and 5f. Optical plate 26 as shown in FIG. 2g may include a plurality of substantially cylindrical microlenses and cross-connections as will be described in greater detail with reference to FIGS. 5d-5f. Optical plate 26 as shown in FIG. 2g can also incorporate therein aiming optics 25 provided by cylindrical lenses 25c. As will be described in greater detail, apertures 43 as shown for example in FIGS. 1h, 1q, 1m, 6m and 6q may be disposed forward of aiming LEDs 18 and lenses e.g. 25 may be configured to image light passing through an aperture onto a target area T so that an aiming line, or other aiming pattern is projected onto a target area, T. Optical plate 26 in the embodiment of FIG. 2g can be replaced with an optical plate having a separate diffuser 27 for each illumination LED as shown in module 10-1 FIG. 1a. As explained elsewhere herein (e.g. FIG. 1n, FIG. 2o, and FIGS. 5g-5k) optical plate 26 can have wedges 28 formed on a light entry surface or exit surface thereof for directing light to a corner of a target area, T.

Another variation of an imaging module is shown in FIG. 2h by extending posts 84 further, as shown by module 10-6, 10 of FIG. 2h additional members having incorporated post holes 83 can be incorporated into imaging module 10. For example, the optics incorporated in optical plate 26 of e.g. module 10-1 or module 10-6 can be spread out over more than one member. As shown by module 10-6 a first optical plate 26, 860, can carry illumination optics such as diffusers 27 and a second optical plate 26, 862 can carry aiming optics such as cylindrical lenses 25. As will be explained further herein, diffusers 27 can be of any suitable type e.g. refractive optic microlens, diffractive, or negative lens. Module 10-6, in addition to including an additional front member 862 stacked on module 10, includes an additional rear member 14p. Additional rear member 14p may be e.g. a thermally conductive electrically insulating member which is employed as a heat sink for use in reducing a temperature of module 10-6, or else member 14p may be e.g. a printed circuit board for carrying additional circuit components.

Figure 1F:
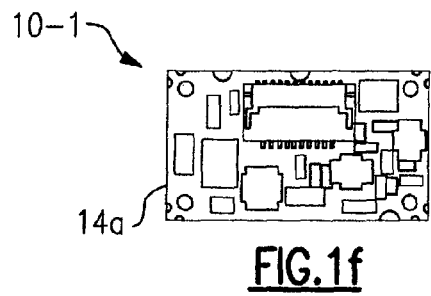
Figure 1G:
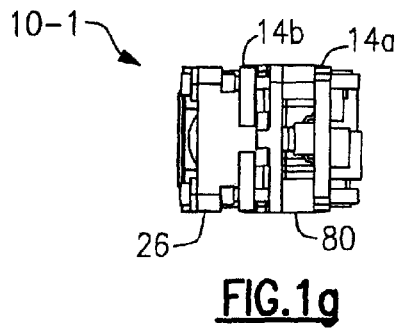
Figure 1V:
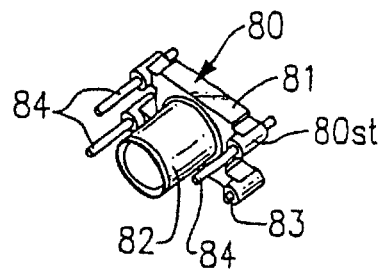
FIG. 1v is a perspective view of a support assembly according to the invention including elongated struts.

Referring to further aspects of module 10-6, posts 84 of module 10-6 include ring spacers 84r. Ring spacers 84r may be incorporated into posts 84, or ring spacers 84r may comprise a plastic sleeve fittable over posts 84 or else ring spacers 84r may comprise a member that is snap-fit into a slot machined in posts 84p. Ring spacers 84r aid in properly spacing stacked members of module 10. Features of the invention relating primarily to support posts 84 of modules e.g. 10-1, 10-2, 10-5, and 10-6 are now described in greater detail. Formed in each strut 80st as explained with reference to module 10-1 is a support post hole 83 for accommodating a support post 84. In any of the post-containing modules described each support post 84 may be friction fit yet substantially slidable in its associated post hole 83. In the alternative, each support post 84 may be rigidly mounted within associated hole 83. Support assembly 80 may be over-molded on posts 84p to rigidly secure posts 84p to assembly 80. Circuit boards 14a and 14b also have post holes 83 for accommodating support posts 84p. Holes 14h of circuit boards 14a and 14b are formed in such a manner relative to posts 84h so that holes 14h aid in properly aligning the various components of module 10a-1 as will be described in further detail herein. While it is seen that struts 80st are highly useful, it is also seen that struts 80st could be eliminated in the interest of reducing the size of module 10. In the embodiment of FIG. 1v an embodiment of support 80 having integrated elongated struts 80st is shown. Elongated struts 80st may be advantageous e.g. where struts 80st are over molded onto posts 84 and where it is desired to firmly secure posts 84 in fixed positions within struts 80st.

In one method for assembling module 10 support posts 84 are inserted in the various holes of support assembly 80 such that posts 84 extend outwardly from assembly 80. Printed circuit boards 14a and 14b are then placed over the exposed portions of post 84p so that post holes 83 of circuit boards 14a and 14b accommodate support posts 84. In one embodiment of the invention post hole 83 of image sensor-carrying circuit board 14a can be made substantially larger than the diameter of post 84. Making holes 83 of circuit board 14b substantially larger than post 84 allows the position of circuit board 14a to be finely adjusted relative to that of support assembly 80 in the X, Y, and Z directions prior to the securing of circuit board 14a in a certain position relative to assembly 80. When holes 83 are made substantially larger than posts 84, circuit board 14a may be tilted or moved rotationally as it is moved in a certain position relative to assembly 80 prior to the securing of circuit board 14b to assembly 80. A person assembling module e.g. 10-1, 10-2, 10-5, and 10-6 may utilize a video monitor to aid in the alignment process. Module 10 can be actuated to capture an image which can be displayed on a video monitor, e.g. a host computer system (e.g. PC) video monitor as is explained more fully in U.S. patent application Ser. No. 09/954,081, (now U.S. Pat. No. 6,561,428) entitled "Imaging Device Having Indicia-Controlled Image Parsing Mode," filed. Sep. 17, 2001 incorporated by reference herein. The module 10 may be made to capture an image of a target comprising fine print indicia (e.g. a dollar bill) and a user may adjust the components of the module that are being assembled until the displayed image displayed on the monitor is satisfactory. The securing of circuit board 14a relative to assembly 80 can be accomplished with use of solder. A further explanation of the embodiment wherein post holes 83 of circuit board 14a are made substantially larger than support structures which in some limited aspects operate similarly to posts 84 is described in copending U.S. patent application Ser. No. 09/312,479 filed May 17, 1999 entitled "Optical and Image Sensor Subassembly Alignment and Mounting Method" (now U.S. Patent Publication No. 2002/0066851) incorporated herein by reference. Where the position of image sensor 32 does not have to be finely adjusted relative to lens assembly 40, post holes 83 of circuit board 14a are conveniently sized to be friction-fit over posts 84.

Referring to further aspects of modules described herein including posts 84, support posts 84 are preferably made electrically conductive and are disposed in module 10 so that posts 84 provide electrical communication between electrical circuit components of first circuit board 14a and second circuit board 14b. Circuit board 14b comprises illumination LEDs 16 and in some cases aiming LEDs 18, both requiring electrical power for operation. Circuit board 14a carries image sensor 32, in some cases aiming LEDs 18 and certain electrical circuitry associated with image sensor 32 as will be described later herein. Processing circuitry associated with image sensor 32 may be mounted on face 14a-f and/or rear 14a-r of circuit board 14a. Configuring module 10 so that support posts 84 both provide structural support and electrical communication between circuit components of first and second circuit boards 14a and 14b provide an important space conservation advantage and allows module 10 to be made smaller than would be possible if separate structural members (e.g. including flex connectors for connection between boards 14a and 14b) were disposed in module 10 to provide the functions of structural support and electrical communication.

Further aspects of one type of support post which may be utilized with post contacting modules e.g. 10-1, 10-7 are described with reference to the exploded view of post 84 shown in FIG. 11r. Support post 84 in the embodiment of FIG. 1r comprises barb 890, a step pattern defined by steps s1, s2, and s3 and head 892 having an open end 894 sized so that step s3 of another one of posts 84 can be friction-fitted or slip-fitted into open end 894.

Barb 890 of post 84 allow post 84 to be friction-held in a certain position in plate 26 during assembly of module e.g. 0-1 without any outside securing agents such as adhesive material or solder.

Figure 2B:
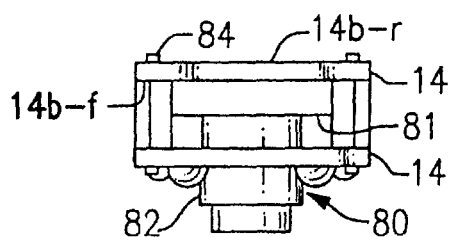
Figure 2C:
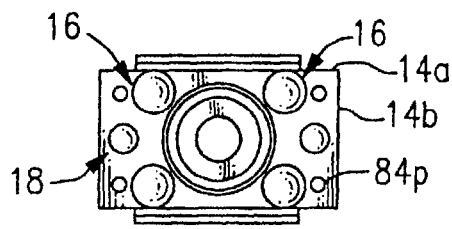
Figure 2D:
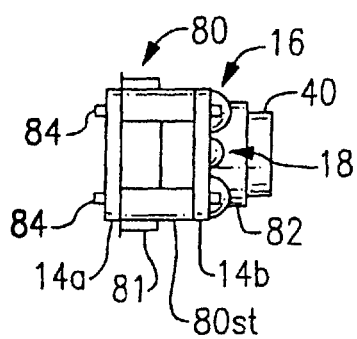

The step pattern of post 84 defined by steps s1, s2, and s3 eliminates the need to provide spacer elements on certain of the component of module e.g. 10-1. Of course, steps e.g. s.sub.1, s.sub.2, and s.sub.3 can be utilized in combination with spacers e.g. 878 Referring to FIG. 1o, it is seen that aperture plate 610 can be benched against ridges r12 between first and second step s1 and s2. Further, it is seen with reference to FIGS. 2i-2k, that an additional PCB 14C or other structure can be benched against the ridges r23 of posts 84 defined between the second and third steps s2 and s3 posts 84p.

It will be described later therein that PCB 14b preferably comprises highly integrated circuit components so that all, essentially all, or substantially all circuit components required in reader 110 are carried by a single PCB, e.g. PCB 14b. Nevertheless, in certain applications wherein additional space is available, it may be desirable, for reducing the overall cost of the circuit components, to incorporate in reader 110 larger circuit components with a lesser degree of integration and to spread the circuit components over more than one major circuit component carrying circuit board. It will be seen that posts 84, especially when configured as shown in FIG. 1r readily facilitates module configurations wherein circuit components are spread out over several boards and wherein the module may nevertheless retain a compact generally cubical configuration. As indicated previously, an additional circuit board 14c may be benched against ridges r23. Furthermore the open ends 894 of additional posts 84a may be fitted onto posts 84 and another additional circuit board e.g. PCB 14d or boards may be fitted onto the additional posts. Because posts 84 can be made electrically conductive the electrical communication between multiple circuit boards of module 10a can be provided by posts 84. Posts 84 therefore eliminate the need to install space consuming electrical connectors, e.g. flex strip receptacles, on one or more of the circuit boards e.g. 14a, 14b, and 14c of module 10, when the number of conductive paths required between the boards is equal to or less than the number of the posts 84.

Further aspects of the invention relating primarily to the assembly of module 10a are described with reference to FIGS. 1o to 1u. FIG. 1o shows an assembly diagram corresponding to module 10-7 which is similar to module 10-1 discussed in connection with FIGS. 1a-1g. In module 10-7 apertures 43 are defined in nonintegrated aperture plate 610 rather than in support assembly 80. In one method for assembling module 10-7 conductive support posts 84 are first installed in plate 26 and then assembly 870 comprising the combination PCB 14b having attached thereto plate 610 is applied over posts 84. Next, assembly 872 comprising support assembly 80, and PCB 14a having attached thereto LEDs 18 (shown as traditional leaded LEDs) is applied over posts 84 and posts 84 are soldered to PCB 14a. At interfaces 885, as best seen in FIG. 1u, to secure the components of module together as a packaged unit, as will be explained in greater detail herein, solder can also be applied at interfaces 884 between posts 84 and board 14b to further secure component of module 10-7, and to provide electrical connection between post 84 and board 14b if such connection is necessary. Finally, lens assembly 40 provided by a lens barrel is inserted into retainer section 82 of assembly 80, precision adjusted, and secured to retainer section 82 in a manner that will be described more fully herein below. It will be seen that the assembly process for assembling module 10-1 can be substantially the same except that the combination of plate 26 and posts 84 can be fitted onto PCB 14b rather than the assembly comprising PCB 14b and aperture plate 610.

Referring to further aspects of module 10-7, module 10-7 like module 10-1 includes a plurality of discreet diffuser patterns 27 on optical plate 26 rather than a single diffuser pattern as is shown by module 10-5 in the embodiment of FIG. 2g. Further, it is seen that in module 10-7 as in module 10-5 and module 10-1 the plane of the most forward surface of plate 26 is positioned forwardly of the plane defined by the exit surfaces of aimer optics 25. The positioning of optics 25 on plate 26 so that the plane defined by diffusers 27 is forward of the plane defined by optics 25, protects optics 25 from damage which may be caused by incidental or accidental contact of module 10-1, 10a-7 with various objects during use or installation of module 10 into a reader housing. It is useful to design plate 26-1 so that it is more likely that optics 27 come in contact than optics 25 since the illumination system of module 10 is less sensitive to imperfections in optics 27 than is the aiming system of module 10 to imperfections in optics 25.

Alternative module components which may be incorporated in any of modules e.g. modules 10-1, 10-2, 10-3, 10-4, 10-5, 10-6, and 10-7 are described with reference to FIGS. 1p and 1q. In the partially assembled module of FIG. 1p support assembly 80 comprises LED holders 876. LED holders 876 hold LEDs 18 in position during the assembly process so that LEDS 18 do not have to be soldered to PCB 14a prior to PCB 14a being attached to posts 84. That is, without LEDs 18 being soldered to PCB 14a, an assembler may hold the combination of support assembly 80, LEDs 18, and PCB 14a together with his hand during the assembly process, place the combination of these parts over posts 84, and in one soldering step solder both of LEDs 18 to posts 84 to PCB 14a to secure the module's component together. In a further aspect of support assembly 80 shown in FIGS. 1p and 1s, retainer assembly 80 includes spacers 878 and 880. Spacers 878 of assembly 80 provide spacing between support 80 and PCB 14b. Spacers 880 (only one seen) includes an integrated key pin for matingly engaging key hole 882 of PCB 14b. Use of spacers 878, 880, and 846, 848 (module 10-1) to provide spacing between support assembly 80 and PCB 14b rather than post hole containing struts 80st results in an exposed interface 884 between posts 84 and the rear surface 14b-r of PCB 14b being defined as best seen in FIG. 1u. Solder can be applied at these interfaces 884 during the assembly of module e.g. 10-1, 10-7 to reinforce the mechanical holding forces holding together the components of module e.g. 10-1, 10-7 and to reinforce the electrical contact between PCB 14b and posts 84. In the embodiment of FIG. 1o, aiming LEDs 18 are provided by traditional leaded LEDs while illumination LEDs 16 are provided by side-leaded surface mounted and back benched LEDs as will be explained more fully hereinbelow.

FIG. 1q shows an alternative embodiment of aperture plate 610. Aperture plate 610 shown in FIG. 1q is a two-piece assembly comprising plate section 612 and aperture insert section 614. Plate section 612 includes a form recess 616 of a form adapted to align and receive aperture section 614 in a desired position within module 10 so that a desired aiming pattern is projected by module 10. Aperture section 614 is received in recess 616 and secured in a position therein via an adhesive and/or friction forces. Aperture insert section 614 preferably comprises metal. The selection of metal as the material for use in forming section 614 enables apertures 43a, 43b, and 43c to be made in substantially small sizes and in sizes and shapes that can be tightly controlled. Aperture plate 610 in both FIGS. 1 and 1q includes key structures 886 for engaging key structures 882 of PCB 14b.

Figure 2L:
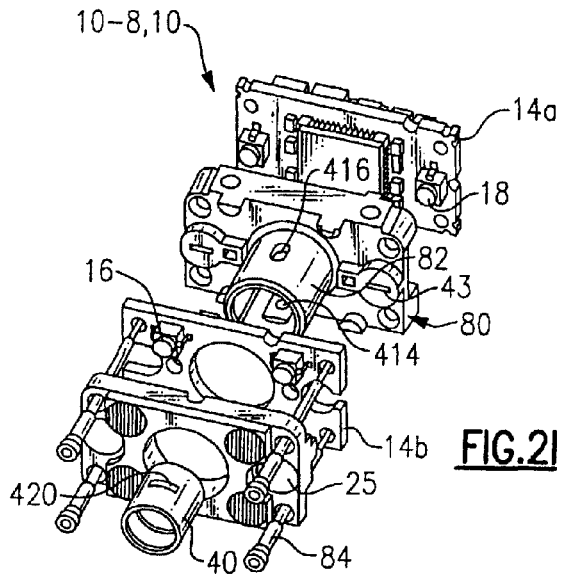
FIG. 2L is an assembly perspective view of another imaging module according to the invention.
Figure 2I:
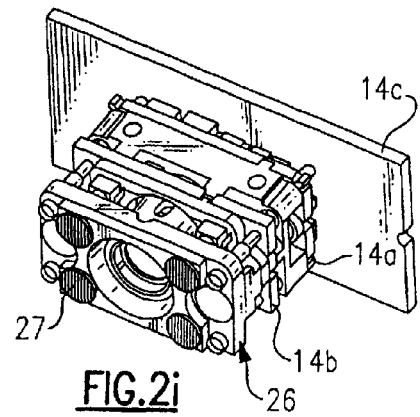
FIGS. 2i, 2j, and 2k show perspective views of imaging modules illustrating functionality of support posts of the imaging module.

Reference is now made to module 10-8, shown in FIG. 2L. Aiming LEDs 18 of module 10-8 have a substantially smaller height dimension than LEDs 18 of module 10-9 (which are leaded LEDs). Accordingly, because it is normally preferred to position aperture 43 as close as is physically possibly to aiming light source 18, aperture 43 in the embodiment of FIG. 2L should be positioned closer to PCB 14a than aperture 43 of module 10-7. For positioning of an aiming aperture closer to the surface of PCB 14a apertures 43 may be provided on support assembly 80 as is indicated in the embodiment of retainer assembly 80 shown by module 10-8 in FIG. 2L and module 10-1 (FIG. 1h). In the embodiment of FIG. 2L, shrouds 80sh extend forwardly from apertures 43. Shrouds 80sh may be sized to the height of spacers 80sp to reinforce the spacing function provided by spacers 80sp.

Another embodiment of an imaging module according to the invention is shown in FIGS. 2m-2p. Like module 10-1, imaging module 10-9 is specifically designed for use in an imaging device such as a bar code reader, an optical character recognition (OCR) reader, a reader having both bar code and OCR reading capabilities, personal data assistant, a video camera, a digital camera, a cellular phone, or a medical viewing instrument.

Unlike e.g. module 10-1 which includes support posts 84 for supporting components of module 10 module 10-9 includes a mounting frame 12 which is adapted to receive both electrical components and optical components of an imaging system. Mounting frame 12 is part of one piece integrated support assembly 80 of module 10-9 which further includes containment section 81 and retainer section 82. Mounting frame 12 receives a circuit board, such as a printed circuit board (PCB) 14a, illumination LEDs 16, aiming LEDs 18, aperture plate 610, and optical plate 26.

More specifically, frame 12 of support assembly includes a back plate 30 and sidewalls including top sidewalls 31 and side sidewalls 31'. Back plate 30 includes a recessed containment section 81 for receiving a solid state image sensor chip 32 and a plurality of pin holes 36 for receiving leads 38 of illumination and/or aiming light sources, provided by leaded LEDs 16 and 18. Support assembly 80 further includes a retainer section 82 formed integral with back plate 30 for receiving a receive optics lens assembly 40, e.g. a lens barrel, which may be installed in retainer section 82 prior to or after any step in the assembly process as described in greater detail below.

In assembling the module 10-9, PCB 14a is first mounted to back plate 30 using screws 56 and frame 12 is oriented so that an opening 13 is exposed. When PCB 14a is mounted to back plate 30 the image sensor 32 carried by PCB 14a is received by center recess containment section 81 which is shaped complimentary with the shape of image sensor 32 as shown. After mounting PCB 14a to frame 12, an assembler mounts illumination LEDs 16 and aiming LEDs 18 to PCB 14a.

To mount LEDs 16 and 18 to PCB 14a, the leads 38 of LEDs 16 and 18 are pushed through aligned pin holes 36 and 54 of back plate 30 and PCB 14a, then the LEDs 16 and 18 are soldered to PCB 14a. Preferably, all of the LEDs 16 and 18 are positioned in their respective pin holes before soldering. In soldering LEDs 16 and 18, the rear surface 14a-r of PCB 14a should be oriented for easy access by an assembler. To the end that LEDs 16 and 18 remain in a desired orientation which is substantially normal to PCB 14a during soldering, a standardly known fixture (not shown) shaped to receive LEDs 16 and 18 can be temporarily applied over LEDs 16 and 18 through the soldering process.

An important feature of imaging module 10-9 is that leads 38 of the illumination LEDs 16 are installed in a nearly abutting relation to sides 32s of image sensor 32 such that a portion of rear surfaces 19 of LEDs 16 oppose a portion of a front surface 32f of image sensor 32 when the LEDs 16 are completely installed. This arrangement reduces the size of the imaging module 12, enabling installation in smaller sized optical readers.

After LEDs 16 and 18 are mounted onto PCB 14 in the manner described above, the aperture plate 610 is mounted into the frame 12, the plate having domes 42 which fit over the aiming LEDs 18. The domes are preferably opaque to substantially block all light emanating from aiming LEDs 18, except light exiting the domes through slit apertures 43. Slit apertures 43 should be formed so that a desired shaped aiming pattern of illumination is projected onto a target, T. In one embodiment, aperture slits 43 are shaped rectangular so that a horizontal line pattern is projected onto a target.

Aperture plate 610 further includes a number of cutaway sections 46 providing clearance to allow the aperture plate to be fitted over the illumination LEDs 16. The domes 42 and cutaway sections 46 may be formed so they do not contact LEDs 16. In the embodiment shown, each LED is held in a desired orientation while being soldered, so that the flat surfaces of LED bases 17 are biased against the flat surface of back plate 30 during the assembly process. In a further aspect, aperture plate 610 includes a shroud 58 for preventing light transmitted by the LEDs 16 and 18 from interfering with the receive optical systems of the module, it is seen that shroud 58 may be configured for aiming in achieving proper spacing between back plate 30 and optical plate 26.

After aperture plate 610 is placed over LEDs 16 and 18 and moved toward back plate 30, an optical plate 26 is snap-fitted into the opening 13 of the frame 12. Optical plate 26 includes diffusers 27 for diffusing light emanating from the illumination LEDs. In addition to having diffusers 27 formed on a front surface thereof optical plate 26 may further have wedges 28 formed on an inner surface thereof. Wedges 28 direct light from LEDs 16 toward corners of a target T so as to improve the uniformity of a target's illumination. As will be described in further detail, diffusers 27 can take on a variety of forms and can be formed on light entry surface of plate 26. Further wedges 28 can be formed on a light exit surface of plate 26.

Resilient fingers 48 having hook ends 49 are formed in the top or side sidewalls 31 of frame 12 to enable snap-fitting of the optical plate 26 onto frame 12. In the embodiment shown, the optical plate 26 may be snap-fitted onto the frame 12 by pulling back the resilient fingers 48, pushing the optical plate toward the back plate 30, then releasing the fingers 48 to lock plate 26 in position inside module 10. The plate and fingers may be formed so that the fingers are spread apart and released by plate 26 when optical plate 26 is pushed toward back plate 30. Fully assembled, module 10-9 may have a height dimension of about 19 mm 0.75 inches), a width dimension of about 39 mm (1.5 inches), and a depth dimension of about 27 mm (1.06 inches).

To the end that essentially the entirety of the required electronic circuitry of an optical reader can be packaged into a single printed circuit board, the back surface of the frame's back plate 30 may be configured to accommodate electrical components that will extend forward from the front surface 14a-f of PCB 14a. Accordingly, it is seen that the rear surface of back plate 30 includes a central recess 34 for aligning and receiving solid state image sensor 32 and peripheral recesses 35 for accommodating electrical circuitry 802 such as components and/or conductors which may protrude from the front surface of PCB 14a. The aperture plate 610 includes spacers 52 which operate to bias aperture plate 24 toward back plate 30 when optical plate 26 is snap fitted onto frame 12. The spacers 52 of module 10-9 further transfer the force imparted by fingers 48 on optical plate 26 to the aperture plate 610, securing both the aperture plate 610 and optical plate 26 inside frame 12 without the use of adhesives or outside mechanical securing means, such as screws or pins. In the embodiment of FIG. 2n optical plate 26 includes a separate diffuser 27 for each illumination LED 16. In the alternative embodiment of FIG. 5d a single diffuser 27 is formed substantially throughout the surface of plate 26.

Referring to further variations of module 10, in the embodiment of FIGS. 3a-3d imaging module 10-10 includes a printed circuit board 14a having both an image sensor 32 and illumination LEDs 16 mounted thereon. A pair of LEDs are mounted on either side of image sensor 32 to form a pattern of LEDs comprising four substantially linearly arranged LEDs. Mounting of LEDs in a horizontally oriented linear pattern reduces the height dimension requirements of module 10-10 relative to that of module 10-9 and module 10-1. Mounting of LEDS in a horizontally oriented linear pattern allows the height of module 10-2 to be reduced to a height closer to the height of image sensor 32. Referring to further aspects of module 10-10, module 10-10 includes a support assembly 80 mounted to and extending from PCB 14. Support assembly 80 in each of the embodiments shown of FIGS. 3a-4d and 4k-4n includes a containment section 81 and a retainer section 82. Containment section 81 contains image sensor 32 while retainer section 82 retains lens assembly 40. Retainer 82 also prevents light rays not corresponding to the image at a target, notably rays emanating directly from LEDs 16 from reaching image sensor 32.

Figure 3A:
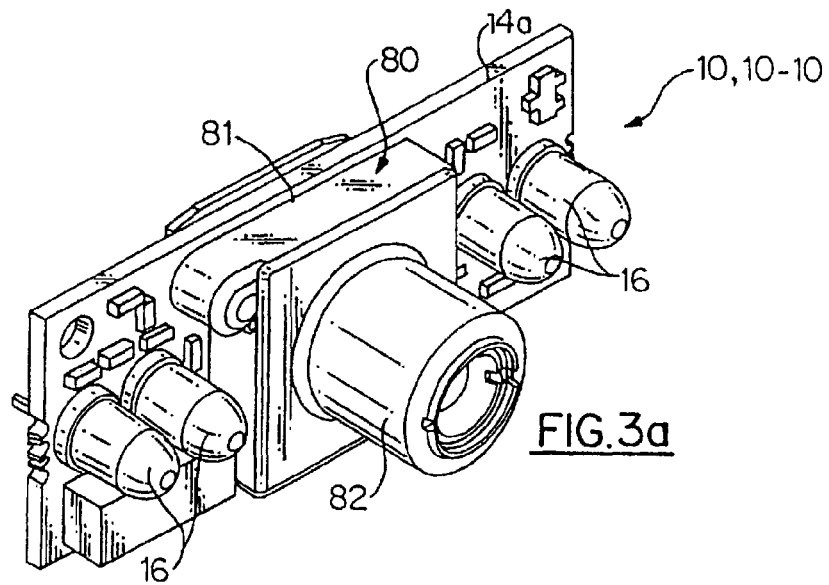
FIG. 3a is a perspective view of an alternative imaging module of the invention.
Figure 3B:
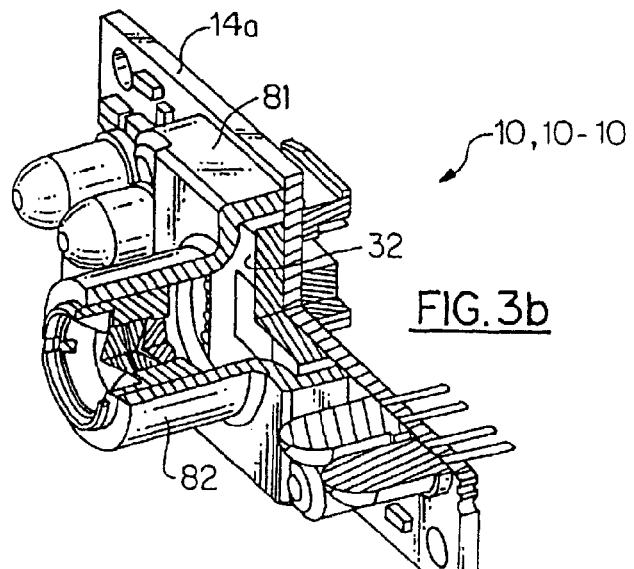
Figure 3C:
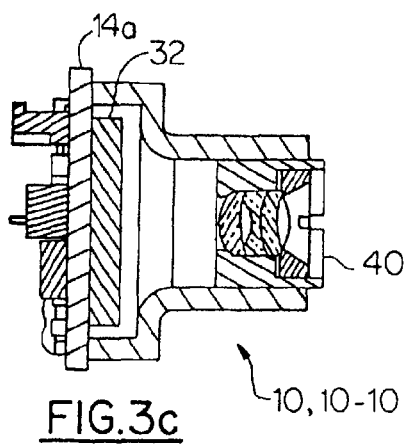
Figure 3D:
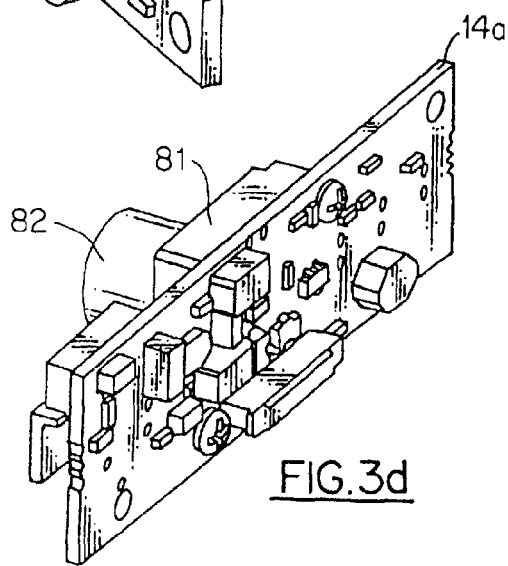
Figure 3E:
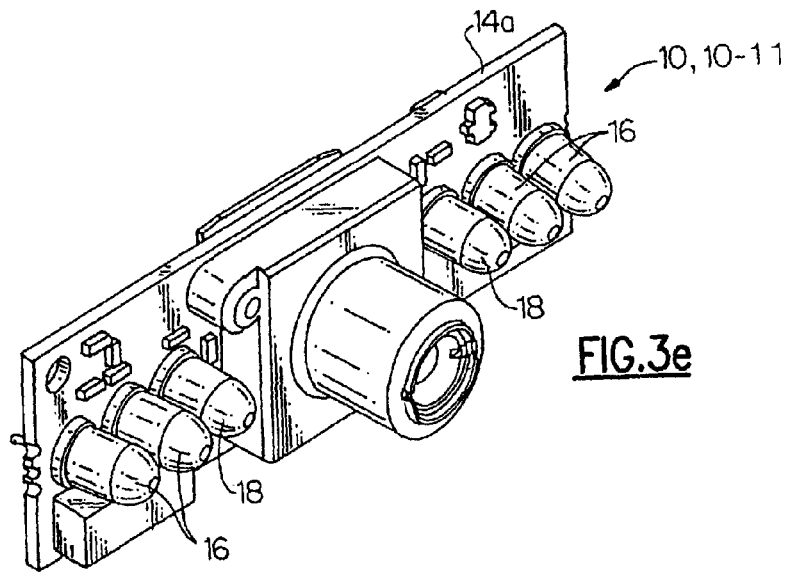
FIG. 3e is a perspective view of an alternative imaging module of the invention including a single horizontal row of LEDs and a support frame supported entirely by a printed circuit board.
Figure 3F:
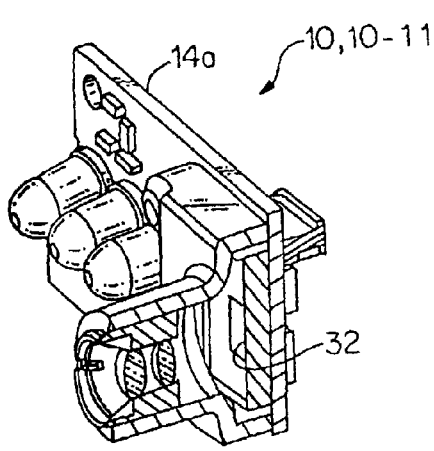
FIG. 3f is a cutaway perspective view of the module of FIG. 3e.
Figure 3G:
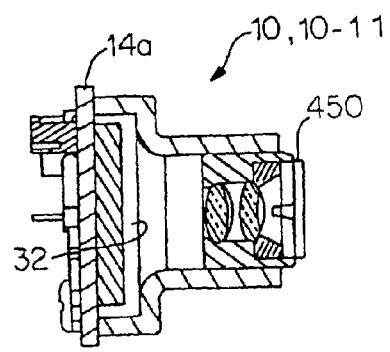
FIG. 3g is a cutaway side view of the module of FIG. 3e.
Figure 3H:
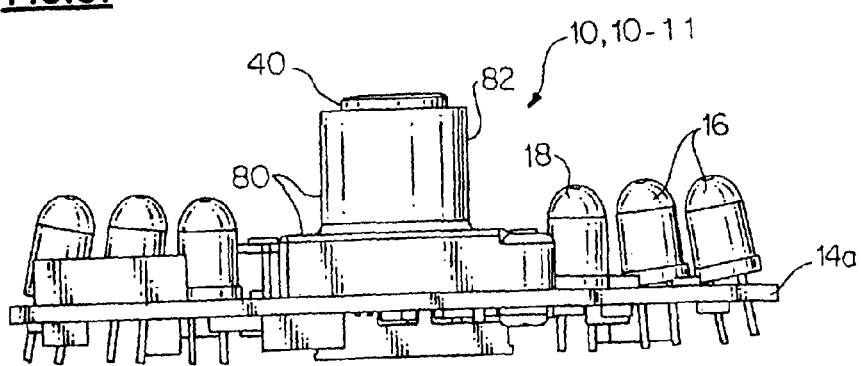
FIG. 3h is a top view of the module of FIG. 3e.

Referring to further variations of an imaging module according to the invention, in the embodiment of FIGS. 3e-3h imaging module 10-11 includes a printed circuit board 14a having mounted thereon an image sensor chip 32, illumination LEDs 16, and aiming LEDs 18. Three LEDs are mounted on either side of module 10-11 to form a horizontally oriented substantially linear pattern of LEDs comprising six LEDs. Inner LEDs 18 are aiming LEDs while outer LEDs 16 are illumination LEDs. Illumination LEDs 16 may be canted (mounted at angles) as best seen in FIG. 3h so that a center of a target area is more uniformly illuminated absent additional illumination optics.

Further variations of imaging modules are shown in FIGS. 3i-3m. In module 10-12 of FIG. 3i the configuration of support assembly 80 is modified so that assembly 80 is box shaped and of substantially uniform height, width and depth. Box-shaped containment and retainer assembly 80, particularly when sized to a height substantially equally to that of circuit board 14 provides certain packaging advantages. For example, if module 10-12 is mounted in an instrument housing so that assembly 80 abuts on a planar surface of an instrument housing, box shaped assembly 80 aids in the stabilization of module 10-12. Module 10-13 shown in FIG. 3j comprises a configuration essentially identical to module 10-12 except that the leaded LEDs are replaced with surface mounted LEDs 16 and 18 as shown. It is understood that the leaded LEDs described herein can normally be replaced with surface mounted LEDs as seen in FIG. 3j, side-leaded surface mounted LED, or surface integrated LEDs.

Modules 10-10, 10-11, 10-12 and 10-13 may be used in combination with illumination optics mounted to a separate member of an instrument housing 111. Alternatively, illumination optics can be incorporated into the module as illustrated by modules 10-14, 10-15 and 10-16 of FIGS. 3k, 3L, and 3m. Module 10-14 of FIG. 3k includes form fit diffusers 504, 27 which are adapted to be friction-fit over illumination LEDs 16. In the embodiments shown in FIGS. 3L and 3m module 10-15, 10-16 includes optical flanges 803 extending outwardly from assembly 80. Each flange 803 may include slit aperture 43 for shaping light from aiming LEDs 18 and a diffuser 27 for diffusing light from illumination LEDs 16. Diffusers 27 may be molded into flanges 803 as part of plate inserts 560. Flanges 803 may be formed integral with support assembly 80 using a mold adapted for manufacture of a one piece containment, retainer and flange assembly. Flanges 84 may also be mounted to PCB 14a or to a member of the instrument housing in which the module is installed. Module 10-16 shown in FIG. 3m is similar to module 10-15 except that leaded LEDs are replaced with surface mounted LEDs 16 and 18 as shown. In addition, flanges 803 of module 10-16 are spaced apart at a closer distance to PCB 14a than flanges 803 of module 10-15.

Diffusers 27 of module 10-15 are shown as being of the type including horizontally oriented substantially cylindrical microlenses formed on a light exit surface of the optical member including diffusers 27. As will be described in greater detail herein, substantially cylindrical microlenses operate to diffuse light preferentially transversely to the orientation of the microlenses. Thus horizontally oriented microlenses of diffusers 27 of module 10-15, having linearly arranged illumination LEDs 16 will operate to increase the height dimension of the overall illumination pattern generated using a linearly arranged set of light sources.

Another imaging module is shown in FIGS. 4a-4d. In module 10-17, a flexible printed circuit board 14a carries an image sensor chip 32 and a light pipe 310 for transmitting light from a source location 312 to a light pipe distal end 314 remote from the source location. Light pipe 310 of module 10-17 is shown as being provided by a fiber optic cable. However, light pipes may also be molded light pipes. Fiber optic cables are available from several manufacturers including Schott Corp. of Wayzata, Minn. and Bivaropto, Inc. of Irvine, Calif. Light pipes 310 can be any length and can be mounted at substantially any location of flexible circuit board 14a of module 10-17. It will be appreciated that the configuration of module 10-17 allows installation of module 10-17 into a wide variety of instrument housings and equipment. Flexible circuit board 14a of module 10-17 which may be a type available from Minco, Inc. of Minneapolis, Minn., may be bended into a virtually limitless number of forms to allow installation of module 10-17 into instrument housings of a wide variety of shapes and sizes. Furthermore, light pipe 310 provides illumination of a target area T when distal ends 314 are directed to a target without requiring that space consuming LEDs be mounted in a certain arrangement about an imaging axis. An important advantage of incorporating light pipe 310 into an imaging module 10-17 is that the radiance of illumination emitted by an individual light pipe can be increased without increasing the space consumed by the distal end 314 of the individual light pipe. The radiance of light emitted at a distal end 314 of a light pipe can be increased by directing light from more than one source into a source end 312 of the light pipe. A source end of a light pipe can be split into two or more light entry units 312a and 312b as shown by FIG. 4e, each of which is disposed in proximity with a light source such as an LED. Also, a light pipe can be made to have a large source end and diameter enabling it to receive light from more than one light source as shown by FIGS. 4f, 4i and 4j.

Now referring to FIGS. 4g-4j an imaging module 10-18 is described having molded light pipes 311. In module 10-18, PCB 14a is arranged parallel to imaging axis, $a.sub_i$, and image sensor chip 32 is mounted perpendicularly on PCB 14a. Image sensor 32 may be perpendicularly mounted on PCB 14a by using a rigid flex PCB. Referring to further aspects of module 10-18, LEDs 16, and 18 provided by surface mount type LEDs are mounted on PCB 14a and molded light pipes are disposed in relation to LEDs 16s and 18s so that light from LEDs 16 and 18 is directed through distal ends 314 of light pipes in a direction generally parallel to imaging axis, $a.su_i$, toward a target T. Molded light pipes 311 are available from such manufacturers as Bivaropto, Inc. of Irvine Calif. and Dialight Corp. of Manasquan, N.J. Diffusers can be molded onto the distal ends of illumination light pipes 311, 311i as is indicated by diffusers 27 shown in FIG. 4g. Diffusers can be e.g. diffractive optic, refractive optic (e.g. microlens), or negative lens diffusers. Diffusers can also be formed at distal ends 314 of pipes 310 of module 10-17. As in the case of a fiber optic cable light pipe, the radiance of illumination emitted by any one molded light pipe 311 can be increased by widening source end 312 of pipe 311 and disposing source end 311 to collect light from more than one light source, as is indicated by light pipes 311i of FIG. 4g. Illumination light pipe 311i of module 10-18 shown in FIG. 4j collects light from three surface mounted LEDs 16 whereas aiming light pipe 311a collects light from a single surface mount LED 18.

Arranging PCB 14a parallel to imaging axis, $a.sub_i$, and installing molded light pipe 311 on PCB 14a to direct light in a direction parallel to PCB 14a reduces the height dimension of module 10 and facilitates installation of the module to in a "thin" instrument housing having a small height dimension. The height dimension of an imaging module 10 having light pipe illumination can be reduced further by back mounting of image sensor chip 32 on PCB 14a as is illustrated by module 10-19 shown in FIGS. 4k-4n. In the embodiment of FIGS. 4k-4n image sensor chip 32 is back mounted on PCB 14a together with a containment and retainer assembly 80 that is equipped with folding optics sufficient to fold imaging axis, $a.sub_i$, substantially 90 degrees. Folding optics can be provided, for example, by formation of plated reflective material on or by affixing a mirror to wall 402 as indicated by dashed-in mirror 404. Because module 10-19 can be designed to have a height dimension smaller than the width of image sensor 32, module 10-19 is especially well-suited for installation in "thin" reader housings. For example, module 10-14 is well suited for installation into the housings of a personal data assistant "PDA" such as a cellular phone as shown in FIG. 9i, or a hand-held computer as shown in FIG. 9j.

B. Illumination

Figure 5B:
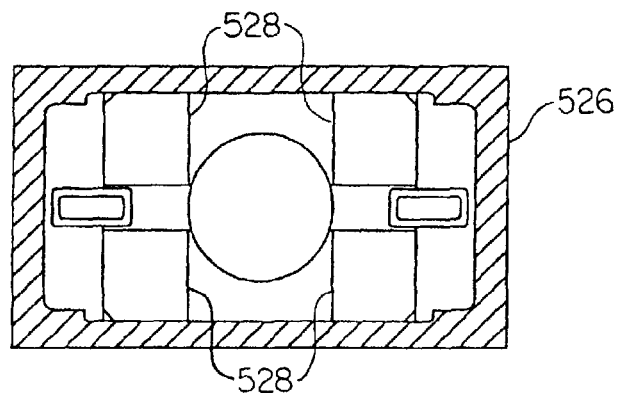
FIGS. 5*b* and 5*c* illustrate molds which may be utilized in the manufacture of an optical plate according to the invention.
Figure 5C:
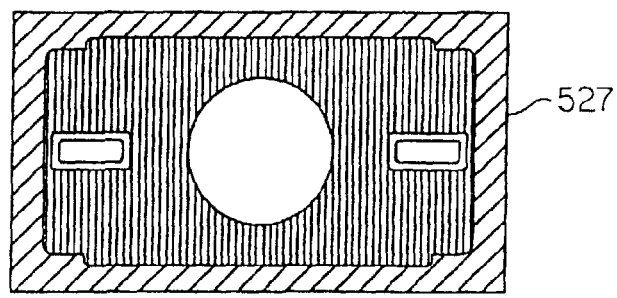
Figure 5A:
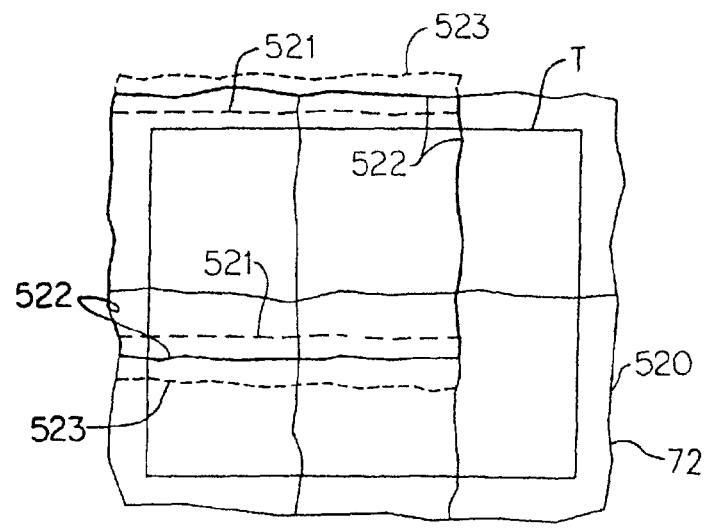
FIG. 5*a* is a diagram illustrating an appearance and a method for generating illumination pattern according to the invention.

Features of illumination systems in accordance with the invention are now described primarily with reference to FIGS. 5a-5f. For substantially uniform illumination of a target area T in an overall pattern 520 corresponding to the field of view of image sensor 32 (in which corners are illuminated to a brightness of at least about 50% of the target areas maximum brightness), light emanating from each LED in a two row, four LED illumination system (as in e.g. module 10-1 or module 10-9) should be diffused to provide a substantially rectangular illumination pattern having borders 19 substantially defined by lines 522 as is shown in FIG. 5a.

Shown in FIG. 5b is a surface of a mold 526 for use in manufacturing a multiple diffuser optical plate 26 e.g. of module 10-9 (FIG. 2n), mold 526 may have installed therein separately manufactured diffractive mold elements 528. Mold element 528 installed in mold 526 may be of the type manufactured using holographic techniques as are available from Physical Optics Corp. of Torrance, Calif. and Fresnel Optics of Rochester, N.Y. Other manufactures of diffuser optical elements include DOC of Charlotte, N.C., MEMS of Huntsville, Ala. and RPC of Rochester, N.Y.

Shown in FIG. 5c is a surface of a mold 527 for use in manufacturing a single diffuser optical plate 26 as is incorporated in e.g. module 10-5 of FIG. 2g and as shown by plate 26 of FIG. 5d. Mold 527 includes a texture formed directly thereon. The texture may be applied by way of an acid resist process. Mold texturing companies, such as Mold Tech, Inc. of Painsville, Ohio specialize in applying textures to molds by way of an acid resist process as in old 527 used to make a part having a surface having the texture shown in FIG. 5e. A suitable material for use in the manufacture of optical plate 26 in any of the embodiments described herein is polycarbonate.

The textured surface mold 527 of FIG. 2p is generally less expensive and more durable than the mold having installed diffractive diffuser mold element inserts 528 of FIG. 5b. Diffractive mold element 528 is costly to manufacture, and requires frequent replacement. Textured molds as shown in FIG. 5c are typically used in applications such as manufacturing fingerprint-resistant surfaces. As far as is known, light transmissive plates made using insertless textured surface molds as shown in FIG. 5c have been incorporated in products having light sources primarily for the purpose of obscuring the view of a light source, and have not been used to produce controlled target area illumination of an image capture system.

Exploded views of the diffuser surface of optical plate 26 of FIG. 5d having a single diffuser 27 for diffusing light from several LEDs are shown in FIGS. 5e and 5f. Plate 26 comprises a plurality of substantially adjacent and substantially cylindrical microlenses 550. Referring to further aspects of microlenses 550, microlenses 550 are preferably formed in randomized pattern on plate 26 characterized in that microlenses 550 comprise at least two different sizes without a particular ordering of similar-sized microlenses and without precise parallel relative orientation between the lenses. Randomization of the pattern reduces the formation of "hot spots," concentrated areas of constant higher radiance illumination, on a target area T. In another aspect of plate 26, plate 26 as shown in FIG. 5d preferably comprises occasional cross-connections 552 defined in the valleys 554 delimiting the various cylindrical microlenses 550. Cross-connections 552 provide diffusion of light in a direction generally transverse to the direction of light diffusion provided by microlenses 550 microlenses 550 are believed to operate by converging light rays from sources 16 into convergence points positioned closely forward of lenses 550, such that the rays are in diverging relation to another at typical module to target reading distances (e.g. about 1 inch to 15 inches for common codes).

Referring to FIG. 2q, the diffused light pattern generated by a single light source as diffused by single diffuser optical plate 26 shown by FIG. 5d is designated as the pattern substantially determined by border lines 522 of the overall illumination pattern substantially delimited by border 520. Vertically oriented cylindrical microlenses 550 tend to diffuse light in a horizontal direction while the lensing provided by cross-connections 552 tend to diffuse light from a light source in a vertical direction. It can be seen that diffusion patterns can be controlled by appropriate shaping of microlenses 550. Reducing the incidence of cross-connections 552 would reduce the diffusion of light in the vertical direction. With a reduced incidence of cross connections an illumination pattern corresponding to a single light source substantially delimited by dashed line 521 may be generated. Increasing the incidence of cross-connections 552 would increase the diffusion of light in the vertical direction. An increased incidence of cross connections 552 might generate the illumination pattern for a single light source delimited substantially by dashed lines 523. A diffuser comprising a series of spherical refractive optic microlenses would be expected to generate a substantially uniform circular illumination pattern which may be highly desirable depending on the intended applications and overall design of the module. Diffusing light in a vertical direction to increase the height of an illumination pattern is particularly useful in the case that a target illumination diffuser is incorporated in an imaging module having a single row of horizontally oriented light sources and incorporates a 2D image sensor. Referring again to FIG. 3L, module 10-15 comprises plate inserts 560 including diffusers 27 comprising horizontally oriented cylindrical microlenses 550. Microlenses 550 of module 10-15 diffuse light vertically with respect to the horizontal axes h of module 10-15 thereby increasing the vertical (height) dimension of the illumination pattern projected by modules 10-15. Microlenses 550 of plate 26 or plate inserts 560 may not be formed in a randomized pattern and may not comprise cross-connections 552. Nevertheless, cylindrical microlenses 550 of plate 26 described with reference to FIG. 5e operate to diffuse light in a direction generally perpendicular to microlenses 550. Plate insert 550 of module 10-15 could be replaced with a plate similar to plate 26 of FIG. 5d having randomized pattern of microlenses and being modified to include cylindrical microlenses oriented horizontally rather than vertically. Optical plate 26 e.g. plate 26 of FIG. formed with use of substantially uniformly textured mold 527, diffuses light substantially via refractive optics. By contrast, optical plate 26 shown e.g. in module 10-9 made using a mold e.g. mold 526 having holographic formed inserts diffuses light substantially via diffractive optics. Configuring optical plate 26 to diffuse light substantially via refractive optics as opposed to substantially via diffractive optics is advantageous at least for the reason that molds used to make refractive optic diffusers are easier to make and less expensive, while being substantially more durable than molds used to make diffractive optic diffusers. As is known by skilled artisans, diffractive optical characteristics predominate when optical elements transmitting light are in a range of sizes proximate the wavelength of light being transmitted. Several imaging modules described herein include light sources that emit light in the wavelength range of from about 0.4 to about 1.0 microns. For refractive diffusing of light in this wavelength range the optical elements of a diffuser should have dimensions substantially larger than the upper limit of this range, e.g. at least about 10 microns. For example, as best seen in cross sectional view of FIG. 5f, cylindrical microlenses 550 of optical plate 26 of FIGS. 5d, 5e, and e.g. modules 10-5 and 10-9 may have an apex-to-apex separation that ranges from about 0.018 inches to about 0.028 inches.

Referring to further aspects of optical plate 26, it will be understood that optical plate 26 can be made using a mold having diffuser section mold inserts similar to inserts 528, wherein the inserts include a microlens-forming texture as in mold 57. Providing a mold similar to mold 526 except having microlens forming mold inserts instead of diffractive diffuser mold inserts 528 facilitates the cost advantages of utilizing mold 527 and other advantages. New mold inserts can be interchanged into the mold to replace a worn mold insert or to satisfy a special customer request for example. Mold inserts can be manufactured in accordance with the texturing process as described in connection with FIG. 5c or else mold inserts can be machined from metal members using a standard metal machining process. As indicated previously microlenses made from a mold can be cylindrical or spherical, can include or be substantially devoid of coarse connections 552 and can have uniform or nonuniform apex to apex distances. Modules 10-1, 10-7, 10-8 are examples of modules including optical plates 26 manufactured using a mold comprising a plurality of microlens-forming mold inserts.

In addition to having at least one diffuser 27, optical plates 26 described herein for use with modules e.g. module 10-1 and module 10-9 include wedges 28 formed on light entry surfaced thereof as shown by FIG. 1n (relating to module 10-1) and FIG. 2o (relating to module 10-9). Wedges 28 operate to direct light from illumination light sources 16 toward corners of a target area e.g. target area 520 as shown in FIG. 5a.

Figure 5G:
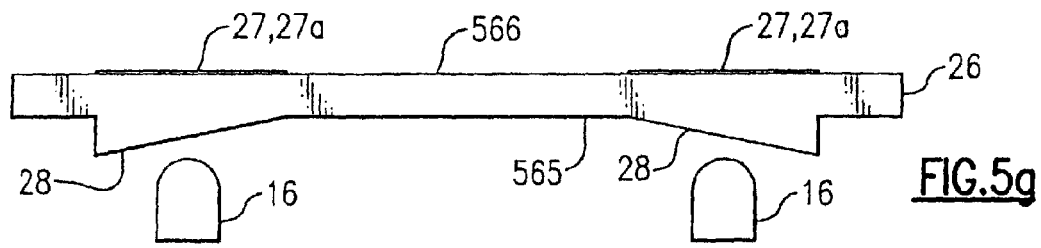
FIGS. 5*g*-5*k* illustrate top cutaway views of various optical plates according to the invention taken along a row of illumination light sources.
Figure 5H:
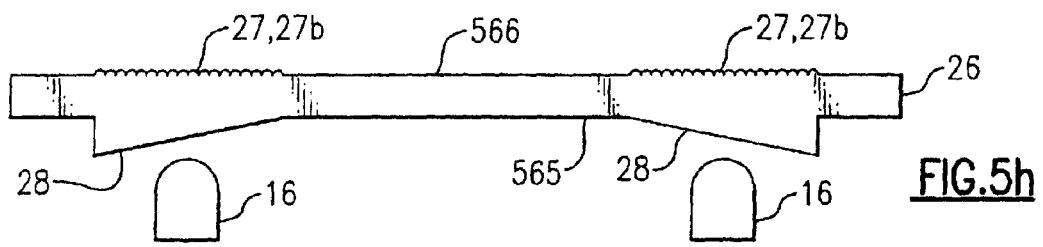
Figure 5I:
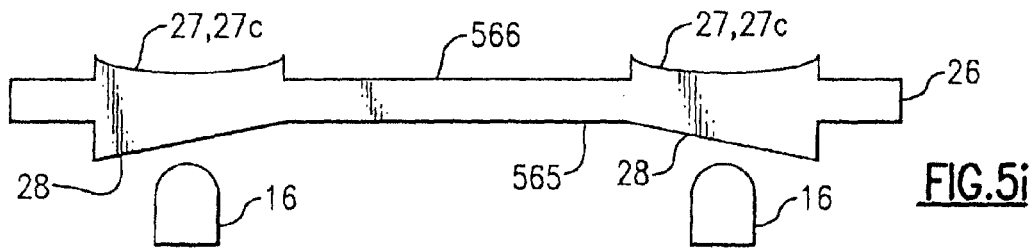
Figure 5J:
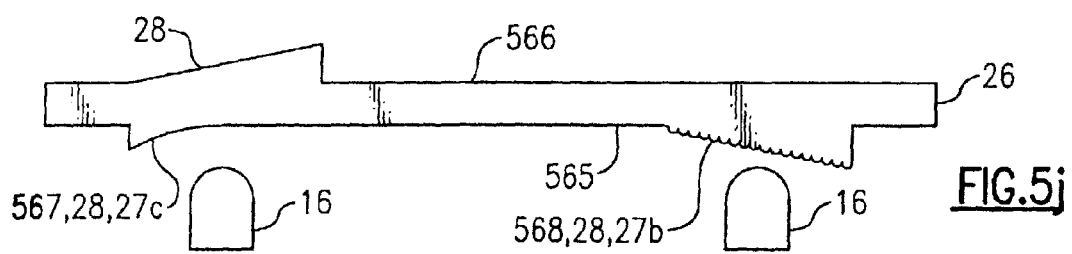

Diffusers 27 as shown in the various imaging modules can be provided in a number of varieties. Examples of optical plates 26 have varying types of diffusers are described with reference to FIGS. 5g through 5k showing a top view of optical plate 26 in various embodiments taken a long a row of illumination LEDs 16. In the embodiment of FIG. 5g optical plate 26 includes diffractive optic diffusers 27, 27a as shown e.g. by module 10-9. In the embodiment of FIG. 5h, optical plate 26 includes refractive optic microlens diffusers 27, 27b as shown e.g. by module 10-1. In the embodiment of FIG. 5i, optical plate 26 comprises negative lens diffusers 27, 27c. Negative lens diffusers are provided by forming negative lens (generally concave) lens surfaces on plate 26. With use of a negative lens to provide a diffusion function, light rays generated by sources 16 are in diverging relation to one another when exiting light exit surface 566 plate 26. Negative lens diffuser 27c as seen from a top view in FIGS. 5i, 5j, and 5k can be a spherical negative lens or a vertically oriented cylindrical lens. If negative lens diffuser 27c is a vertically oriented cylindrical lens, diffuser 27 will tend to diffuse light horizontally. If negative lens 27c is spherical it will tend to diffuse light both vertically and horizontally. It may also be desirable to include in one of the modules 10 described herein a horizontally disposed cylindrical negative lens diffuser 27c which diffuses light vertically. FIG. 5L shows a functional partial side view a modified version of module 10-15 (FIG. 3L) including a single row of LEDs and flanges 803, which hold optical plate inserts 560 at positions forward of LEDs. In the variation of module 10-15 shown in FIG. 5L it is seen that refractive optic microlens diffusers 27 of module 10-15 can comprise horizontally oriented cylindrical negative lens diffusers 27c for diffusing light vertically. While negative lens surfaces 27c are shown as being provided on both the light entry and light exit sides of plate 560 it is understood that negative lens surfaces could be provided on just one of the light entry and light exit surfaces shown in FIG. 5L.

Figure 5K:
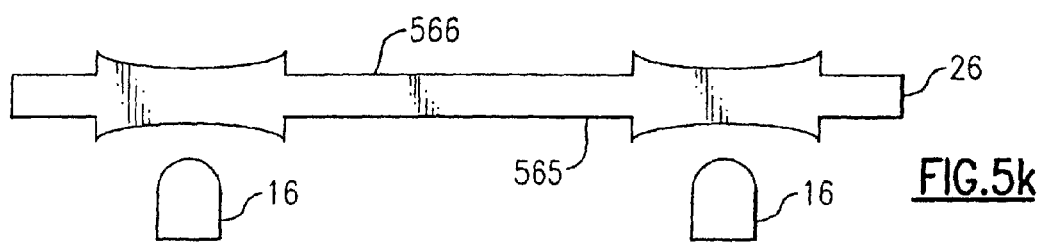

Referring again to the variations of optical plates 26 shown in FIGS. 5g through 5k, FIG. 5i illustrates that diffusers 27 need not be formed on a light exit surface of plate 26. Plate 26 of FIG. 5i further demonstrates that a surface of plate 26 can comprise a combination of optical elements. In plate 26 of FIG. 5i, surface 567 comprises a negative lens diffuser surface 27c superimposed on a wedge 28 light entry surface. Surface 568 of plate 26 shown in FIG. 5i comprises a microlens diffuser surface 27b superimposed on a wedge 28. Optical plate 26 of FIG. 5i further comprises a wedge 28 formed on a light exit surface of optical plate. Referring to optical plate 26 of FIG. 5k, the embodiment of FIG. 5k demonstrates that diffusers 27 can be formed on both of light entry and light exit surfaces of plate 26. Optical plate 26 of FIG. 5k includes a negative lens diffuser surfaces 27c formed on both of light exit 566 and light entry surfaces 565 of plate 26. Negative lenses 27c shown in FIG. 5k can be cylindrical or spherical negative lens. In one embodiment, all negative lenses 27c of FIG. 5k are spherical. In another embodiment they are all cylindrical. In yet another embodiment negative lenses 27c on light exit surface 566 of plate 26 are vertically oriented cylindrical negative lenses and lenses 27c on light entry surface 565 of plate 26 are spherical negative lenses. In another embodiment spherical negative lenses are disposed on light exit surface 566 of plate 26 and cylindrical negative lenses 27c are disposed on light entry surface 565. Any one of plates 26 described with reference to FIGS. 5g-5k can be incorporated in any one of modules 10 described herein including an optical plate 26. Further diffusers 27 of e.g. module 10-14, 10-19 can be of any of the varieties described.

C. Aiming Systems

An aiming pattern generating system is described herein wherein an aiming optics element 25 is disposed forward of an aiming aperture 43 to image light rays emanating from the aiming aperture. Several variations of aiming pattern generating systems according to the invention are now described.

Figure 6A:
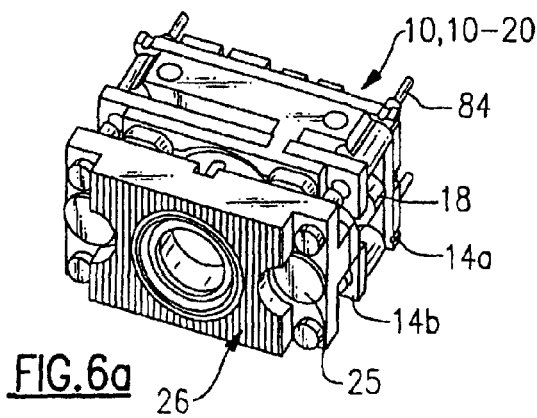
FIGS. 6*a*-6*g* illustrate various views, including perspective, side, and partial assembly views of an imaging module according to the invention having aiming light sources mounted to a circuit board which carries an image sensor.
Figure 6B:
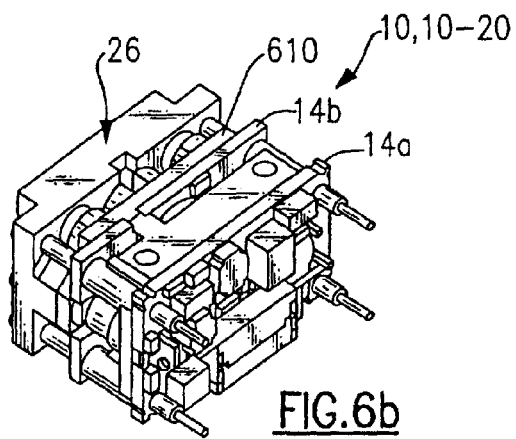
Figure 6C:
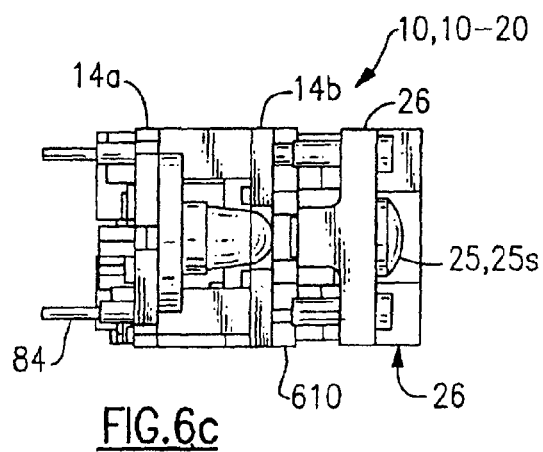

For providing an aiming pattern that is clear and sharp it is normally preferred that a substantial distance is provided between optics 25 and aiming aperture 43. For example, if aiming optics 25 includes imaging optics, slit 43 should be disposed behind a back focal point of optics 25. In module 10, 10-20 (FIG. 6a) and module 10-1 (FIG. 1a) a substantial distance between aperture 43 and optics 25 is provided by mounting aiming LEDs 18 on circuit board 14a rather than on circuit board 14b. Aiming LEDs 18 of module 10-20, shown as being provided by traditional leaded LEDs, are conveniently mounted on circuit board 14a in a position such that they are located horizontally laterally relative to retainer section 82 of support 80.

Figure 6D:
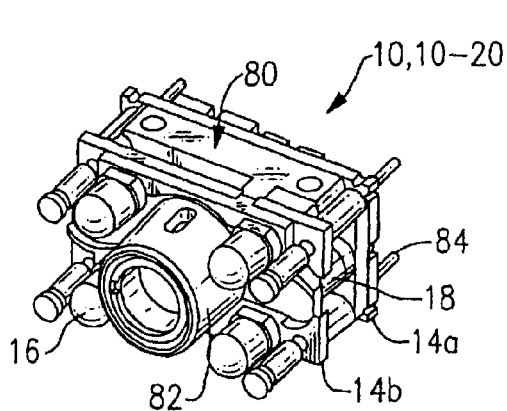
Figure 6E:
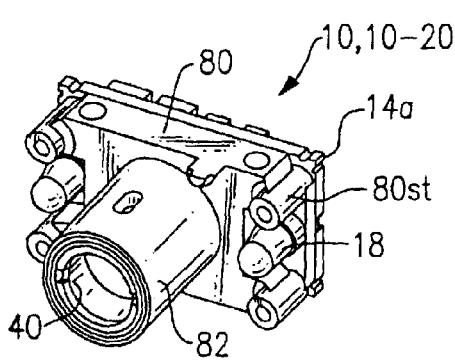
Figure 6F:
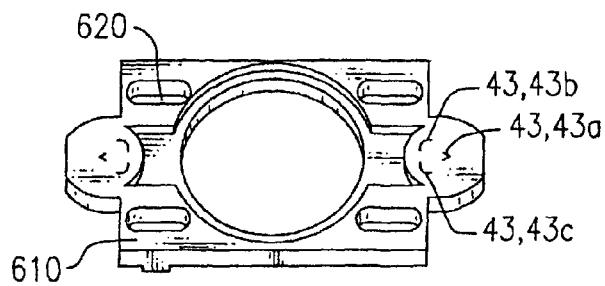
Figure 6G:
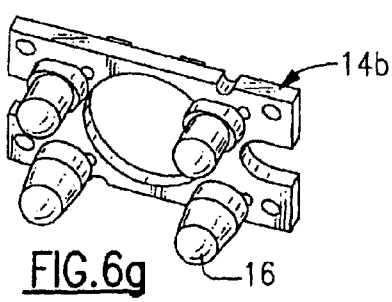

Further, with reference to module 10-20, aiming apertures 43 are disposed in a cluster formation by way of aperture 43a, 43b, and 43c so that a two-dimensional image is projected onto target T by the combination of aiming LED, aperture cluster comprising apertures 43a, 43b, 43c, and optics 25. With reference to optics 25, it is seen that aiming optics 25 of module 10-20 comprises spherical lens 25s rather than a cylindrical lens. Apertures 43 of module 10-20, like apertures 43 of e.g. module 10-1, 10-7, 10-8, 10-9, 10-15, 10-16, and 10-22 are formed in abutting or nearly abutting relation relative to light source 18. Apertures 43a, 43b, and 43c are therefore imaged in the horizontal and vertical directions onto a target T by optics 25. Aperture cluster comprising apertures 43a, 43b, and 43c can be laterally offset relative to lens 25s, so that the pattern imaged by lens 25s moves laterally inward toward a center of a target T as module 10-20 is moved closer to a Target, T. It is seen that providing symmetrical aiming pattern generating subsystems on either side of module, wherein there is lateral offset between aperture clusters 43a, 43b, and 43c and lenses 25s results in the pair of patterns projected by the pair of illuminations systems converging at a certain module-to-target distance. The aiming pattern generating system can be designed so that the pair of aiming patterns converge at the best focus position of module 10. With reference to further aspect of module 10-20, module 10-20 like module 10-7 includes aperture plate 610. Aperture plate 610 is disposed on PCB 14b. Plate 610 includes lead holes 620 for accommodating leads of illumination LEDs 16 and apertures 43, as discussed previously. Plate 610 should be opaque at least in the area of apertures 43a, 43b, and 43c. In the variation of plate 610 shown in FIG. 6d, plate 610 includes a metal aperture insert 614 for precision defining of small-sized apertures. Module 10-20 further includes a refractive optic diffuser plate 26 comprising substantially cylindrical microlenses as described previously in connection with FIG. 5e. Module 10-20 further evidenced that support posts 84 are advantageous for the purposes of accommodating a stacked-up configuration for module 10 which includes a plurality of plate-like members such as PCB 14a, PCB 14b, plate 610 and optical plate 26. Refer now to aspects of module 10-20 spherical lens aiming optics 25s could be replaced with cylindrical lenses 25c or other optical elements for imaging apertures 43 onto a target area T.

Figure 6H:
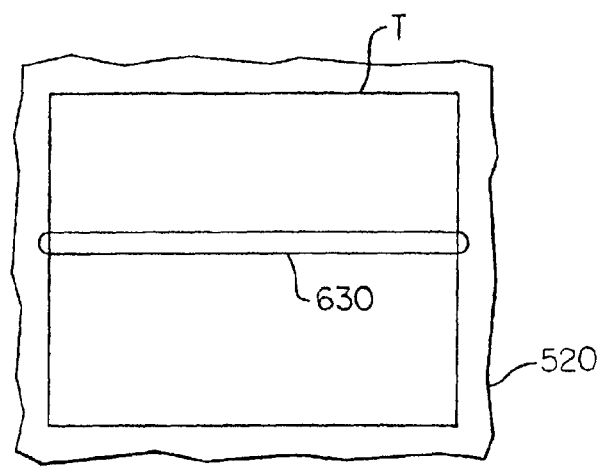
FIGS. 6*h*, 6*i*, and 6*j* are diagrams illustrating various aiming and illumination patterns which may be projected onto a target by a module of the invention.
Figure 6J:
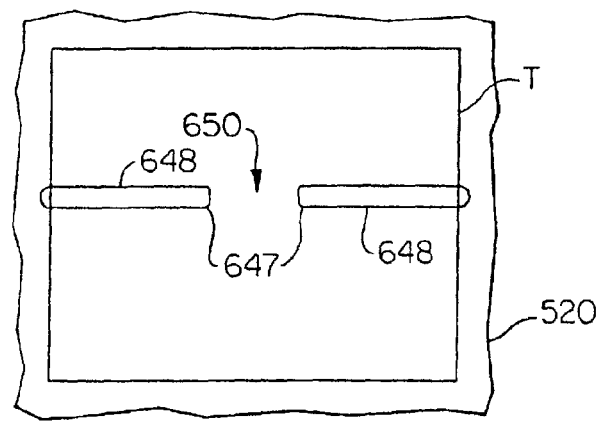
Figure 6I:
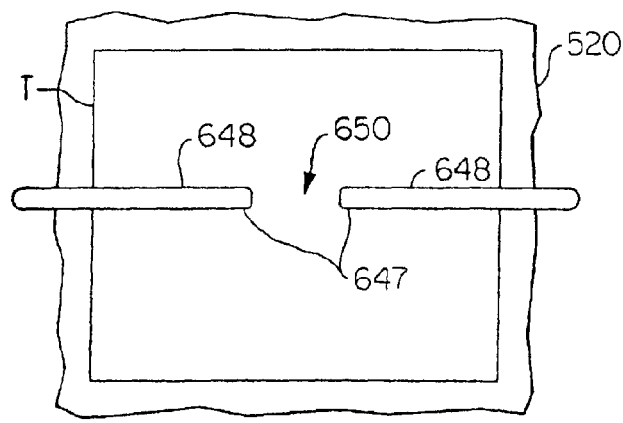

Representations of other exemplary illumination and aiming illumination patterns which may be projected by the illumination system of modules 10 described herein are shown in FIGS. 6h-6j. In FIG. 6h, area delimited by border 520 represents the region relative to a target area T illuminated by illumination LEDs 16 while area 630 represents the region of the target area highlighted by aiming LEDs 18 and their associated optics. In the embodiment of FIG. 6h aiming LEDs 18 and their associated optics (43, 25) project a solitary horizontal aiming line 630 onto a target area T.

The straight line aiming pattern of FIG. 6h, in one embodiment may be generated by manufacturing plate 26 so that horizontally oriented cylindrical lenses 25, 25c are formed on the outer surface of optical plate 26 as is shown in module 10-9 of FIG. 2n. Horizontally oriented cylindrical lenses 25, 25c are configured so that when plate 26 is applied over LEDs 18 lenses 25 are aligned coextensively and forwardly relative to slit apertures 43 in order to image light slit apertures 43 onto a target T, defined by a module's field of view. Cylindrical lenses 25 may have a thickness of about 3 mm and a radius of curvature of about 4.5 mm, convex. While lenses 25 are preferably of a type which converge and thereby image light rays passing through aperture 43, it will be seen that an acceptable aiming pattern may also be projected with use of optics which substantially collimate light rays passing through aperture 43 or which include other elements which operate to define a crisp sharp pattern as will be described herein. A straight line aiming pattern illustrated by line 630 or FIG. 6h can also be generated with spherical lenses 25s and slit aperture 43 as shown in module 10-1. Methods for projecting crisp, well-defined aiming lines over large reading distances will be described herein.

In modules e.g. 10-1, 10-9 and in the illumination system described in copending U.S. patent application Ser. No. 09/658,811, filed. Sep. 11, 2000, entitled "Optical Assembly for Barcode Scanner" (now U.S. Pat. No. 6,607,128) and incorporated herein by reference (module 10-22), aiming LEDs 18 project unfolded light rays into a target area and are oriented in a direction that is substantially parallel to the imaging axis a.sub.$_i$ of module 10-1 at the light entry 1e position of module 10-1 (the imaging axis a.sub.1 of modules e.g. 10-1, 10-9, and 10-22 is unidirectional). In module 10-22, lens 25 images a slit aperture 43 into bar code space, there being provided two LEDs 18 per aperture 43.

Figure 6K:
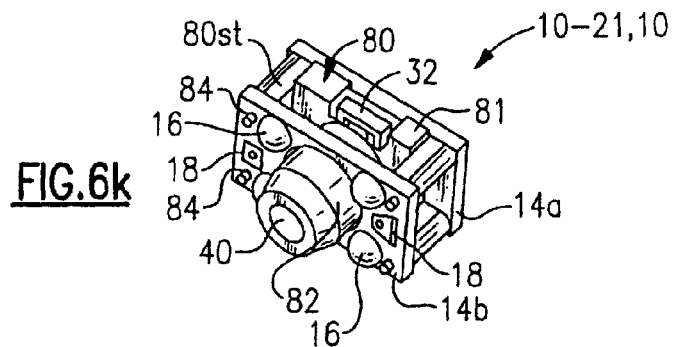
FIG. 6*k* is a perspective view of an imaging module according to the invention which incorporates aiming light sources provided by laser diodes.
Figure 6L:
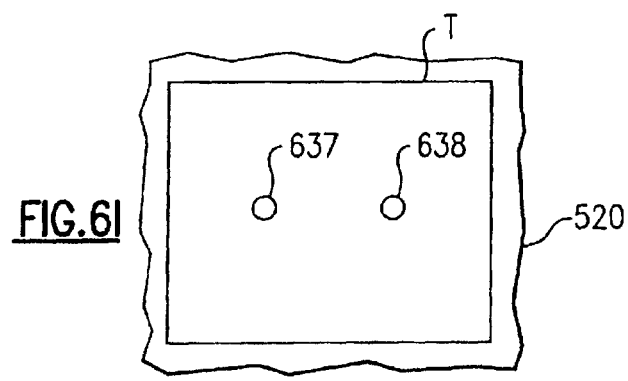
FIG. 6L is a diagram of an illumination pattern and an aiming pattern which may be projected by the module of FIG. 6*k*.
Figure 6V:
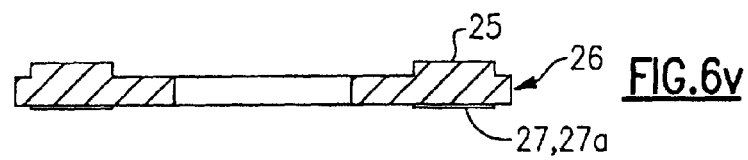
FIGS. 6*v*, 6*w*, and 6*x* are top cutaway top views of various optical plates according to the invention taken along a line of aiming light sources.
Figure 6W:
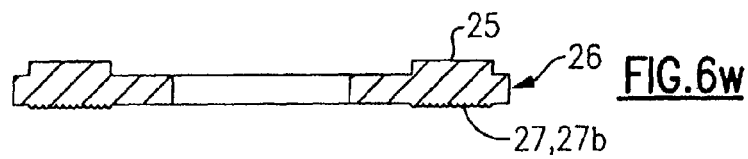
Figure 6X:
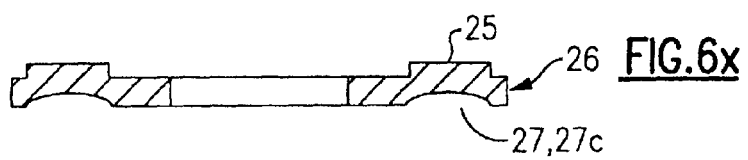

However, as is indicated by modules 10-17, 10-18 and 10-19 light rays of aiming LEDs 18 and illumination LEDs 16 can be folded (imaging axis a.sub.1 of module 10-19 of FIG. 4n is folded and has different directions at the light entry 1$_e$ and light receive 1$_r$ positions of module 10-19). FIGS. 6n, 6o, and 6p show alternative types of aiming pattern generating systems that may be incorporated in an imaging module in which light generated by an aiming LED such as LED 18 is folded. In the embodiment of FIG. 6n aperture 43 which may be imaged by lens 25 onto a target T is positioned forward of light reflective element 640 in the optical path. This embodiment is useful where light pipes are used in combination with aiming LEDs to prevent divergence of the aiming illumination light rays. In the embodiment of FIG. 6o aperture 43 which may be imaged by lens 25 onto a target T is positioned forward of LED 18 and optically rearward of light reflective element 640 in the optical path. The embodiment of FIG. 6p includes an aperture 43 positioned between light source 18 and light reflective element 43r and an optical element 25p including a prism for imaging light from aperture 43 onto a target and for redirecting aiming illumination light reflected from reflecting element 643. Optical element 25p includes a prism defined on a light entry surface thereof and an imaging lens surface (spherical or cylindrical) on a light exit surface. It is seen that the embodiment of FIG. 6p including a light redirecting prism 25p, can be utilized for reducing the height requirements of an imaging device in which the system is installed. Folded optic aperture aiming systems are readily incorporated into aiming optical light pipes as shown by FIG. 6q. In FIG. 6q, light pipe 311 transmits light from aiming light source. Incorporated into light pipe 311 is an aperture stop 641 defining an aperture 43. Disposed at distal end 314 of light pipe 311 is an aiming optic 25 for imaging aperture 43 into target space.

Referring to other aiming patterns which may be projected by modules of the invention, a split line aiming pattern is shown in FIGS. 6i and 6j. The split horizontal line aiming pattern shown in FIG. 6i may be formed by providing, as shown in FIG. 6s, aiming pattern wedges 29 on the light entry surface of optical plate 26 opposite aiming pattern cylindrical lenses 25. Aiming pattern wedges 29 operate to direct light from aperture slits 43 outwardly toward the sides of a target area T so that a gap 650 between two horizontal line segments 648 is defined in the center of a module's field of view when the module is within a range of distances from a target at which it can capture image data of acceptable quality at (the best focus distance of the module is within this range). The split line aiming pattern comprising segments 648 allows a user to easily align the center of the module's field of view with a center of a region of interest.

Figure 2J:
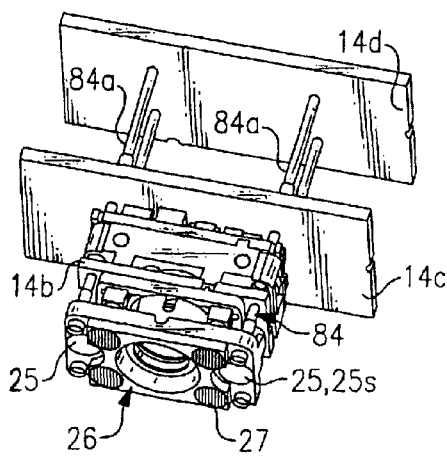

It may be desirable to restrict the width of a split horizontal line aiming pattern 647 comprising segments 648 so that line segments 648 do not extend substantially beyond a reader's target area T as defined by a reader's field of view. In order to restrict the width of split horizontal line aiming pattern comprising segments 648, vertically oriented cylindrical lenses may be superimposed on aiming pattern wedges 29 as is illustrated in FIG. 2j to form combined wedge and vertically oriented cylindrical lens elements 29'. Aligning combined wedge and lens elements 29' with slit aperture 43 provides an aiming pattern having the features shown in FIG. 6j, wherein split horizontal line aiming pattern comprising segments 648 is contained substantially within a target area T defined by a reader's field of view.

When positioned relative to apertures 43 as shown in the particular embodiment of module 10-9, cylindrical lenses 25 of optical plate 26 operate to converge and thereby image light from aperture slits 43. In the modules described shown having aiming optics 25 sharpness of aiming pattern 630 preferably will not vary substantially as the distance of module 10 to a target is varied. Optics 25 may be adapted to converge (and thereafter diverge) light gradually. Because optics 25 can be adapted to gradually converge light rays optics 25 could be described as providing the function of substantially collimating light. Further, optics 25 can actually collimate or even diverge light rays exiting optics 25 provided an aiming system includes features resulting in a sharp aiming pattern being projected on target, T. Optics 25 may include multiple features which result in pattern e.g. 630 appearing sharp over various module-to-target distances.

In one variation of the invention, aiming illumination optics are provided so that the sharpness of aiming lines e.g. lines 648 varies depending on the module to target distance. More specifically, aiming illumination optics may be provided so that aiming lines e.g. 648 are substantially most sharp at the best focus position of module 10 and less sharp when a reader equipped with module 10 is moved away from the best focus position.

Referring to further aspects of the invention it will be understood that in any of the modules described herein, aiming light sources 18 could be provided by laser diode assemblies. When aiming light sources 18 are provided by laser diode assemblies of the type incorporating a built-in collimating lens it may be considered unnecessary to include elements such as aperture 43, or optics 25 since such laser diode assemblies inherently produce a crisp aiming pattern over a wide range of module (reader) to target distances. An aiming pattern generated by a laser diode assembly aiming light source 18 may be a spot of light in target area, T. Module 10-21 of FIG. 6k includes illumination light sources 16 provided by surface integrated LEDs and aiming light sources 18 provided by laser diode assemblies. Imaging module 10-21 may project an aiming pattern as shown by FIG. 6L. Laser diode assembly aimers 18 may project two dots 637, 638 onto target, T. If diode assemblies 18 are canted, imaging module 10-21 can be adapted so that dots 637, 638 converge at a best focus distance.

In another useful embodiment of the invention, emit optics comprising optical element 25 aperture 43 and light source 18 are coordinated with receive optics 40 so that a best focus emit optical module-to-target distance (at which an optimally focused image of aperture 43 is projected on a target) is greater than a receive optic module-to-target distance (at which an optimally focused image of a target indicia, e.g. a bar code is incident on image sensor 32). Such an embodiment is highly useful in a 1D embodiment as shown by module 10-22, wherein an aiming pattern may serve as an illumination pattern. Configuring module 10-22 to have an emit optical best focus distance greater than a receive optical best focus distance has been observed to improve a depth of field of module 10-22. At reader distances about the best receive optic focus distance, module 10-22 because of high image quality can be successfully employed to read bar codes with a less than optimally focused aiming and pattern being imaged onto a target, T. At longer distances that are about the distance of the best emit-optical focus distance the optimally focused illumination pattern yields a high signal to noise ratio, and module 10-22 can successfully decode indicia at the longer distance. In one example of module 10-22, module 10-22 is established to have a best emit optical focus distance (at which aperture 43 is optimally focused on a target) of greater than about 7 inches and best focus receive optical focus distance (at which an indicia is optimally focused onto sensor 32) of less than about 5 inches.

Figure 6Y:
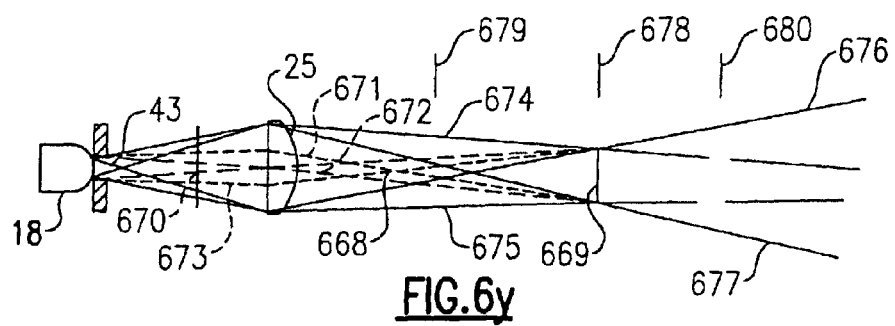
FIG. 6*y* is a side view light ray diagram illustrating aperture effect of an aiming optical element according to the invention in one embodiment.
Figure 6M:
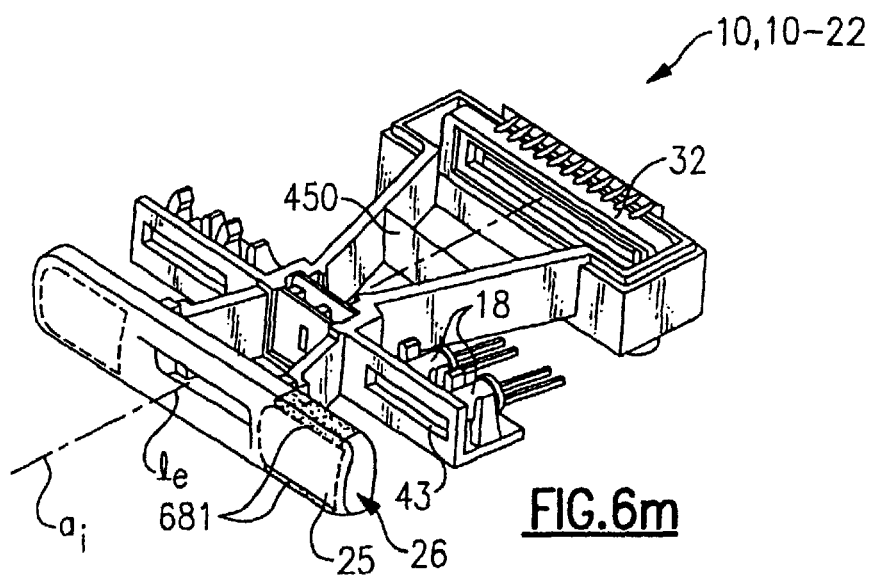
FIG. 6*m* is a perspective view of an imaging module of the invention, which is well suited for carrying a 1D image sensor.
Figure 6N:
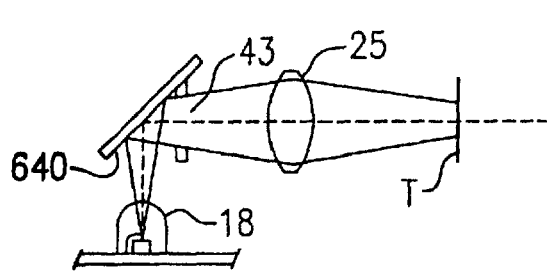
FIGS. 6*n*, 6*o*, and 6*p* are side view functional diagrams illustrating various folded optic aiming systems which may be incorporated in the invention.
Figure 6O:
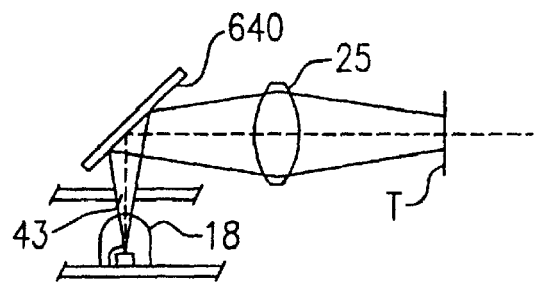
Figure 6P:
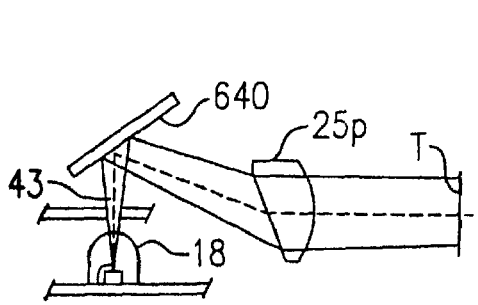
Figure 6Q:
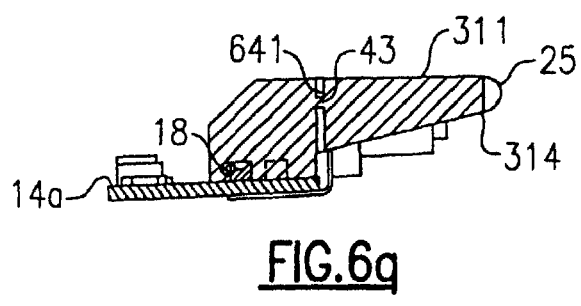
FIG. 6*q* is a cutaway side view of a module according to the invention having a molded light pipe incorporating an aperture aiming system.
Figure 6R:
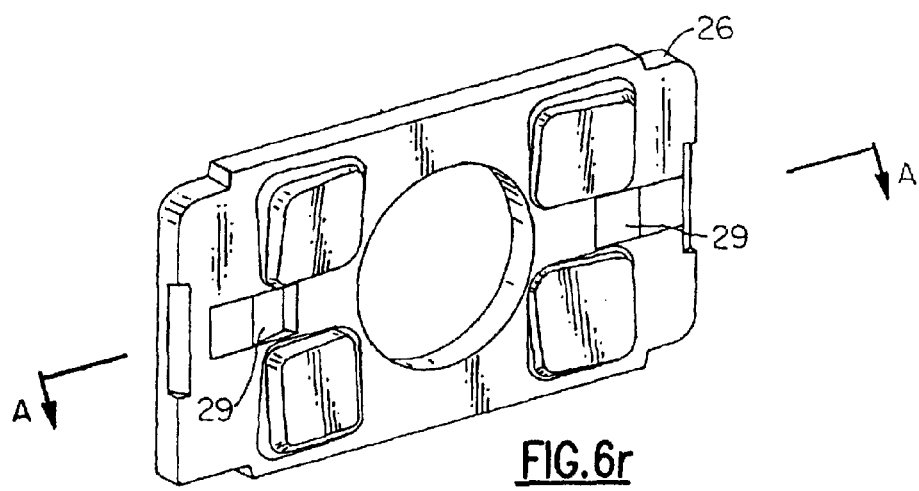
FIG. 6*r* is a rear perspective view of an optical plate according to the invention adapted for generating a split line aiming pattern.
Figure 6S:
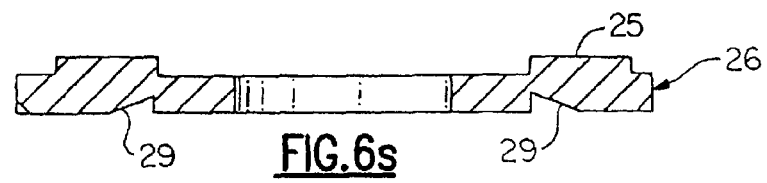
FIG. 6*s* is a top cutaway view of the optical plate of FIG. 6*r* looking in the direction of arrows A of FIG. 6*r*.
Figure 6T:
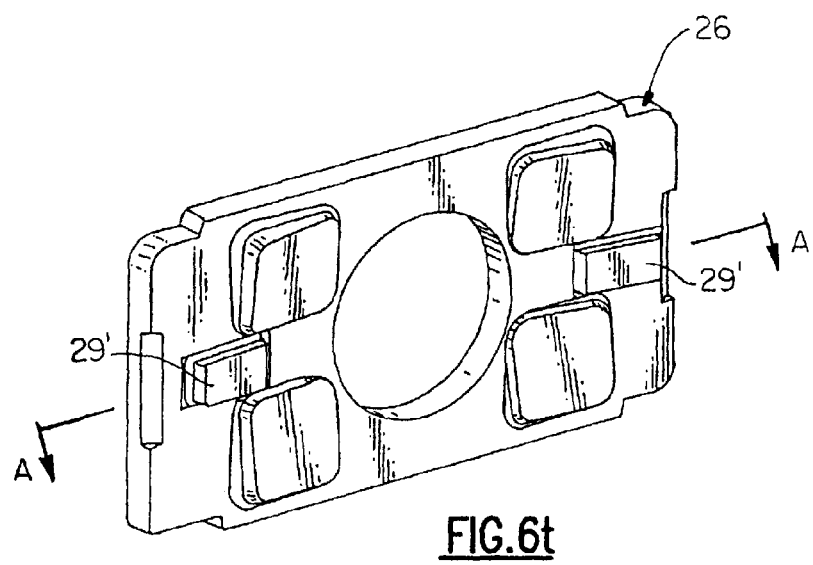
FIG. 6*t* is a rear perspective view of another optical plate according to the invention adapted for generating a split line aiming pattern.
Figure 6U:
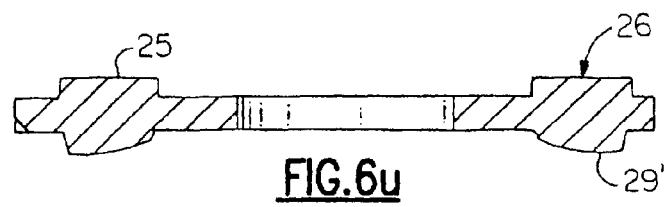
FIG. 6*u* is a top cutaway view of the optical plate of FIG. 6*t* looking in the direction of arrows A of FIG. 6*t*.

In the embodiment of FIG. 6u optical plate 26 includes imaging optics 29' on a light entry surface thereof for restricting a width of aiming pattern line segment 648. It may also be desirable to include diffusers 27 on plate 26 in the optical path of light emitted by aiming light sources 18 for the purpose of homogenizing aiming light. It may be desirable, for example, to homogenize light emitted from aiming light sources 18 in a horizontal plane. FIGS. 6v, 6w, and 6x show cutaway top views of various optical plates 26 taken along a row of aiming light sources 18. Optical plates 26 shown in FIGS. 6v, 6w, and 6x may represent optical plates of e.g. module 10-1, module 10-9, or module 10-22. In the example of FIG. 6v optical plate 26 includes diffractive optic diffusers 27a for homogenizing aimer pattern light in a horizontal plane. In the example of FIG. 6w, optical plate 26 includes refractive optic vertically oriented cylindrical microlens diffusers 27b for homogenizing aiming light in a horizontal plane. In the example of FIG. 6x, optical plate includes vertically oriented cylindrical negative lenses 27c for homogenizing light in a horizontal plane.

While aiming optics 25 have been described herein as being positioned on a light exit surface of optical plate 26 and aiming diffusers 27 have been described as being formed on light entry surfaces of optical plate 26, aiming optics 25 could be formed on a light entry surface and any one of aiming diffusers 27a, 27b, and 27c could be formed on a light exit surface of optical plate 26. Furthermore, more than one aiming system optical element could be formed on a single surface. A vertically oriented cylindrical microlens diffuser 27b could be integrated into a cylindrical lens 25c of a plate light exit surface for example.

A description of how, in one embodiment, an aiming pattern generation system comprising an aiming light source 18, an aperture 43, and optics 25 (e.g. a cylindrical or spherical lens) can generate a sharp, crisp aiming line at a wide range of module-to-target distances (reader-to-target distances when module 10 is integrated in a reader) is provided with reference to FIG. 6y. In the imaging module side view of FIG. 6y, imaging lens 25 having focal point 668 projects an optimally focused image of aperture 43 at image plane 669. Light rays 670, 671, 672, and 673 are light rays drawn to indicate the location of image plane 669 and the size of the aperture image at image plane 669. Light rays 674, 675, 676, and 677 are limit rays for the system of FIG. 6y, as are defined by an aperture stop function provided by lens 25. It is seen that at reading distance 678, an optimally focused image of aperture 43, and therefore a crisp, sharp aiming pattern e.g. aiming pattern 630 is projected on target T. At near reading distances e.g. distance 679, a less than optimally focused image of aperture 43 is imaged onto target T. Nevertheless, the projected image is crisply and sharply defined because substantially no light emanating from aperture 43 can reach locations beyond the boundaries delimited by limit rays 674 and 675. At far reading distances e.g. distance 680 a less than optimally focused image of aperture 43 is also imaged onto target T. Nevertheless, the far field projected image of aperture 43 is sharply and crisply defined since substantially no light emanating from aperture 43 can reach positions outside of the boundary defined by limit rays 676 and 677. It can be seen from observation that a height dimension of aiming pattern e.g. 630 can be controlled by controlling the height dimension of lens 25. A thinner aiming line can be produced by decreasing the height dimension of lens 25. Further, the crispness and sharpness of an aiming pattern e.g. aiming pattern 630 can be improved by providing a sharply defined opaque aperture stop member or members about the borders of lens 25. Opaque aperture stop members 681 as shown in FIG. 2n (module 10-9) and in FIG. 6m (module 10-22) and FIG. 1m (module 10-1) can be provided by a sharp edged mechanical member attached, adhered or otherwise affixed to lens 25 or else may comprise a material which is sprayed on, painted on, or other deposited on a surface of lens 25.

Another aiming system which results in a crisp, sharply defined aiming pattern being projected over a wide range of module-to-target distances is described with reference to Example 1. In Example 1, an aperture aiming system is provided having a very small aperture height of less than 1.0 mm. A size of aperture 43 can readily be reduced in a 2D imaging module embodiment having separate illumination light sources without compromising image capturing performance in that aiming illumination does not need to be utilized in the generation of image data as it is in many 1D imaging modules. The aiming system described in Example 1 is well suited for incorporation into e.g. module 10-1 shown in FIG. 1a.

EXAMPLE 1

An aiming pattern generation system 685 comprising a pair of aiming LEDs 18, a pair of apertures 43, and a pair of spherical lens 25s substantially as shown in FIG. 1h is designed such that each half of the aiming pattern generating system has the properties as presented in Table 1.

TABLE 1

| | |
|---|---|
| Aperture size: | 1.85 mm (W) .times. 0.3 mm (H) |
| LED (18): | Agilent Subminiature HLMP QM00 (690 mcd) |
| PCB (14a) to aperture (entry surface) distance: | 1.07 mm |
| Aperture to lens member light entry surface distance: | 4.1 mm |
| Lens thickness: | 1.7 mm |
| Back focal length: | 5.16 mm |
| Front focal length: | 5.16 mm |
| Lens (25s) radius of curvature: | r2 = −3 mm |
| Lens material: | Polycarbonate |
| Paraxial magnification: | −1.028 |

Figure 6Z:
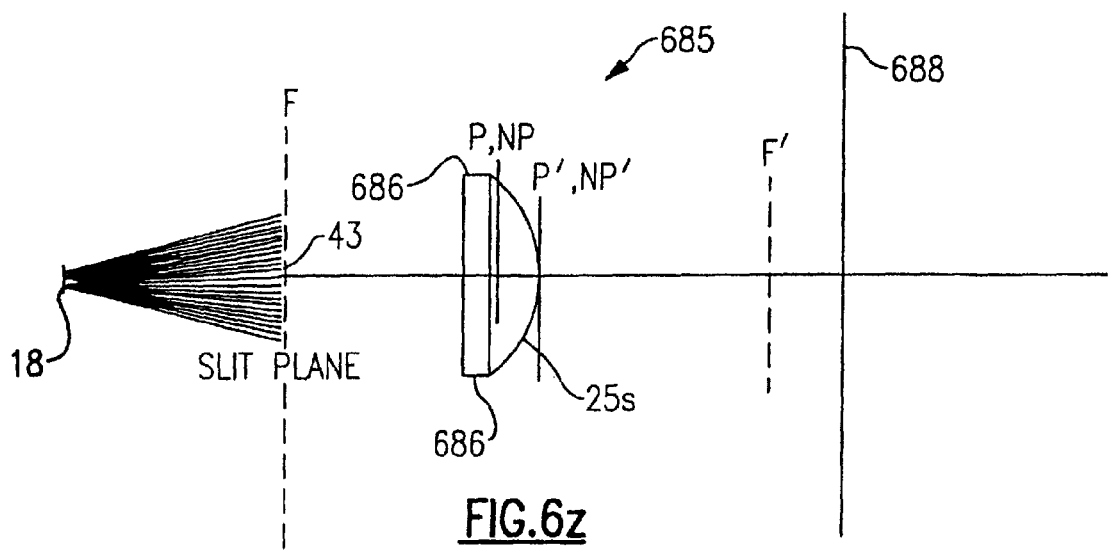
FIG. 6*z* is a side view light ray diagram corresponding to an aiming system of the invention having a thin aperture.
Figure 7A:
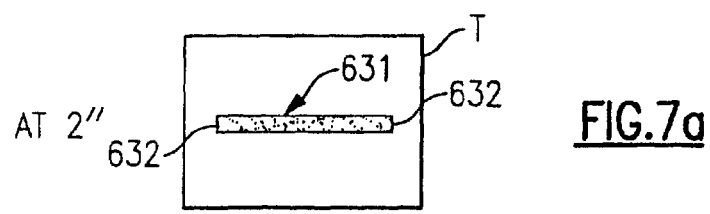
FIGS. 7*a*-7*d* illustrate an aiming pattern projected by the aiming system described in connection with FIG. 6*z* at various module to target distances.
Figure 7B:
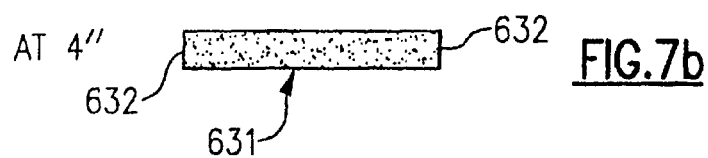
Figure 7C:
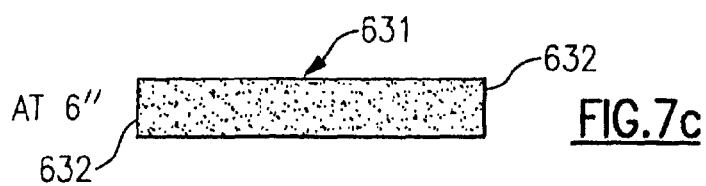
Figure 7D:
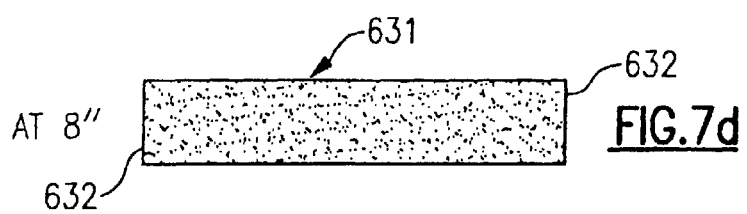

Aiming system 685 generates aiming pattern light rays substantially as is illustrated in the computer modeled side view of system 685 of FIG. 6z. It is seen that the small size of aperture 43 substantially prevents light rays from reaching borders 686 of lens 25s in the vertical plane (aiming light rays may reach borders 686 in the horizontal plane, thus the lens aperture effect described with reference to FIG. 6y may apply in the horizontal plane). Instead the bundle of light rays emanating from aperture 43 are substantially concentrated so that they are incident on the lens member including lens surface 25s toward a center (axis) of the lens member in the vertical plane. Although an imaging plane for the system described (at which an image of the aperture is optimally focused onto a target T) was determined empirically to be defined substantially on the order of millimeters from lens 25s, an aiming pattern imaged onto a target T far distances substantially away from the distance of optimal focus (such as beyond 7 inches) was nevertheless observed to be sharp and crisp and substantially narrow although substantially thicker than at shorter reading distances. Light rays exiting lens 25s were observed to gradually diverge in the vertical plane (on the order of about 2 degrees) at distances beyond empirically estimated image plane 688. Accordingly, because of the gradual divergence of light rays exiting lens 25s, a height dimension (thickness) of the pattern imaged onto a target remained substantially narrow and within the field of view of image sensor 32 at longer module-to-target distances away from the distance of optimal focus, and was observed to be crisply defined, corresponding to the shape of aperture 43 at longer distances (over 7 in.). The gradual divergence of light rays was believed to be the result of light entry light rays being substantially concentrated toward a center (axis) of the lens member including lens 25, and possibly, diffractive optic properties attributable to the small height dimension of aperture 43.

In Table 2, characteristics of an aiming pattern generated by system 685 at various module to target distances are summarized.

TABLE 2

| Module to Target Distance | Height (mm) | Width (mm) | Height Angle (deg.) | Width Angle (deg.) | Field of View |
|---|---|---|---|---|---|
| 2" (50.8 mm) | 3 mm | 30 mm | 1.69 | 16.4 | 37 mm × 28 mm |
| 4" (101.6 mm) | 6 mm | 44 mm | 1.69 | 12.2 | 64 mm × 48 mm |
| 6" (152.4 mm) | 9.5 mm | 59 mm | 1.79 | 10.9 | 95 mm × 71 mm |
| 8" (203.2 mm) | 13 mm | 72 mm | 1.83 | 10.0 | 120 mm × 90 mm |

The projected aiming pattern at various distances characterized in table 2 are illustrated as shown in FIGS. 7a-7d. The shape of the aiming pattern was observed to be a sharply defined rectangle. The projected aiming pattern, at the various distances exhibited a sharpness substantially as depicted in FIGS. 7a through 7d. Importantly, aiming pattern 631 projected by system 685 exhibits sharply defined lateral edges 632. Further, sharply defined lateral edges 632 of pattern 631 are always, in the system described at the distances considered projected within a field of view of image sensor 32 as delimited by T and as presented in Table 2. Aiming pattern 631 is preferably projected so that sharply projected edges 632 are projected just within (as shown), on, or just outside of a field of view of image sensor corresponding to a target area, T. Configuring system 685 to project an aiming pattern 631 having sharp lateral edges 632 proximate a lateral boundary of a field of view results in an aiming pattern that is useful in aiding the lateral centering of a field of view of module 10 on a target indicia. The selection of spherical lens 25s which operates to image light rays in both a horizontal and vertical planes, results in sharp lateral edges 632 of aiming pattern 631 being defined. Aiming system 685 may be used in combination with a receive optical system having a best receive focus distance of about 7 inches incorporated in an imaging module configured in read common types of decodable dataforms in a reading range of from less than about 1 inch to greater than about 15 inches.

D. Illumination Device Architectures

Referring again to module 10-2 shown in FIG. 2a module 10-2 includes surface integrated illumination LEDs 16 and surface integrated target LEDs 18. Surface integrated LEDs are LEDs of a type having a die placed directly on a printed circuit board. In the embodiment of module 10-2 printed circuit board 14b carries four illumination LEDs 16 and a pair of aiming LEDs 18. Referring to FIGS. 8a-8b illumination LED dies 16d working in combination with illumination optics 16p flood a target area with substantially uniform illumination. Target LED dies 18d together with targeting optics, 43 and 18p project an aiming pattern into a target area, T. As explained in copending U.S. patent application Ser. No. 09/802,579 (now U.S. Pat. No. 6,601,768) filed Mar. 8, 2001 entitled "Imaging Module for Optical Reader Comprising Refractive Diffuser" incorporated by reference, the aiming pattern projected by target LEDs and their associated optics may comprise, for example, a straight line, a split line, or a geometric shape.

Further details of surface integrated LEDs are described with reference to cross sectional diagram of FIG. 8a and the exploded top view of FIG. 8b. Referring to the cross sectional view of FIG. 8a surface integrated LEDs 16 and 18 are integrated in a printed circuit board assembly comprising a printed circuit board substrate 14s, an epoxy layer 14e, and lenses 16p and 18p disposed over epoxy layer 14e in opposing relation relative to LED dies 16d and 18d, respectively. It is known that an epoxy layer 14e of a surface integrated LED is semitransparent. Surface integrated LED circuit board 14s is second circuit board 14b of module 10-2 and first circuit board 14a of module 10-3. Dies 16d and 18d have associated therewith wire bonds 16w and 18w which allow electrical current to be circulated through dies 16d and 18d. Accordingly, in the embodiment shown, illumination LEDs 16 have a single or multiple LED die 16d per LED and aiming LEDs 18 include a single LED die 18d per LED. LED dies 16d, 18d are disposed in reflector cups 14r formed in surface of PCB substrate 14s. Reflector cups 14r may be manufactured by machining away the cup section 14r from PCB 14a. Surface 14c of each reflector cup 14r is coated with a reflective material such as gold, silver, aluminum, etc.

After LED dies are deposited in reflector cups 14r, an epoxy layer 14e is layered over PCB substrate 14s. Lenses 16p and 18p are simultaneously formed over epoxy layer 14e in opposing relation relative to cups 14r. In the embodiment shown, illumination LED lens 16p preferably includes diverging optics (and therefore is also labeled element 27) for diverging light rays from illumination LED dies 16d into a target space in a substantially uniform pattern. Lens 18p preferably includes converging optics for converging light rays from light emanating from LED die 18d and therefore is also labeled element 25. The edges 16e and 18e of lenses 16p and 18p are shown in FIG. 1f. In one embodiment a slit aperture as indicated by dashed line 43, may be disposed in association with LED die 18d and lens 18p so that lens 18p images aperture 43 onto a target defined by a field of view of image sensor 32. Slit aperture 43 may be embedded in epoxy layer 14e as indicated by dashed-in aperture slit 43 of FIG. 1e or else slit aperture 43 may be formed above or below epoxy layer 14e. Reflector cups 14r may have index matching epoxy disposed therein. The epoxy may also have titanium oxide added thereto as a dispersal material to aid diffusion.

Figure 7E:
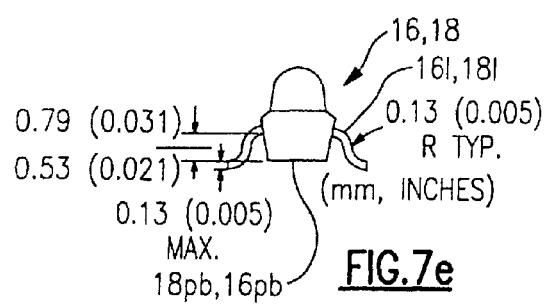
FIG. 7*e* illustrates a side view of a side-leaded surface-mounted LED which may be incorporated in a module according to the invention.

In module 10-1, as best seen in FIG. 1h, aimer LEDs 18 and illumination LEDs 16 are provided by side-leaded surface mounted back benched LEDs as are illustrated by the exploded side view as shown in FIG. 7e. Side-leaded surface-mounted LEDs, like traditional leaded LEDs have leads 18L extending therefrom but unlike traditional leaded LEDs the leads 18L extend from the sides of LED 16, 18. The side extending leads 18L are sometimes referred to as "gull wings." Side leaded surface mounted LEDs further have substantially planar back surfaces 18pb as depicted in FIG. 7e. Back surface 18pb can be manufactured to be substantially planar since back surface 18b is devoid of bottom-extending leads as in a traditional leaded LED. Planar, leadless back surface 18pb allows LEDs 18 to be readily back benched against PCB 14b or another planar member, thereby allowing LEDs 18 to be readily installed at a precise orientation (in module 10-1, a normal angle orientation). Further, the mounting of side-leaded LEDs is uncomplicated, since there is no need, as in a traditional leaded LED to solder the LED on a side of a printed circuit board opposite the side on which it is benched. Importantly, side leads 18L of a side-leaded surface mount LED, unlike solder tabs of traditional surface mount LEDs can readily be soldered to a printed circuit board without altering a precise right angle orientation of the LED as is controlled by the back benching of the LED on circuit board. As shown in FIG. 1h, side leaded illumination LEDs 16 mounted so that LEDs 18L are at angles relative to an X and Y axis. Mounting LEDs 16 at angles provides substantial spacing between LEDs 16L and post 84, which is typically conductive.

It will be appreciated that a precise angular orientation of LEDs relative to the Z axis shown in FIG. 1h is highly important in many embodiments described herein. Precise angular orientation of LED 16,18 relative to the Z axis is achieved by back benching of a side-leaded surface mount LED against circuit board 14a, 14b. Tight back mounting of LEDs also reduced a Z direction space consumed by LEDs 16, 18. Further, use of side-leaded surface mount LEDs eliminates the need for extraneous alignment members or extraneous LED alignment steps in the assembly process.

One example of a side leaded surface mount LED which may be utilized with the invention is the HLMX "Subminiature High Performance AlInGaP" series LED manufactured by Agilent Technologies, Inc. of Palo Alto, Calif. Flat top HLMX-PXXX Agilent lamps have wide radiation patterns and therefore are more useful, in certain applications when employed as illumination LEDs 16. Domed HLMX-QXXX Agilent lamps have more narrow radiation patterns and therefore, in certain applications are more useful when employed as aiming LEDs 18. In certain applications, both aiming and illumination LEDs 16,18 are provided by domed HLMX QXXX lamps.

Figure 4A:
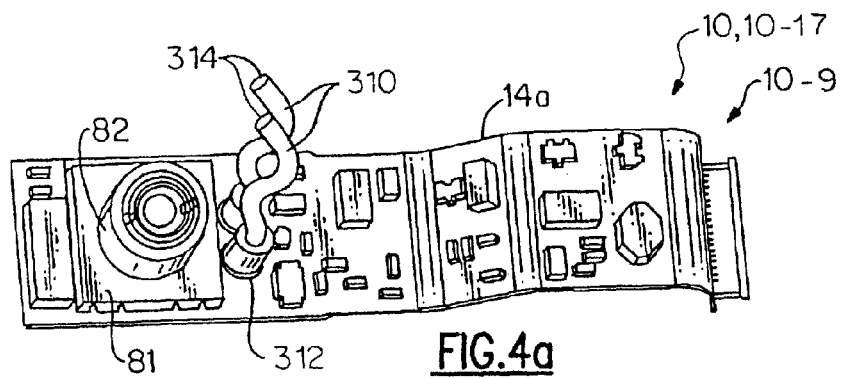
FIGS. 4*a*, 4*b*, and 4*d* are perspective views of an imaging module according to the invention including a flexible circuit board and light pipes for directing light toward a target area.
Figure 4B:
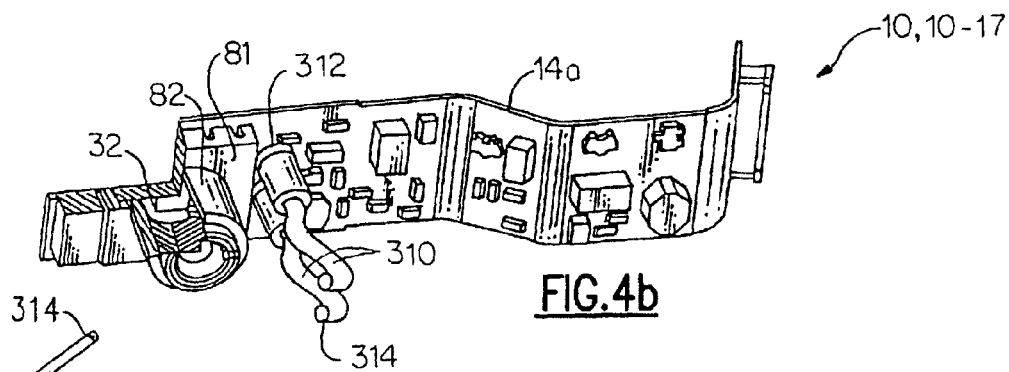
Figures 4C, 4F:
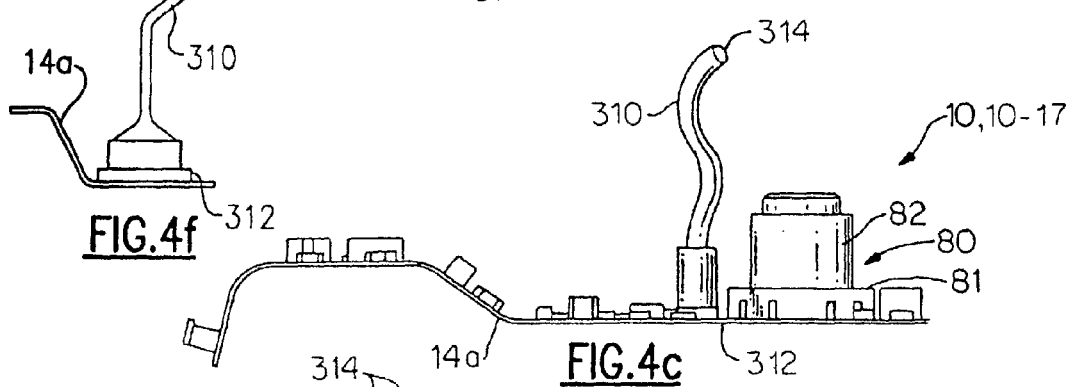
FIG. 4*c* is a side view of the module shown in FIG. 4*a*.
FIGS. 4*e* and 4*f* are partial side views of an imaging module including bendable light pipe illumination.
Figure 4D:
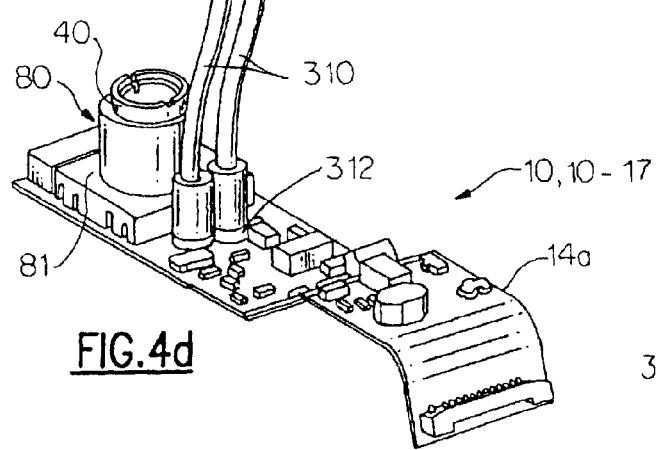
Figure 4E:
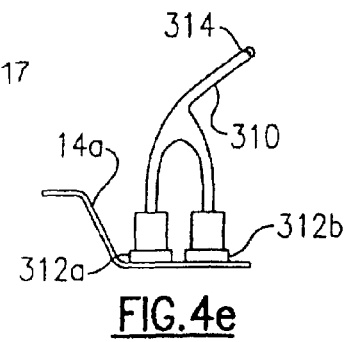
Figure 4G:
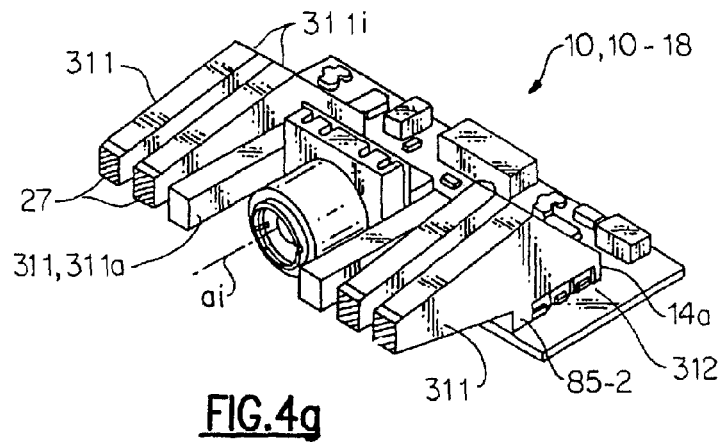
FIGS. 4*g*, 4*h*, and 4*i* are perspective, front, and side cutaway views of an imaging module according to the invention including molded light pipes.
Figures 4H, 4I:
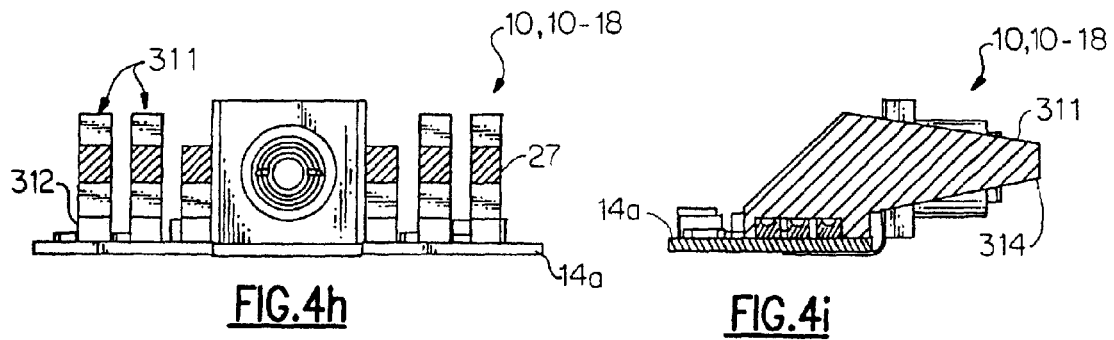
Figure 4J:
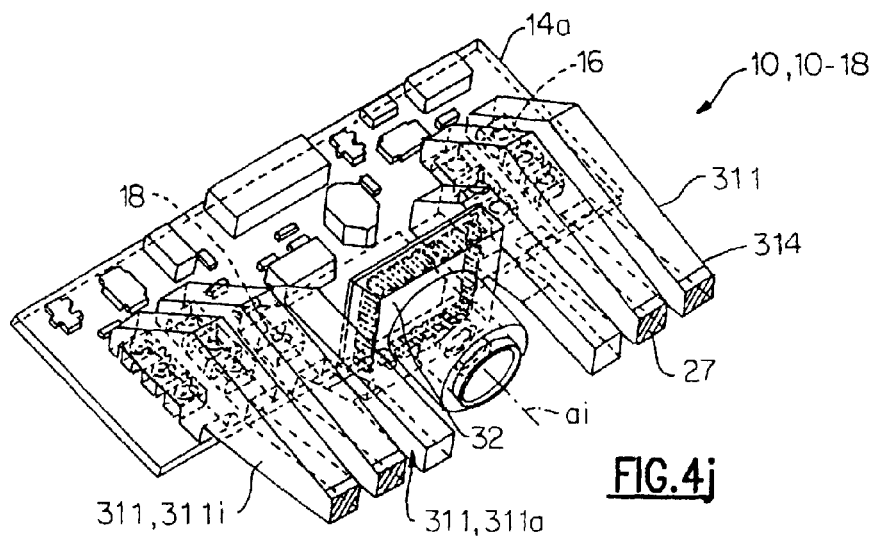
FIG. 4*j* is a perspective view of the module of FIG. 4*g* having dashed in lines indicate structure hidden from view.

Variations of molded light pipe and LED assemblies described with reference to FIGS. 4a-4n are now described in greater detail with reference to FIGS. 8c, 8d, and 8e. In the embodiment of FIG. 8c light pipe and light source assembly 370 includes a single surface mount LED package 92-1 mounted to PCB 14 (e.g. 14a, 14b). LED 92-1 includes a single LED die. Further with reference to the embodiment of FIG. 8c light pipe 311 is manufactured and mounted so that primary light refractive surface 376 of light pipe 311 forms a constant substantially 45 degree angle with PCB 14.

Figure 8V:
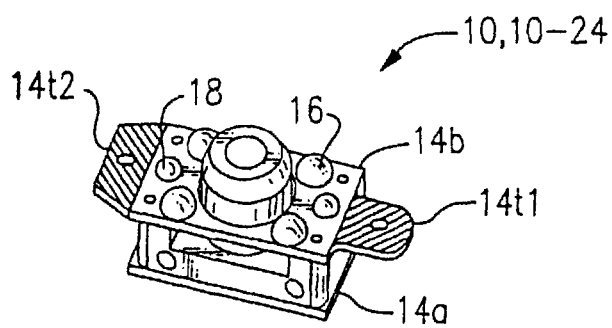
FIG. 8*v* is a perspective view of an imaging module according to the invention having heat sink tabs.
Figure 8W:
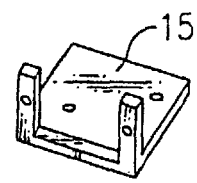
FIG. 8*x* is a side view of an imaging module of the invention having heat sink tabs and FIG. 8*w* shows a heat sink structure for use in association with an imaging module according to the invention.
Figure 8X:
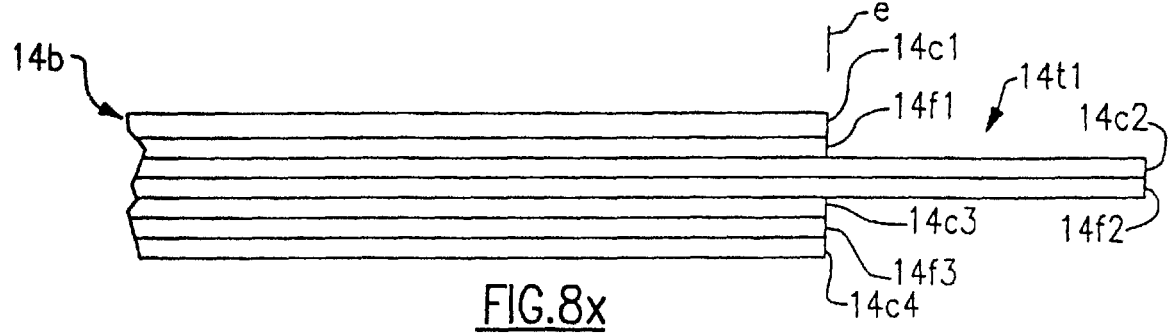
Figure 8S:
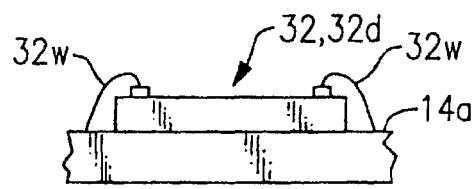
FIGS. 8*s* and 8*t* are side views of an unpackaged image sensor according to the invention, as mounted on a printed circuit board.
Figure 8T:
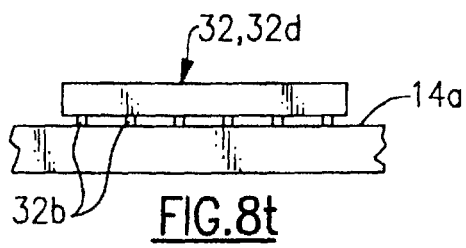
Figure 8C:
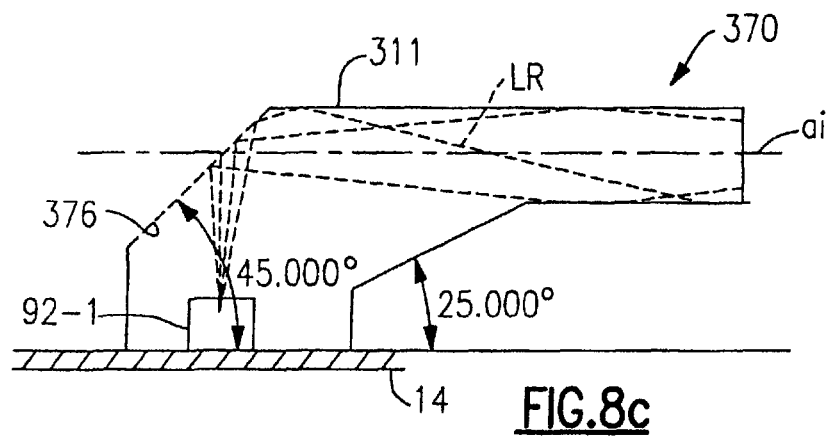
FIGS. 8*c*, 8*d*, and 8*e* show side schematic use of various light pipe aiming and illumination configurations which may be incorporated in a module of the invention.
Figure 8D:
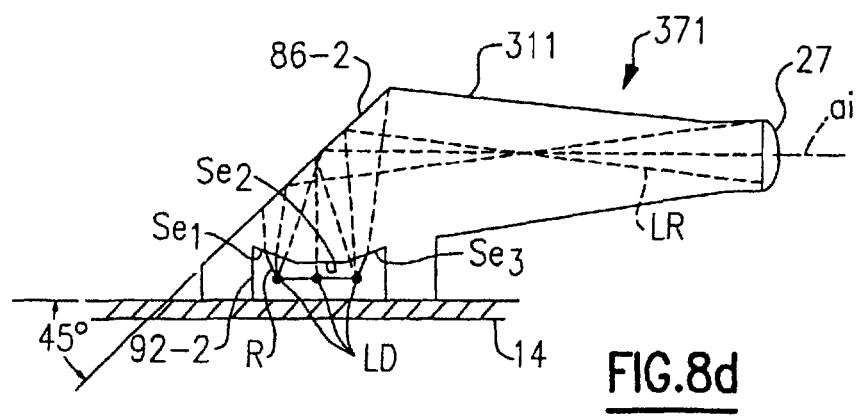

In the embodiment of FIG. 8d light pipe and light source assembly 371 includes a multiple lead frame surface mount package 92-2. LED 92-2 has three LED dies LD mounted therein and a single Bragg reflector R. Disposing multiple LED dies LD in a LED package having a single Bragg reflector R reduces the size of the surface mount LED package. Further with reference to the embodiment of FIG. 8d the light entry surface of light pipe 311 are separated into three sections $se.su_1$, $se.su_2$, and $se.su_3$, each corresponding to one of the LED dies LD. Each light entry surface $se.su_1$, $se.su_2$, and $se.su_3$ forms a different angle with PCB 14 so as to optimize the efficiency of light transmission through light pipe for each of the LED dies LD. A diffuser 27 can be molded onto distal end of light pipe 311. Diffuser 27 diffuses light from light pipe 311 and further reduces fresnel losses.

Figure 8E:
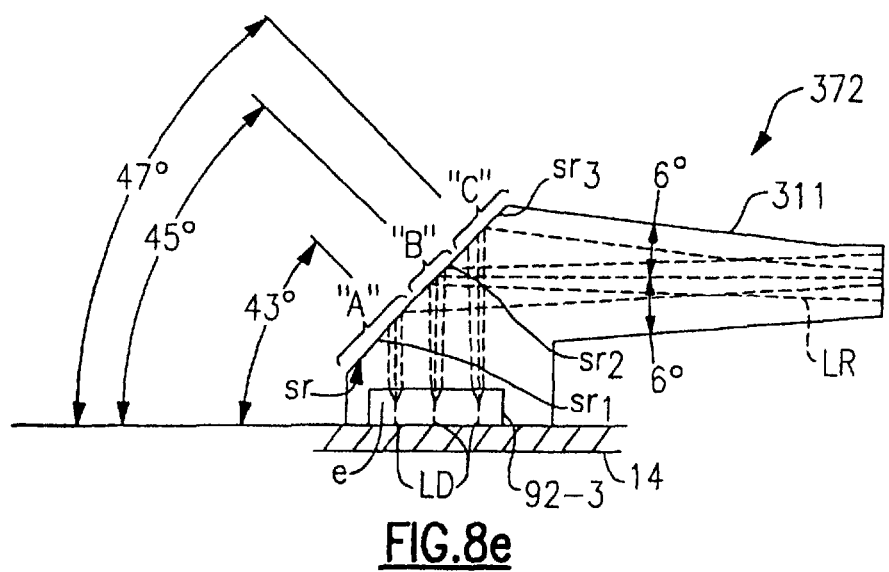

In the embodiment of FIG. 8e light pipe and light source assembly 372 includes a LED having three LED dies LD, each formed by mounting a light emitting die on PCB 14 directly, and disposing $epoxy_e$ over the assembly of PCB mounted dies. Direct mounting of LED dies LD onto PCB 14 reduces the size of LED package 92-3. Further, referring to the embodiment of FIG. 8e the primary light reflective surface $s_r$ of assembly 372 is divided into three sections $sr.sub_1$, $sr.sub_2$, and $sr.sub_3$ each corresponding to a different one of the LED dies LD. Each section $sr.sub_1$, $sr.sub_2$, and $sr.sub_3$ of light reflective curved surface $s_r$ forms a different angle with PCB 14 so as to optimize the efficiency of light transmission through light pipe 86-2 for each of the LED dies LD. For reducing fresnel losses in system 372, the index of refraction, $N.sub_e$, of $epoxy_e$ can be selected to substantially match the index of refraction, $N.su_p$, of molded light pipe 311.

Assembly 372 of FIG. 8e and assembly 371 of FIG. 8d illustrate two different systems for optimizing the efficiency in light transmission through a light pipe in a light pipe and source assembly having multiple dies. LEDs 92-2 and LED 92-3 are single light sources which comprise multiple dies. It will be understood that either of these systems can be employed in a light pipe and light source assembly having multiple light sources, wherein the multiple sources comprise standard surface mount LEDs having one Bragg reflector per die or standard single die leaded LEDs. Light rays LR depicted in FIGS. 8c, 8d, and 8e are shown as originating from ideal light sources LD. It is understood that actual light sources exhibit substantially greater variety in the origin and angles of the incident rays. It will be understood further that any of the LEDs, e.g. LED 16, LED 18 described herein can be provided by an LED package having multiple LED dies incorporated therein. Infineon Corp. of Munchen, Germany specializes in designing and manufacturing LEDs comprising multiple LED dies.

Figure 8F:
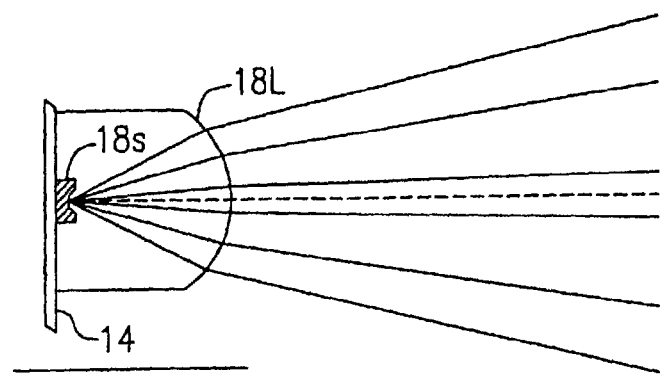
FIGS. 8*f* and 8*g* are schematic views of modified light sources which can be incorporated in an imaging module of the invention.
Figure 8G:
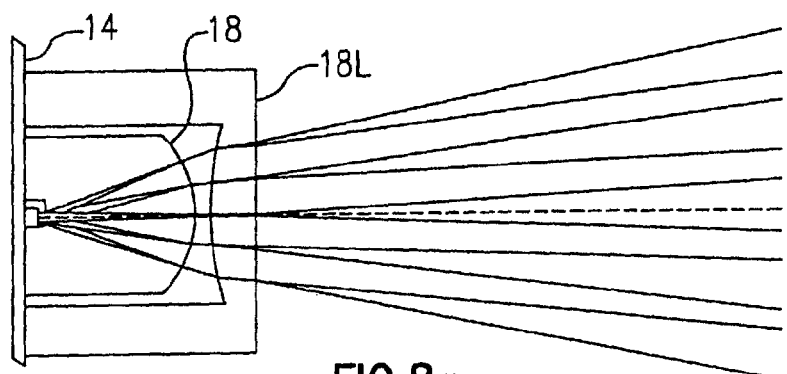

Apparatuses for increasing the efficiency of LEDs 16 and 18 are described with reference to FIGS. 8f and 8g. In the system described with reference to FIG. 8f, purchased part surface-mount LED 18, 18s is mounted to PCB 14 (e.g. PCB 14a, 14b) and clear epoxy lens 18L is molded over surface mount LED 18, 18s. The lensing provided by lens 18L reduces the amount of divergence of light emanating from the LED. In the system described with reference to FIG. 8g, leaded LED 18 is mounted to PCB 14 (e.g. 14a, 14b) and a substantially box-shaped lens cap 18c is mounted over LED 18. Lens cap 18C, like lens 18L reduces the amount of which light emanating from LED 18 diverges. Reducing the divergence of light rays emanating from an LED is particularly useful in the case where LEDS are aiming LEDs configured to be directed toward an aperture. However, some designers may place a premium on "filling" a complete aperture. The system comprising LED 18s and lens 18L may be considered generically as an LED 18. Likewise the system comprising LED 18 and lens 18L in FIG. 7m can be considered generically an LED 18.

E. Illumination/Aiming Color Emission Control and Coordination

Figure 8H:
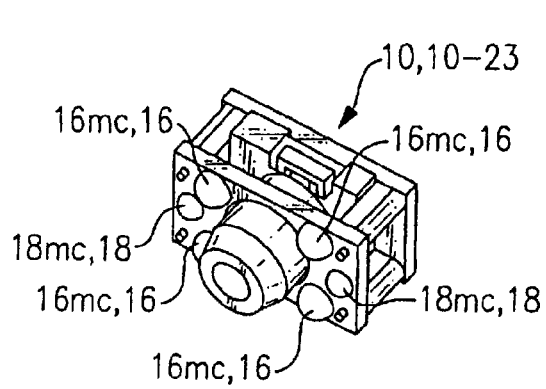
FIG. 8*h* is a perspective view of an imaging module of the invention incorporating a multiple color emitting light source.
Figure 8I:
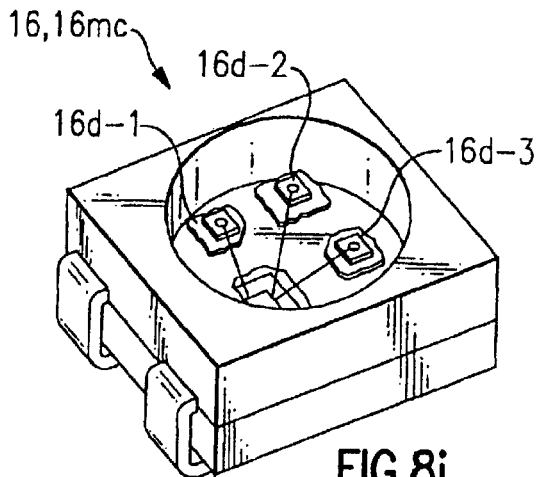
FIG. 8*i* is an exploded perspective view of a multiple color emitting light source according to the invention.

It is seen that illumination light source 16 in the embodiment of FIG. 8b includes a plurality of LED dies 16d. As shown in FIG. 8h illumination light source 16 of module 10-23 which may be incorporated in any one of reader housings 111 to define a reader 110 may be a multiple color emitting light source having multiple LED dies 16d, each being independently driveable, and each having an emission wavelength band different from the remaining LED dies. Illumination light source 16, 16MC shown in FIGS. 8h and 1z is a multiple color emitting light source having three LED dies 16d-1, 16d-2, and 16d-3. Multiple color LEDs 16mc, 18mc can be incorporated in any of the modules 10-1 to 10-22 described herein. First LED die 16d-1 is independently driveable to emit light in the blue light wavelength band; second LED die 16d-2 is independently driveable to emit light in the green light wavelength band and LED die 16d-3 is independently driveable to emit light the amber wavelength band. The set of signals presented by control circuit 140 to LED 16MC may be termed a set of LED die driver signals. Control circuit 140 can be controlled to alter the current flow to LED 16MC based on the present application of the reader 110. Multiple color emitting light sources 16 and 16MC can be, for example, a model LATB color light source of the type available from Infineon Technologies Corporation of San Jose, Calif., USA.

Different surfaces often respond differently to different types of illumination depending on their shape, color, and type of material. Control circuit 140 can be configured so that if decoding of a bar code fails using a first set of LED die driver signals, control circuit 140 automatically presents a second set of LED die driver signals to LEDs 16 and 16MC, and a third set of LED die driver signals to LEDs 16 and 16MC if a decoding fails a second time, and so on until decoding is successful. Control circuit 140 can be configured so that control circuit 140 saves the set of LED driver signals yielding a successful decode, and applies that set of driver signals to LED 16 and 16MC the next time trigger 13t is pulled to actuate decoding.

In another embodiment of the invention, reader 110 is configured so that the set of LED die driver signals presented by control circuit 140 to LEDs 16mc is selectable by an operator so that the color emitted by LED dies 16d-1, 16d-2, and 16d-3 in combination is optimized for the application in which reader is presently being employed. For example, if reader 110 is to be used to decode bar codes formed on a certain metallic surface, an operator may configure reader 110 so that control circuit 140 presents to LED 16MC a set of LED driver signals that have previously been determined to be well-suited for use in capturing images formed the certain on metallic surfaces. An operator may also wish to change the color emitted by LEDs depending on the colors present in a target area comprising an indicia. For example, if a target area comprises red indicia formed on a white background, an operator may configure control circuit 140 e.g. via selection of a menu option so that control circuit 140 presents a set of LED die driver signals operative to result in LEDs emitting white light, which will optimize contrast in a captured frame of image data in the case comprises red indicia formed on white substrate.

Reader 110 can be configured so that selection of a particular one or more control buttons of keyboard 13k in response to display of certain indicia of display 14d results in a certain set of LED die driver signals being presented by control circuit 140 to multiple color emitting LED 16 and 16MC. Reader 110 can also be configured so that reading of a certain type of "menu symbol" as will be described in greater detail herein results in a certain set of LED die driver signals being presented to multiple color emitting LED 16.

Reader 110 can also be configured so that the set of LED driver signals presented to LED 16MC changes automatically in response to a sensed condition sensed by reader 110, such as a sensed condition relating to ambient light, the colors of indicia present in a target, the material conditions of a target, the reader-to-target distance, the level of focus of an image, the shape or surface characteristic of a target, for example. Reader 110 can automatically sense ambient light conditions by analysis of a captured frame of image data without any reader driven illumination. Reader 110 can determine reflectivity conditions of a target by analysis of a captured frame of image data captured under known illumination conditions. Various automatic range determination and focus level detection methods are known by skilled artisans. As is well known, the reader-to-target distance of a reader can be detected by angularly directing a spot of light at a target from a reader housing and estimating the reader-to-target distance based on the position of the spot in a captured image. The degree of focus of an image can be detected by several methods including the method described in commonly assigned U.S. Pat. No. 5,773,810, issued Jun. 30, 1998 incorporated herein by reference. Reader 110 can be configured so that the color emitted by illumination LEDs 16MC and/or aiming LEDs 18MC changes depending the reader-to-target distance or degree of focus of an image. For example, control circuit 140 may control LEDS 16MC to (and/or 18MC) automatically emit red light (indicating "TOO HOT" condition) if the reader-to-target distance is less than a desired minimum reader-to-target distance control circuit 140 may control LEDs 16MC (and/or 18MC) to automatically emit white light if the reader-to-target distance is within a range of acceptable distances, and may control LEDs 16MC (and/or 18MC) to automatically emit blue light (indicating a "TOO COLD" condition) if the reader-to-target distance is greater than a desired maximum reader-to-target distance. Similarly control circuit 140 may control LEDs 16MC (and/or 18MC) to automatically emit, e.g. blue light if the most recent captured image is exhibiting an unacceptable degree of focus, and to control LEDs 16MC (and/or 18MC) to automatically emit, e.g. white light if a most recently captured image exhibits an acceptable degree of focus.

The presence or absence of a certain color present in a target area can readily be detected for by employing in reader 10 a color image sensor, activating an appropriate color filter correlated with the color being detected for, and analyzing image signals generated by the color image sensor. Advantages and benefits of utilization of a color image sensor in reader 110 are discussed more fully in U.S. patent application Ser. No. 09/904,697 (now U.S. Pat. No. 6,722,569) entitled "An Optical Reader Having a Color Imager" filed Jul. 13, 2001, incorporated herein in its entirety by reference.

The variable emission color features described herein can be yielded by providing different colored monochrome light sources rather than multicolor light sources. For example an illumination system can comprise a bank of monochrome red LEDs and a bank of monochrome blue LEDs. Control circuit 140 can change to color of illumination of an illumination target from red to blue by deactivating the bank of red LEDs and activating the bank of monochrome blue LEDs.

Multiple color emitting LED dies also can be utilized as aiming illumination LEDs as is indicated by aiming LEDs 18MC shown in FIG. 1r. Control circuit 140 can present different to multicolor aimer LED illumination source 18MC different sets of LED driver signals depending on the mode of operation of reader 110. For example, if reader 110 is operating in a decoding attempt mode, control circuit 140 may present to multicolor aimer LED 18MC a set of LED driver signals which result in green light being radiated from aimer LED 18MC. If reader 110 successfully decodes a bar code, control circuit 140 may present a set of LED driver signals to multicolor LED 18MC which result in multicolor aimer LED 18MC radiating red light. That is, control circuit 140 may generate a good read indicator by causing the color of illumination radiating from aimer illumination LEDs 18MC to change from a first color to a second color when there has been a successful decode of a bar code or character control circuit 140 can also indicate a successful read, or another change in operating state by changing the set of LED driver signals that are presented to illumination LEDs 16MC when a bar code or character has been successfully decoded.

The contrast between aiming illumination pattern 630 and background illumination pattern 520 can be enhanced by selecting aiming light sources 18 so that aiming light sources radiate light of a color different than illumination light sources 16.

In one embodiment of the invention, illumination LEDs 16 of e.g. module 10-1 comprise red light LEDs and aiming LEDs comprise green light LEDs or blue light LEDs. Selecting aiming LEDs to project light of a color different than illumination LEDs results in an aiming pattern 74 being projected onto a target T in a color different than that of background pattern 74 which enhances an operator's ability to perceive an aiming pattern relative to an illumination pattern. If aiming light sources 18 and illumination sources 16 are selected to emit light at different colors the received light reflected from target can be filtered so that light from only one of the different colors is received by image sensor. FIG. 6m shows a color filter 450 incorporated in an ID image module 10-22. FIG. 3g shows a color filter 450 incorporated in 2D imaging module 10-11. Color filter may be a band pass filter which passes light of a wanted color or a blocking filter which blocks light of an unwanted color. With filter 450 in one application light from aiming light sources 18 can be filtered (if different in color emission than illumination sources 16), so that it is not necessary to "flicker" aiming light sources 18 or backout pattern 630 electronically.

Figure 8J:
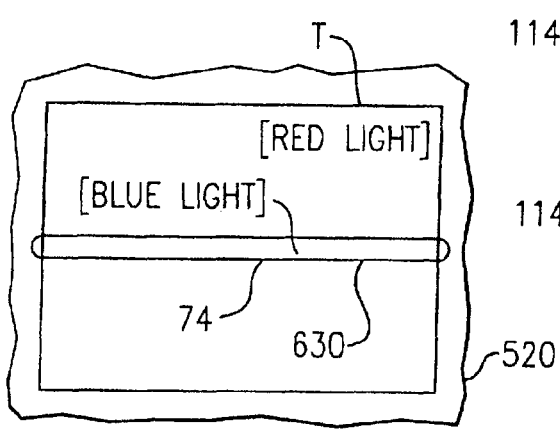
FIG. 8*j* is a diagram illustrating exemplary aiming and illumination pattern which may be projected by a module of the invention having an aiming light source and an illumination light source at different wavelength bands.

The particular combination of colors forming an aiming pattern and illumination pattern can be selected based on the expected particular application of the optical reader in which the illumination and aiming illumination light sources are to be incorporated. In standard bar code reading application in which it is expected that the reader will encounter black-on-white printed indicia, illumination LEDs 18 can be selected to emit red light and aiming illumination LEDs can be selected to emit blue light, for example, to form the contrasting illumination patterns indicated in FIG. 8j. In an application where an optical reader is expected to read fluorescent orange postnet codes, illumination LEDs 16 can be selected to emit green or blue light and aiming LEDs 18 can be selected to emit red light. In an application wherein an optical reader 10 is expected to be used to read red-on-white printed indicia, illumination LEDs 16 can be selected to emit white light and aiming LEDs 18 can be selected to emit red, green, blue, or yellow light. In an application wherein optical reader 10 will be used in a photo processing darkroom, illumination LEDs 16 can be selected to emit light in the infrared spectrum and aiming LEDs 18 can be selected to emit red, green, blue, or yellow light.

Table 3 below summarizes the above described illumination light source-aiming light source and application correlations is presented hereinbelow.

TABLE 3

| Illumination Color | Aimer Color | Possible Applications |
| --- | --- | --- |
| Red | Green or Blue | Standard bar code reading |
| Green or Blue | Red | Different color light provides better contrast on certain bar code types such as fluorescent orange Postnet codes |
| White | Red, green, blue, or yellow | Standard bar code reading, imaging of red indicia |
| IR | Red, green, blue, or yellow | Secure bar code applications, photo processing darkroom applications |
| UV | Red, green, blue, or yellow | Secure bar code applications |

Utilization of white illumination LEDs provides numerous advantages. White light is less distracting than is red light. Red light illumination patterns have been observed to cause eye strain and headaches. Furthermore, the color red indicates danger in many types of industrial applications. Thus, the use of white light avoids the problem of red illumination light being erroneously interpreted to indicate a danger condition by persons working in proximity with reader 10. Still further, use of white light illumination light sources allows red-printed indicia such as red ink signatures, red bar codes, and red "chops" as used in Asia to be imaged. Further, use of white light illumination light sources provides good contrast between an illumination pattern and an aiming pattern when aiming illumination LEDs are selected to emit light in a narrow (non-white) band.

By utilizing multiple color emitting light source LEDs 16MC and/or aiming LEDs 18MC, different combinations of contrasting illumination and aiming patterns can be realized simply by presenting different sets of LED die driver signals to aimer LEDs 18MC and illumination LEDs 16MC without physically removing and replacing the LEDS and without increasing the size of module 10 as would be necessary if different LEDs were added to module 10. Reader 110 having multiple color emitting light source illumination and aiming LEDs 16MC and 18MC can be configured so that a user can actuate control inputs to change the particular color combination defined by background pattern 72 and aimer pattern 74. The color contrast combination between an illumination pattern and aiming pattern can also be made changeable by providing in reader 110, separate banks of different-colored monochrome illumination light sources and/or aiming illumination light sources which may be selectively activated depending upon the operating mode of reader 110. However, such a solution would significantly add to the size of module 10.

Figure 8K:
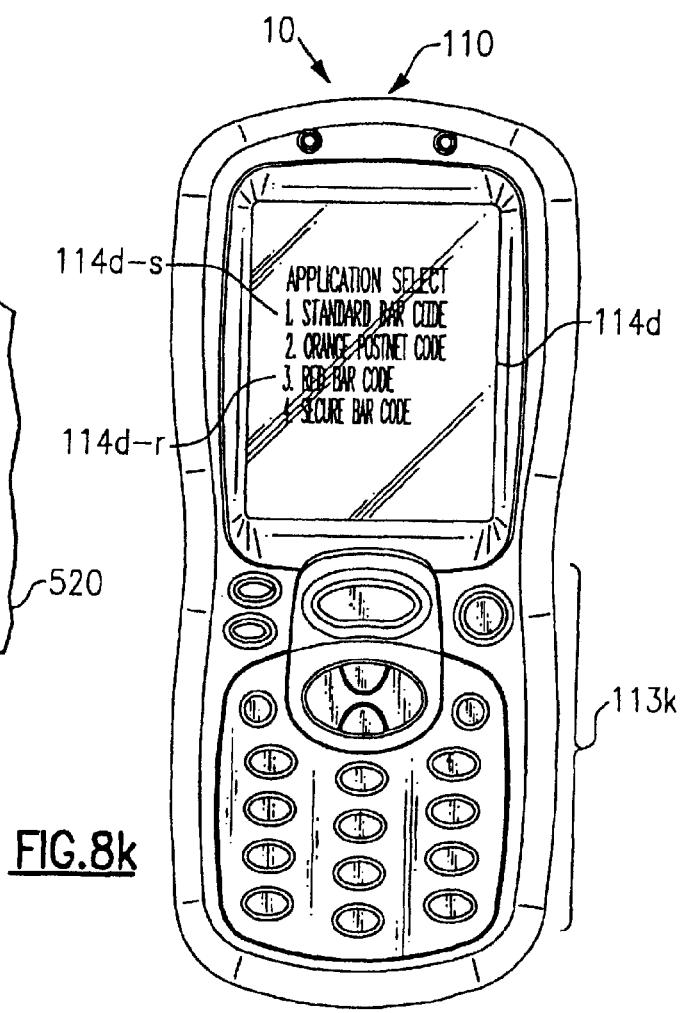
FIG. 8*k* is an optical reader, which is programmed to generate a user interactive menu screen allowing a user to change a color emission output certain of the light sources of the module.

As indicated by reader 110 of FIG. 8k control circuit 140 can be programmed to display on display 14d a set of user selectable application settings, which are selectable by one of a well know menu driver selection methods as are explained in commonly assigned U.S. patent application Ser. No. 09/858,163 (published as U.S. Patent Publication No. 2002/0171745) entitled "Multimode Image Capturing and Decoding Optical Reader" filed May 15, 2001, incorporated herein by reference. In the embodiment shown in FIG. 8k display 114d displays to a user various application settings, namely "standard bar code," "orange postnet code," "red indicia," ("red bar code" in the specific example) and "secure bar code." When one of the application menu optics is selected, control circuit 140 presents a set of LED die driver signals to LEDs 16MC and 18MC corresponding to the menu selection in accordance with the application-pattern correlations listed on Table 1. That is, if the standard bar code option is selected, control circuit 140 may present a set of LED die driver signals to LEDs 16MC and 18MC such that illumination LEDs 16MC emit red light and aimer LEDs emit blue or green light. If the "red indicia" option 14d-r is selected, control circuit 140 may present a set of LED die driver signals to LEDs 16MC and 18MC such that illumination LEDs emit white light and imager LEDs emit red light, and so on.

Reader 110 can also be configured so that the particular combination of colors projected by aiming LEDs 18MC and illumination LEDs 16MC changes automatically in response to a sensed condition.

For example, reader 110 can be configured so that if reader 110 senses the presence of red indicia in a target area in a manner described previously, control circuit 40 can present a set of LED driver signals to LEDs 16MC and 18MC such that illumination LEDs 16MC emit white light and aiming LEDs 18c emit blue light, an illumination pattern color combination that is well-suited for imaging a target and comprising red indicia.

F. Receive Optics

When the size of module 10 is reduced, the sensitivity of module 10 to changes in the distance of lens assembly 40 to image sensor 32. It is therefore advantageous to provide an arrangement between lens assembly 40, shown as a lens barrel 40 and lens retainer 82 that allows barrel 40 to be finely adjusted within retainer 82. An imaging lens incorporated in a lens assembly 40 may be, for example, a single element lens, a two element lens (a lens doublet), a three element lens (a lens triplet), a lens or lenses of assembly 40 may be made of various materials, e.g. glass, plastic.

In the prior art, lens barrels commonly comprised threads 40t on their outer surface which are received in threads 82t of retainer 82 as shown in FIG. 11. The lens-to -image sensor distance in a threaded lens barrel system is adjusted simply by threading barrel lens assembly 40 into retainer 82 until a desired lens-to-image sensor distance is achieved.

The precision with which the distance of a threaded lens barrel can be adjusted can be increased by changing the thread count of the barrel 40 and the retainer 82. However, the cost of manufacturing barrel lens assembly 40 and retainer 82 increases substantially as the thread count of the system increases.

Figure 8L:
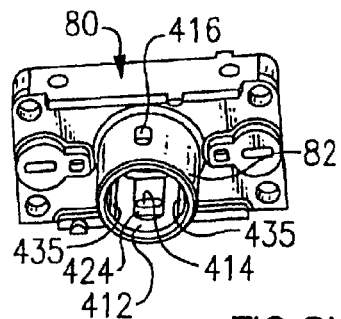
FIG. 8L is a perspective view of a support assembly including a lens assembly retainer adapted to receive a threadless lens barrel therein.

A low cost and finely adjustable barrel and lens holder system is described primarily with reference to FIGS. 8L-8r, while alternative views and/or embodiments of a lens assembly adjustment feature of the invention are shown in FIGS. 1h, 1i, 1o, 1p, 1s, and 2L. In the embodiment of FIG. 8L it is seen that both the interior surface of lens retainer 82 and exterior surface 410 of barrel 40 are threadless and substantially smooth. Barrel 40 is slidably received in retainer 82. Barrel 40 may slide on interior wall 412 of retainer 82 or else barrel 40 may slide on rails of 435. Preferably, barrel 40 and retainer 82 are manufactured to tight or extremely tight tolerances so that barrel 40 does not move substantially axially within retainer 82. In further aspects of the barrel and retainer system of FIG. 8L, lens retainer 82 comprises adhesive receipt aperture 414 and an elongated adjustment pin aperture 416 coextensive with the axis of retainer 82. Variations of aperture 414 and aperture 416 are shown throughout the views. Referring to further aspects of barrel 40, lens barrel 40 includes notch 420 which in the embodiment of FIG. 1o is formed about the circumference of barrel 40. Lens retainer 82 may further include key 424 which engages a complementarily formed key 426 of barrel 40 so that barrel 40 is received in a desired radial orientation in lens retainer 82.

Figure 8Y:
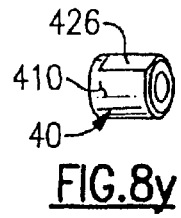
FIG. 8*y* shows a perspective view of an alternative barrel having a concave glue receiving surface.
Figure 8M:
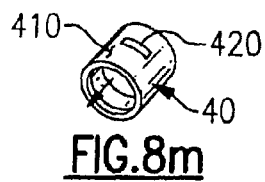
FIG. 8*m* is a top perspective view of a lens assembly lens barrel showing a pin receiving notch thereon.
Figure 8N:
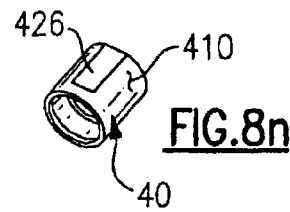
FIG. 8*n* is a bottom perspective view of the barrel shown in FIG. 8*m* showing a glue receiving surface of the barrel.
Figure 8R:
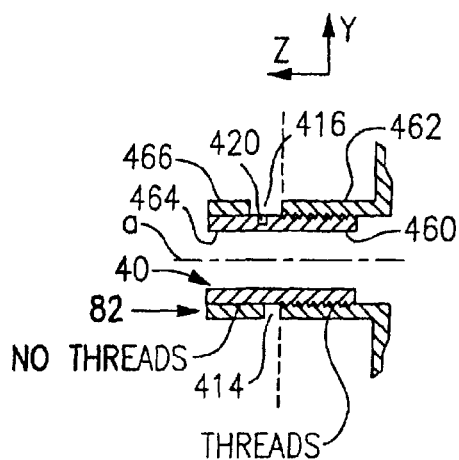
FIG. 8*r* is a side view of a lens retainer and lens system according to the invention including threads.
Figure 8O:
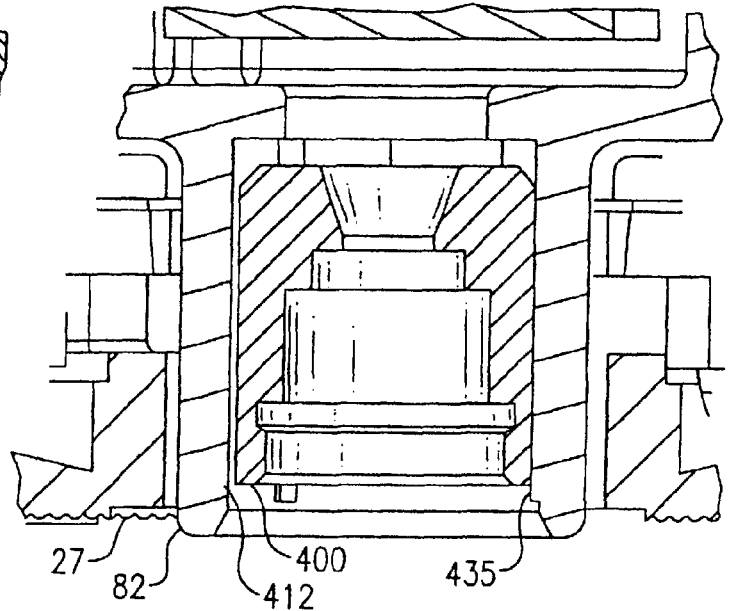
FIG. 8*o* is a cutaway top view of an imaging module of the invention showing a lens retainer and barrel detail thereof.
Figure 8P:
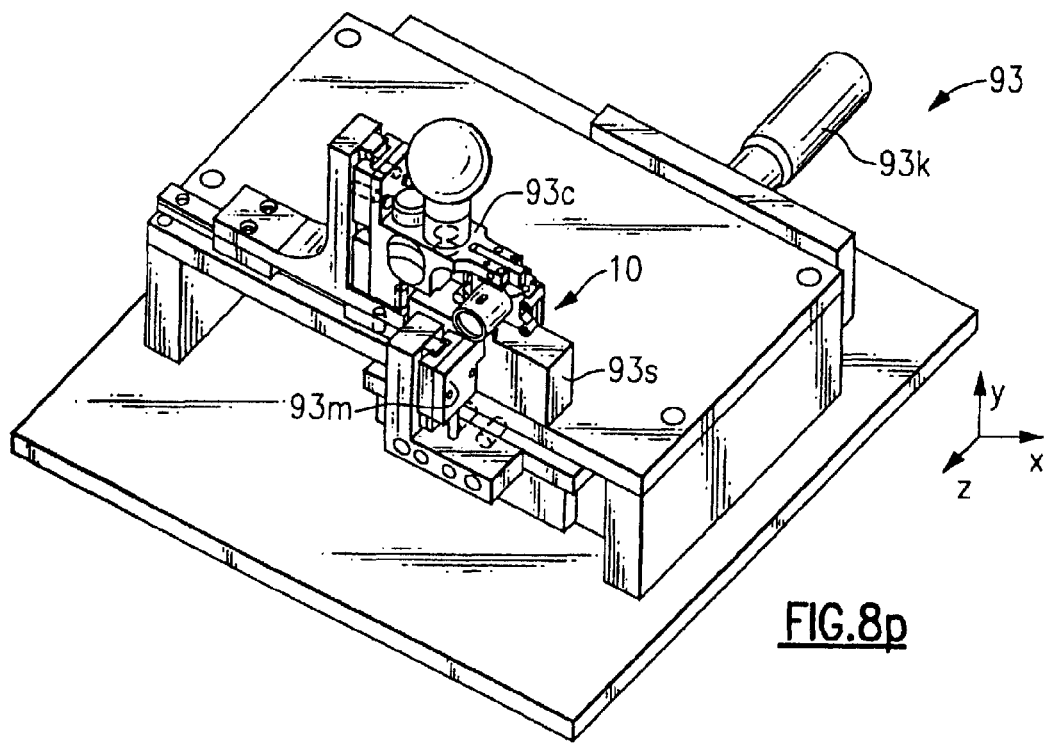
FIGS. 8*p* and 8*q* show views of a fixture which may be utilized in precision mounting of a lens assembly within a lens retainer according to the invention.
Figure 8Q:
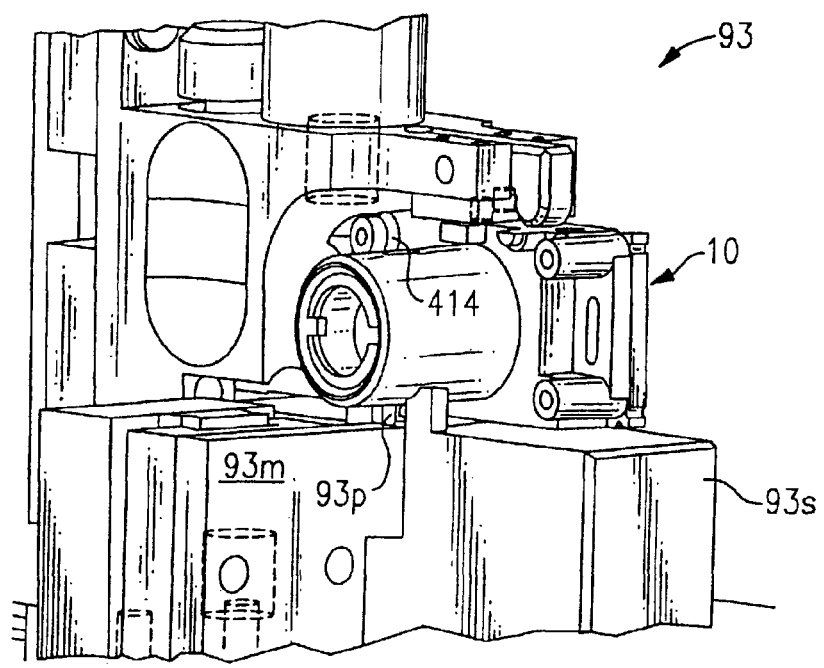

For adjusting and securing barrel 82b within retainer 82, module 10 having barrel 82b nonfixedly secured therein is disposed in a fixture 93 which may be of a type shown in FIGS. 8p and 8q. Fixture 93 may include one stationary member 93s, one moveable member 93m which is moveable in small increments relative to stationary member 93s, and a clamping device 93C which is actuatable for clamping module 10 within fixture 93. When module 10 is disposed in fixture 93, pin 93p of fixture 93 passes through elongated pin receipt aperture 416 and engages notch of barrel 82b. The lens-to image sensor distance is then finely adjusted by adjusting the position of moveable member 93m of fixture 93 relative to the position of fixed member 93s. In the fixture of FIGS. 8p and 8q, micrometer adjustment knob 93k is actuated to precision adjust the position of member 93m relative to member 93s. To aid in the adjustment of the lens-to-barrel distance, module 10 may be powered up, positioned to image a test target T, and adapted to be in communication with a display 168d (FIG. 10e) during the lens barrel adjustment assembly step. An assembler may view an image of the test target displayed on display 168d while adjusting the lens-to -image sensor distance using fixture 93, and may determine whether a desired distance is achieved based on the quality of the image displayed on display 168d. When a desired lens-to-image sensor distance is achieved, an operator disposes an adhesive in adhesive receipt aperture 414 so that the adhesive bonds lens barrel 40 to retainer 82 in a fixedly secure position. The adhesive may be e.g. a cyanocrylate based epoxy adhesive such as LOCTITE 401, LOCTITE UV 4304, LOCTITE 406, or LOCTITE 4471 all available from LOCTITE Corporation of Rocky Hill, Conn. The test pattern which is imaged by module during the lens barrel adjustment process may take on a variety of forms, but preferably comprises a plurality of fine print indicia so that the quality of focus can readily be determined by observation of the displayed image. A dollar bill, for example, may be utilized as a test target. The degree of focus can also be determined by image analysis of the image captured by processor 140 described in connection with FIGS. 10a-10e. For example, a determination of whether an acceptable degree of focus has been achieved can be made based on the value of a degree of focus signal as described in commonly assigned U.S. Pat. No. 5,773,810 incorporated herein by reference.

Referring to further aspects of a threadless barrel lens assembly adjustment system, pin receiving notch 420 formed on barrel 40 of FIG. 8m is truncated as shown and does not extend circumferentially about barrel 40. Further, adhesive receipt aperture 414 in the embodiment e.g. of FIG. 8L is formed at a location of retainer 82 defined by a flattened planar interior surface 424. Flattened planar interior surface 424 of retainer 82 operates as a key and engages complementarily formed flattened planar surface 426 of barrel 40 to align barrel 40 in a desired radial orientation within retainer 82. Key surface 426 can also be concave as shown in FIG. 8y, so that the retainer of adhesive by surface 426 is improved so that a larger gap is defined between retainer 82 and barrel 40. In addition to providing a keying function, the complimentary engaging surfaces 424 and 426 of barrel 40 and retainer 82 operate to improve the security with which barrel 40 is held in place within retainer 82. The interface defined by planar surfaces 424 and 426 operates to hold liquid adhesive in an isolated located during the curing process, rather than allowing liquid adhesive to run and dissipate freely with retainer 82. The holding function is enhanced if surface 426 is concave. Because adhesive interface surface 426 of barrel 40 and truncated notch 420 are spaced apart in the embodiment of FIGS. 8L-8m, adhesive material is not likely to invade notch 420 to complicate the adjustment process if further adjustment of barrel 40 within retainer 82 is needed after application of adhesive material. Barrel 40 may be adjusted and secured within retainer 82 with use of a fixture and a test image displaying display 168d as described previously in connection with FIGS. 8p and 8q. In another aspect of finely adjustable threadless lens assembly barrel system, adhesive material may be deposited into pin aperture 416 as well as aperture 414, to increase the holding force with which barrel 40 is held in retainer 82. In such an embodiment, retainer 82 effectively comprises a pair of adhesive receiving apertures 414, 416. As shown in FIGS. 8L and 8o, retainer 82 may include a plurality of rails including rails 435. Barrel may be adapted to ride on rails 435. Rails 435 may be aligned in parallel with an axis of barrel while interior walls 412 of retainer 82 may be drafted at a small angle (e.g. 0.5 degrees) so that support assembly 80 can more easily be removed from a mold. Support assembly 80 according to the invention can comprise black polycarbonate. Rails 435 of which retainer may have several (e.g. 4) simplify the process of making support 80 and help define an adhesive accommodating gap between barrel 40 and retainer 82.

In an alternative embodiment of a finely adjustable barrel and holder system, both lens barrel 40b and retainer 82 comprise threads as are shown generally by the embodiment of FIG. 8r. However, in a low cost finely adjustable threaded lens adjustment system, the threads of lens barrel 82b and retainer 82 are selected to be substantially coarse, loose tolerance threads such that barrel 40 is movable several microns in the Z direction once it is received in retainer 82. An example of a type of course threads which are useful in finely adjustment barrel and holder system of the invention are Class 1 Coarse threads as designated by the American National Standards Institute (ANSI). When substantially coarse threads are used in a finely adjustable threaded lens barrel system, barrel 40, in a rough adjustment step, is threaded into retainer 82. In a fine adjustment step, barrel 40 is moved along the Z direction in lens retainer 82 without threading, taking advantage of the tolerance of the substantially coarse threads. A substantially coarsely threaded lens barrel, may have an adhesive receiving aperture 414 as shown in e.g. FIG. 8L. A finely adjustable coarse threaded lens barrel system may also include an elongated pin receipt aperture 416 as described in connection with FIG. 8L and FIG. 2L which may also serve as an adhesive receiving aperture. Furthermore, a barrel 82b in a finely adjustable coarse threaded system may have a threadless section comprising a notch 410 as shown in FIG. 8r for engagement by pin 93p. Pin 93p may also engage threads of barrel 82b. When a desired lens to image sensor distance is achieved, adhesive may be applied to aperture 414, aperture 416, or to another exposed interface between barrel 82b and retainer 82 to secure barrel 82n in a fixed position on retainer 82. A threaded barrel may be adjusted and secured within retainer 82 with use a fixture and test image displaying display 168d as described previously in connection with FIGS. 8p and 8q.

In another embodiment of a finely adjustable barrel and retainer system also described with reference to FIG. 8r, both barrel 40 and retainer 82 comprise a threaded section 460, 462 and an unthreaded section 464, 466. Preferably, unthreaded sections 464, 466, are manufactured to extremely tight tolerances to essentially prevent axial movement (movement of barrel relative to axis, a) of barrel 82b within retainer 82. Threaded sections 460, 462 may comprise e.g. loose tolerance, course threads such as ANSI class 1 threads, or tight tolerance fine threads such as ANSI class 3 threads. If threaded sections 460, 462 include coarse threads, retainer 82 may include adhesive receipt and pin receipt apertures 414, 416 to enable fine adjustment. If threaded sections 464, 466 include threads that are sufficiently fine, barrel 40 may be finely adjusted within retainer 82 without use of pin 93p and aperture 416. It will be seen that it is useful to provide adhesive aperture 414 whether or not the adjustment system includes threads. Further, it is useful to provide aperture 414 on any location on retainer 82 in a threaded system irrespective the thread count and irrespective the span of thread sections 460, 462 on barrel 40 and retainer 82.

G. Packaging of Electronics

Referring now to further aspects of module 10, e.g. module 10-1, the size of module 10 may be further reduced by mounting a partially or wholly "unpackaged" image sensor 32 onto first circuit board 14a. A prior art image sensor chip, or "image sensor" as referred to herein is shown in FIG. 8z. Image sensor 32 includes a ceramic or plastic substrate 32s, integrated lead frames 32L, and a protective cover 32c. Integrated surface mount or lead frames 32L extend rigidly from the major body of image sensor 32 and are adapted to be soldered or socketed to printed circuit board 14a.

While the prior art image sensor is durable, and easy to install, it also consumes substantial space. As a space conserving measure, image sensor 32 of module 10 is may be an image sensor without at least one of the following elements being integrated into the image sensor chip: (a) ceramic substrate, (b) protective cover, or (c) leads. Mounting an image sensor 32 to printed circuit board 14b that does not include one or more of the above components reduces the space consumed by image sensor 32.

Imaging module 10 (e.g. module 10-1) consumes space in the X, Y, and Z dimensions as defined by FIG. 1a. It can be seen that mounting an image sensor 32 that does not have an integrated substrate 32s and/or protective cover 32c integrated therein substantially reduces the Z-direction space consumption requirements of image sensor 32 and therefore, of module 10-1. Mounting an image sensor 32 that does not have rigid lead frames 32L integrated therein substantially reduces the X and Y dimension requirements of image sensor 32 and therefore, of module 10-1.

The inventors found that one or more of the above image sensor component parts can be eliminated from the image sensor chip incorporated in module 10 without substantially affecting the durability and performance of the module's imaging system. The image sensor integrated substrate 32s can be eliminated from an image sensor chip because image die 32d of chip 32 can be mounted directly on printed circuit board 14a. The protective cover 32c of image sensor 32 can be deleted because image sensor 32, without an integrated cover 32c can be adequately protected by support assembly 80. Further, rigid lead frames 32L can be deleted from image sensor 32 because image sensor die 32d can be directly wire bound to printed circuit board 14a or soldered to printed circuit board 14a Methods for mounting a "substrateless" image sensor that does not include an integrated substrate 32s to printed circuit board 14a are described with reference to FIGS. 8s and 8t. In the embodiment depicted with reference to FIG. 8s, image sensor die 32d is deposited directly onto printed circuit board 14a and wirebonded to printed circuit board 14a. Wirebonds 32w can comprise for, example, Aluminum (AL) or Gold (AU). In the embodiment depicted with reference to FIG. 8t image sensor die 32d is structurally and electrically connected to printed board 14a via solder bumps 32b interposed between die 32d and printed circuit board 14b. Electronic packaging firms such as Task Microelectronics, Inc. of Montreal, Ontario specialize in mounting substrateless silicon based chips without lead frames directly onto printed circuit boards.

An alternative method for reducing the Z-direction space consumption of module 10 in the area forward of printed circuit board 14a is described with reference to FIG. 8u. As seen in FIG. 8u image sensor 32 can be face mounted to printed circuit board such that a periphery of face 32f, or top surface of image sensor 32 is benched onto a back side 14a-r of circuit board 14a provided that an image sensor window 14w is formed in printed circuit board 14a. Image sensor 32 in the embodiment of FIG. 8u can be a typical "packaged" image sensor as is illustrated in FIG. 8s having an integrated substrate, a protective cover, and lead frames or else image sensor 32 can be of a type that does not include one or more elements selected from the group comprising an integrated substrate, protective cover or lead frame. Solder bumps 32b may electronically and structurally secure image sensor 32 to PCB 14a.

Miniature imaging modules as described herein will find increased use in battery operated devices including cordless bar code readers, PDAs and cellular telephones. There is therefore, increased motivation for making modules as energy efficient as is possible so as to increase the battery life of a battery which may be adapted to power module 10.

In the embodiment shown in FIG. 8v an illumination circuit board 14b of module 10-24 is adapted with a heat sink which draws heat away from LEDs 16 and 18 so that LEDs 16 and 18 operate at improved efficiency. A cross-section of an illumination circuit board is shown in FIG. 8x. A typical illumination circuit board of module 10-24, as shown in FIG. 8v may include seven layers, including three insulating fiberglass layers 14f1, 14f2, and 14f3 interposed between conductive layers, typically comprising copper. As seen in FIG. 8v illumination circuit board 14b may include one or more heat sink tabs 14T1 and 14T2 extending therefrom. In the formation of a heat sink tab 14T1, one or more of the copper layers may be extended outwardly from the edge e of the circuit board as is indicated by copper layer 14c2. A fiberglass layer abutting extended layer 14c2 may also be extended from edge e for supporting the extended copper layer. Extended copper layer 14c2 defining tab T1 may be electrically connected to a ground tracing of printed circuit board 14b. Exposing a conductive copper surface of tab T1 to air removes heat from circuit board 14a resulting in increased efficiency and expected life in the operation of LEDs 16 and 18. Furthermore, one or more tabs 14T1 and 14T2 of module 10-24 can be attached to a heat sink structure 15 as is shown in FIG. 8w. Heat sink structure 15 which is adapted to be situated in the housing of the imaging device in which module 10-24 is installed comprises a conductive material such as copper or aluminum. Heat sink structure 15 increases the surface area formed by the combination of tab 14T1 and structure 15 and thereby increases the amount of heat that is removed from circuit board 14b. In another heat sinking apparatus a heat sink structure is connected to a post or posts 84 as indicated in connection with FIG. 2h. Member 14p attached to posts 84 can be a heat sink structure comprised of a thermally conductive but electrically insulating material such as Boralloy Pyrolytic Born Nitride from Advanced Ceramics Corp. of Cleveland, Ohio.

An important feature of the invention as embodied by module 10-9 is that essentially all the illumination elements of a reader in which module 10-9 is to be incorporated can be included on a single circuit board shown as being provided by PCB 14a. This is in contrast to the design of the prior art reader shown in FIG. 11 in which illumination elements and image sensing elements are spread out over several circuit boards. In the prior art device shown in FIG. 11, an aiming illumination source 53 is mounted to a first circuit board 54, illumination LEDs 55 are mounted to a second circuit board 56, while image sensor 32 is mounted to first circuit board 54. The device of FIG. 11 further includes a third circuit board 60 carrying signal processing and decoding electrical hardware components. The assembly of a module of this prior art design is difficult and requires material components not required by the design of the present invention including circuit boards 54 and 56 and electrical connectors between the circuit boards such as connectors 57a and 57b. Providing a single circuit board that carries an image sensor, illumination LEDs, and aiming LEDs significantly simplifies assembly, reduces material consumption and thereby reduces the overall cost of producing the module. Another important aspect of the invention as embodied by module 10-9, in one embodiment, is that essentially all electronic circuitry supporting the data processing operations required of module 10 are located on single, full function PCB 14a, including circuitry for processing signals generated from image sensor 32, circuitry for capturing image data into a memory device, circuitry for decoding and/or recognizing indicia represented in captured image data. Circuitry for supporting serial transfers of data to peripheral devices may also be carried by PCB 14a.

The all in one PCB arrangement of the present invention is in contrast to the traditional design in the prior art wherein circuitry for processing signals from an image sensor, circuitry for capturing and decoding image data and circuitry supporting serial interfacing with external devices are spread out over more than one circuit board.

In the design of the prior art reader shown in FIG. 11, a first vertically oriented circuit board 56 is provided for carrying circuitry for processing signals generated by an image sensor 32 and a second horizontally oriented circuit board 60, known as a "mother board" is provided for carrying circuitry for storing image data and for decoding symbologies. The one PCB design of the present invention provides numerous advantages over the two PCB design of the prior art. The multiple circuit board arrangement of the prior art requires a complex assembly procedure wherein the first circuit board 58 is mounted to a first internal structure of the reader in which it is incorporated, the second circuit board is mounted to a second internal structure of the reader, and then the two circuit boards are electrically connected. The separate horizontal and vertical orientations of the two circuit boards 58 and 60 is inefficient in terms of space consumption and imposes restrictions on the configurations of housings in which the reader optical and electrical components may be incorporated. The one full function PCB design of the present invention does not exhibit these disadvantages.

In accordance with a feature of one embodiment of the invention described with reference to e.g. modules 10-1 through module 10-21, essentially all of the electrical signal processing components described with reference to FIG. 10a may be carried by a single circuit board, circuit board 14a, as is indicated by dashed-in border 14a of FIGS. 10a-10e. In order to incorporate essentially all of the electrical signal processing components of FIG. 10a onto a single PCB 14a, it is normally necessary to integrate several electrical components into a reduced number of electrical components. For example, using known integrated circuit fabrication techniques, components 142, 144, 146, and 147 and interfaces 137, 137', and 137" can be incorporated in a single integrated circuit chip of reduced size. Further, as explained in an article by Eric R. Fossum entitled Digital Camera System on a Chip, IEEE Computer Society (IEEE Micro), Volume 18, Number 3, May/June 1998, image sensor 132, signal processing components 135, 136, and components 142, 144, 146, 147, 137, 137', and 137" may be incorporated in a single integrated circuit of reduced size.

H. Applications, Operating Environments, and Control Circuit Functionality

Figure 9A:
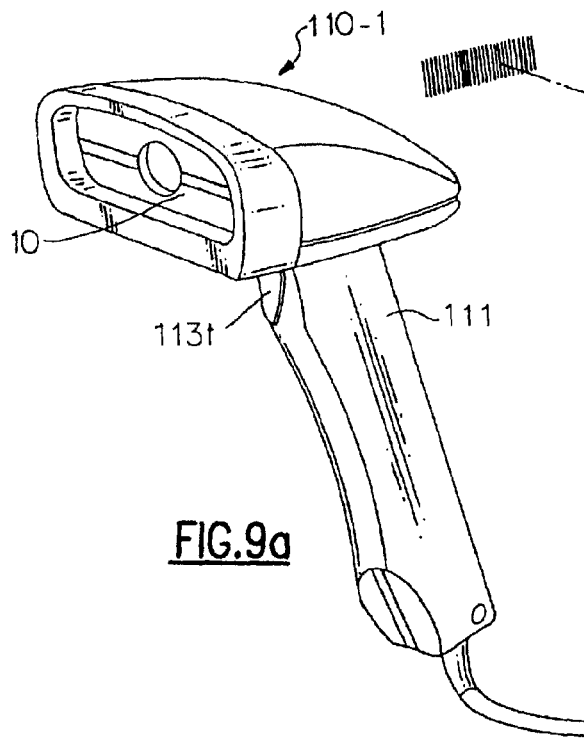
FIGS. 9*a*-9*n* show perspective views of various devices having an imaging module according to the invention incorporated therein.
Figure 9B:
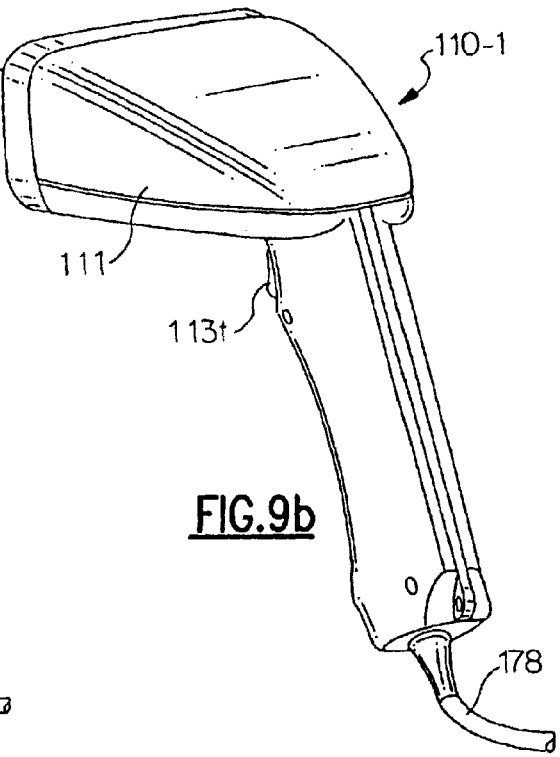
FIG. 9*o* shows a side view mounting detail diagram for illustrating how a post-containing imaging module of the invention may be mounted.
Figure 9C:
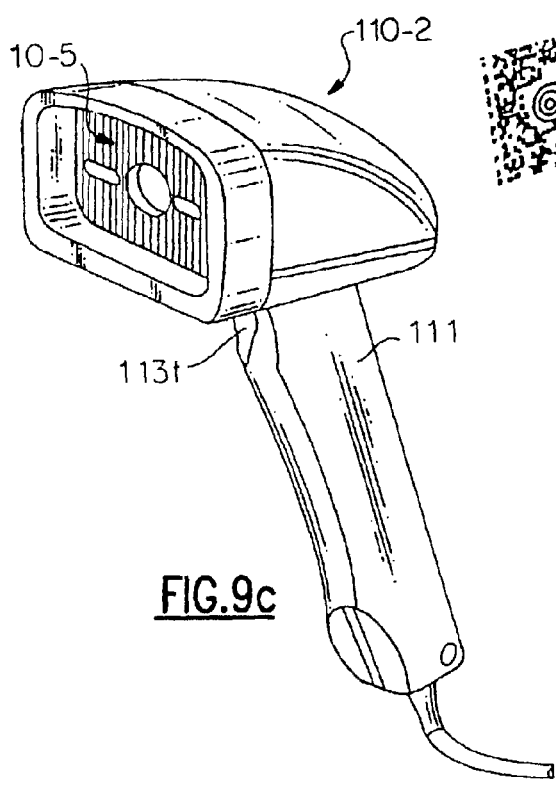
Figure 9D:
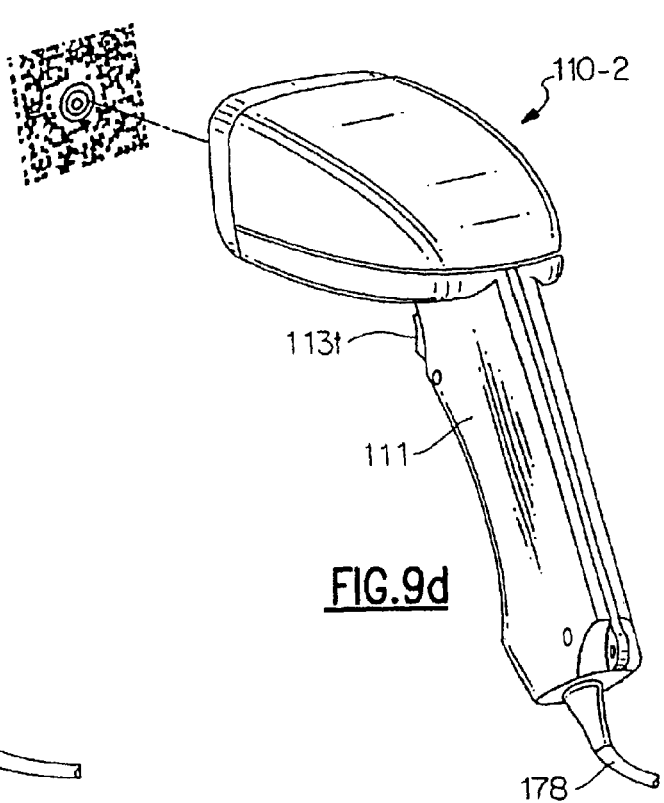
Figure 9E:
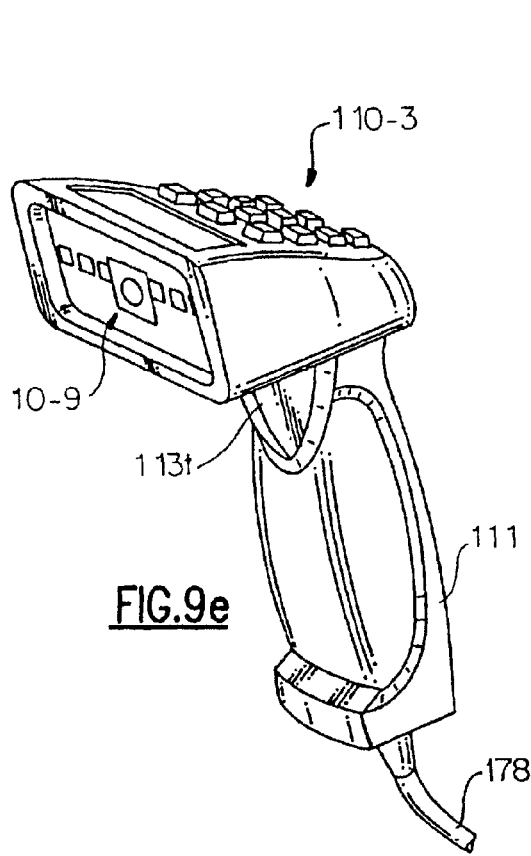
Figure 9F:
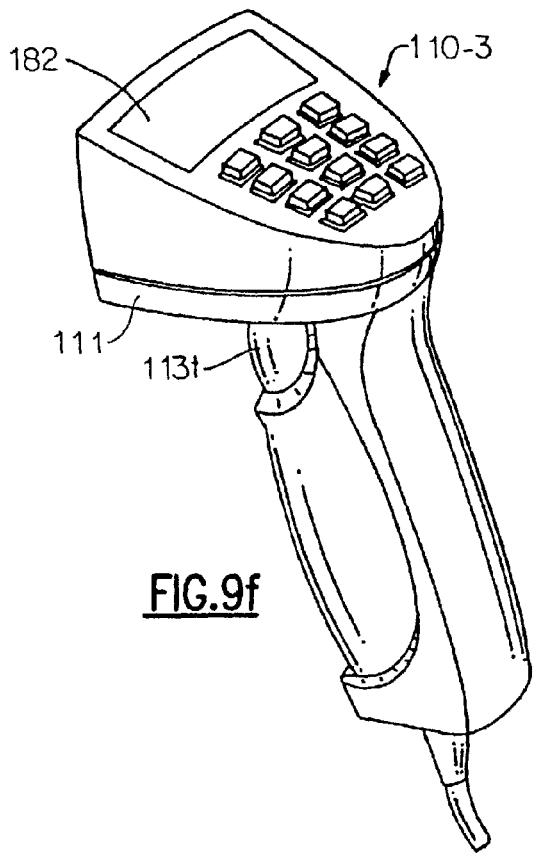
Figure 9G:
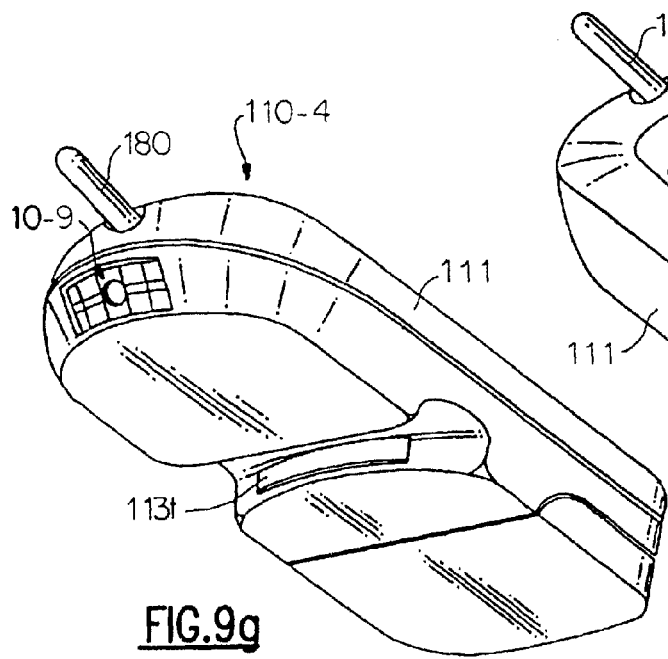
Figure 9H:
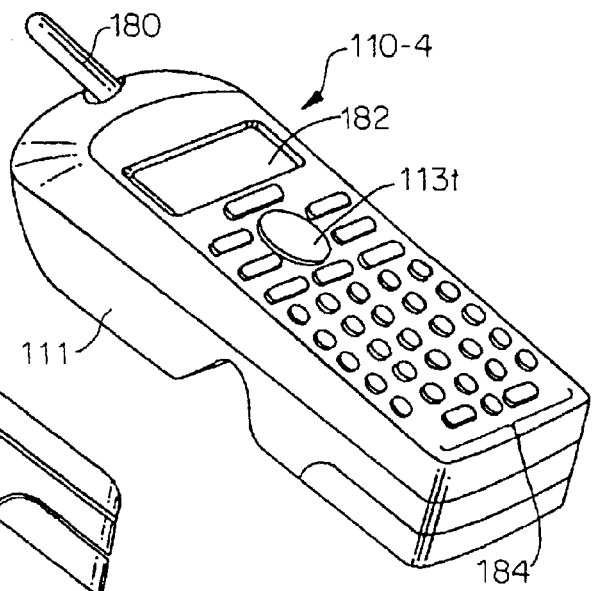
Figure 9I:
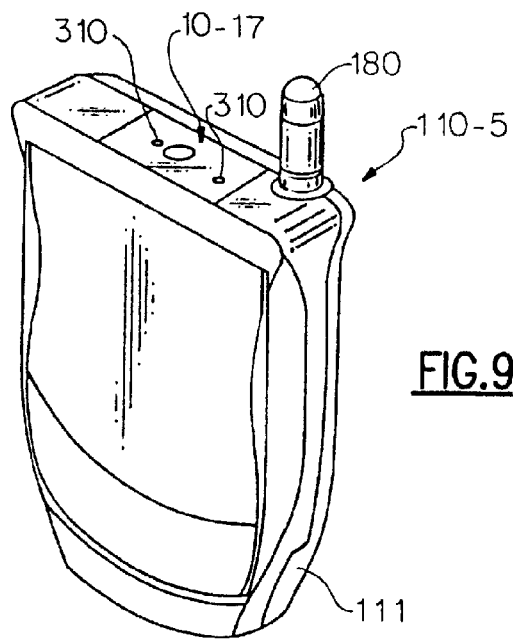
Figure 9K:
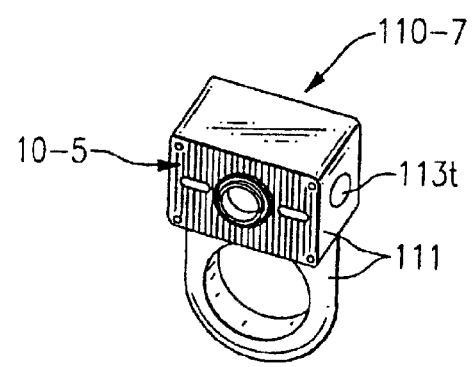
Figure 9J:
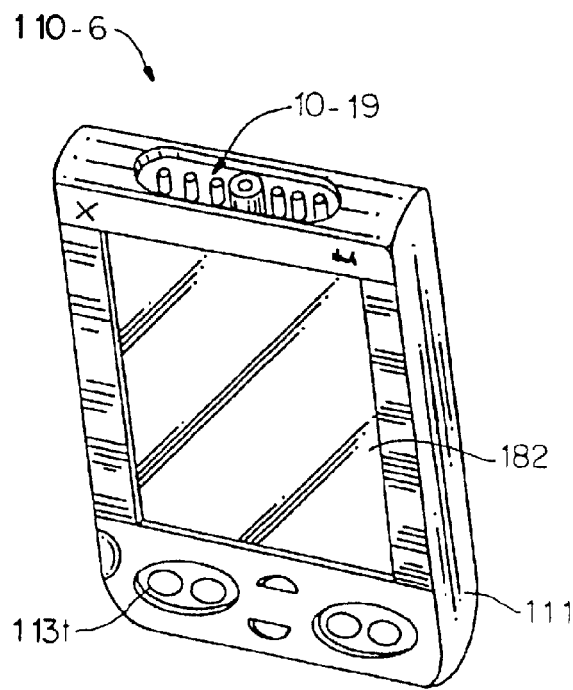

FIGS. 9a-k show examples of types of housings in which the modules of the present invention may be incorporated. FIGS. 9a and 9b show a 1D optical reader 110-1, while FIGS. 9c-9h show 2D optical readers 110-2, 110-3, and 110-4. Readers 110-1, 110-2, 110-3 comprise the form factor of a gun-styled reader while reader 110-4 compresses the form factor of what is often referred to portable data terminal (PDT). Referring to additional readers, reader 110-5 of FIG. 9j comprises the form factor of a mobile telephone, reader 110-6 of FIG. 9j comprises the form of a portable data assistant (PDA) while reader 110-7 of FIG. 9k comprises the form factor of a finger-worn reader, sometimes referred to as a "ring scanner." Housing 111 of each of the optical readers 110-1 to 110-7 is adapted to be graspable by a human hand (or worn on a finger) and has incorporated therein at least one trigger switch 113t for activating image capture and decoding and/or image capture and character recognition operations. Readers 110-1, 110-2, and 110-3 include hard-wired communication links 178 for communication with external devices such as other data collection devices or a host processor, while readers 110-4 to 110-7 include an antenna 180 (seen in FIGS. 9h and 9i only) for providing wireless communication with an external device such as another data collection device or a host processor.

It will be seen that modules 10-1 to 10-8 in particular because of their notably small exemplary dimensions (0.810.times.0.450.times.0.560) or substantially smaller can be incorporated in virtually any small instrument housing, for example, a calculator, a pen, a medical instrument, and a watch in a addition to any of the housings described in FIGS. 9a-9L.

An embodiment of module 10-1 shown as incorporated an alternative mobile phone housing is shown in FIG. 9m. In FIG. 9n, module 10-1 is incorporated into an integrated housing of a writing instrument provided by a pen. The pen reader 110-9 of FIG. 9n includes a housing 111 having incorporated therein module 10-1, a processor assembly 130 including a control circuit 140 as described in connection with FIG. 10a, which is responsive to actuation of redundant triggers 113t disposed to be accessible from an exterior of housing 111, an ink reservoir (not shown) and a head-unit (e.g. a ball point ink dispenser) including tip 960 for dispensing ink from the reservoir onto a sheet of paper. Housing head section 111h can be made detachably attachable with the remainder of housing 111 so that housing 111 is a two piece housing or else head section 111h can be integrated into the remainder of housing 111 so that housing 111 is a one-piece housing. Combining imaging module 10-1 configured by circuit 140 to have dataform-reading functionality and writing functionality in a common housing 111 is highly useful in that data form readers and writing instruments are devices which are both used extensively in data collection applications. A module 10 according to the invention an also be incorporated in, for example medication dispensing equipment, patient monitors of all forms, access control equipment, integrated recognition equipment to add feature recognition (such as facial, hand, or retinal). As well, such modules may find application in household appliances such as sewing machines, and microwaves where indicia can provide useful functionality to the user.

Figure 2K:
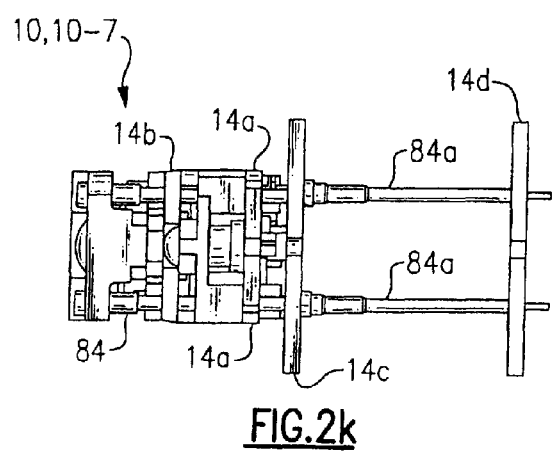

Module e.g. 10-1 can be mounted to an internal member of a housing 111 or another rigid member by screwing set screws through the housing member and through screw holes 810 of module 10-1 described in connection with FIG. 1h and 1i. Further, brass threaded inserts can be disposed in holes 810 so that holes receive machine screws. In addition, module 10-1 includes connector 930 for receiving a flex connector to provide electrical communication with circuitry of reader 110 e.g. a "mother board" 60 as in the prior art reader FIG. 11. Still further, support posts 84 can be utilized to mount, stabilize, or support module 10-1 within a reader housing. As discussed previously module including posts 84 can have post ends 84e that protrude extensively from circuit board 14a. These post ends 84e can be plugged into sockets 910 formed on a rigid member of members of an interior of a reader housing 111 or on another rigid member outside of a housing to mount, stabilize or support module e.g. 10-1. Additional posts 84a, as shown in FIG. 2k can be interposed between sockets 910 and posts 84. A socket containing rigid member 916 may be provided by a housing wall as is indicated by the embodiment of FIG. 9o.

In addition to the above elements, readers 110-3, 110-4, 110-5 and 110-6, each include a display 182 for displaying information to a user and a keyboard 184 for enabling a user to input commands and data into the reader.

Figure 9L:
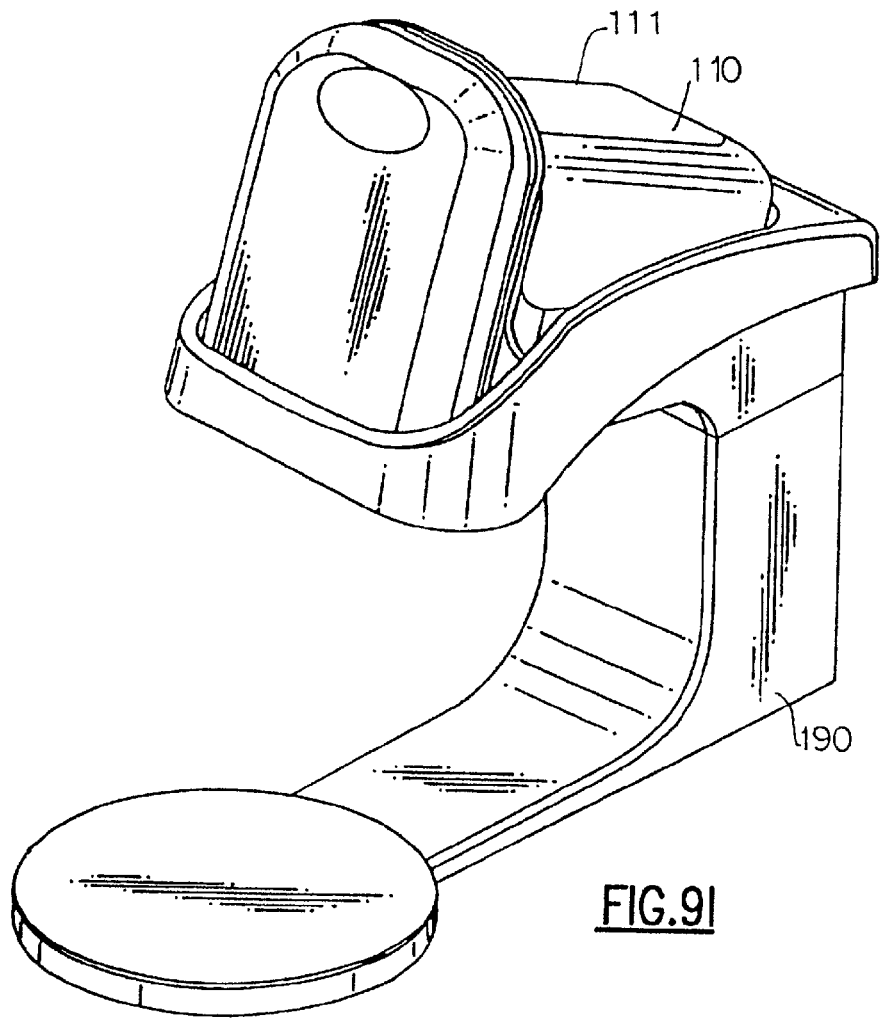
Figure 9O:
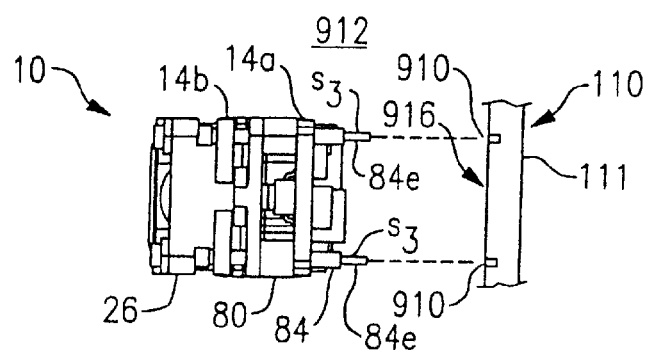

Any one of the readers described with reference to FIGS. 9a-9k may be mounted in a stationary position as is illustrated in FIG. 9L showing a generic optical reader 110 docked in a scan stand 190. Scan stand 190 adapts portable optical reader 110 for presentation mode scanning. In a presentation mode, reader 110 is held in a stationary position and an indicia bearing article is moved across the field of view of reader 110. Of course, only module 10 described herein can be placed in a scan stand 190 or may otherwise be mounted (replaceably or fixedly) in a stationary position.

Block diagrams of electrical circuit control configurations which may be wholly or partially incorporated in module 10 or used in combination with circuitry of module 10 are now described.

Figure 10F:
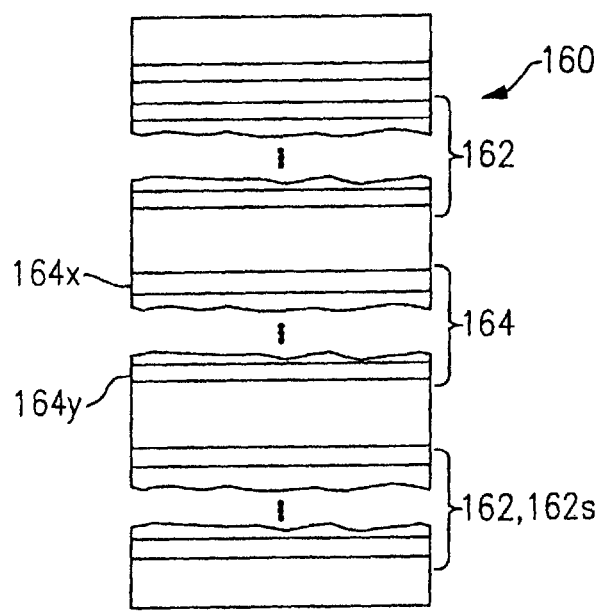
FIG. 10*f* is a software architecture diagram illustrating a software architecture which may be implemented in a device incorporating an imaging module according to the invention.
Figure 10A:
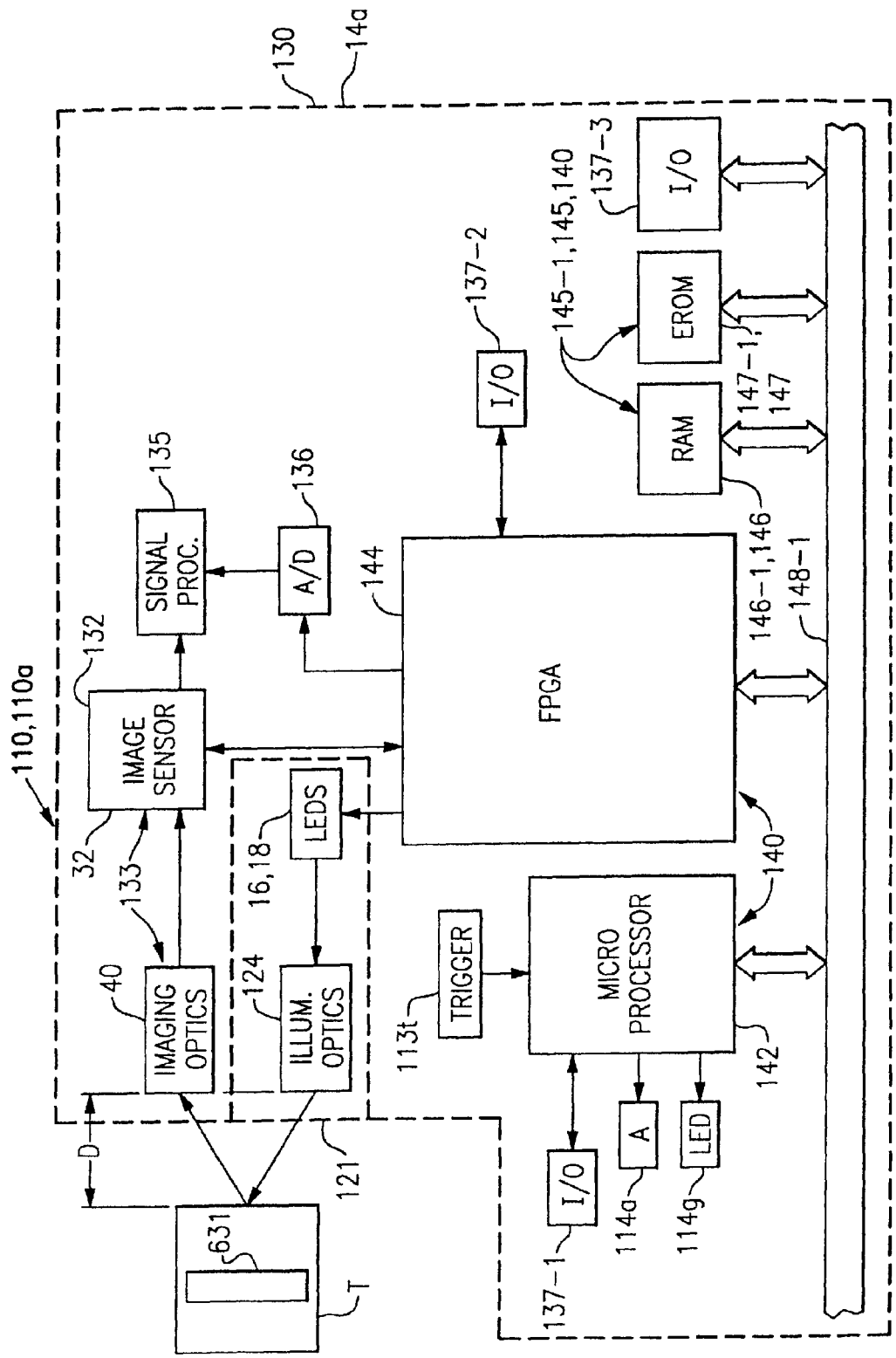

Referring to the block diagram of FIG. 10a, imaging device processor assembly 130 includes an illumination assembly 121 for illuminating a target area T, such as a substrate bearing a 1D or 2D bar code symbol or a text string, and an imaging assembly 133 for receiving an image of object T and generating an electrical output signal indicative of the data optically encoded therein. Illumination assembly 121 may, for example, include an illumination source assembly e.g. 16, 18, together with an illuminating optics assembly 124, such as one or more lenses 25, diffusers 27, wedges 28, reflectors 640 or a combination of such elements, for directing light from light source 16, 18 in the direction of a target object T. Illumination assembly 121 may comprise, for example, laser or light emitting diodes (LEDs) such as white LEDs or red LEDs. Illumination assembly 121 may include target illumination optics for projecting an aiming pattern e.g. 630, 631, 647 on target T. Illumination assembly 121 may be eliminated if ambient light levels are certain to be high enough to allow high quality images of object T to be taken. Illumination assembly 121 may also be located remote from imaging device housing 111, at a location so as to eliminate or reduce specular reflections. Imaging assembly 133 may include an image sensor 32, such as a color or monochrome 1D or 2D CCD, CMOS, NMOS, PMOS, CID or CMD solid state image sensor, together with an imaging optics assembly 40 for receiving and focusing an image of object T onto image sensor 32. Features and advantages associated with incorporating a color image sensor in an imaging device, and other control features which may be incorporated in control circuit 140 are discussed in greater detail in U.S. patent application Ser. No. 09/904,697, (now U.S. Pat. No. 6,722,569) filed Jul. 13, 2001, entitled "An Optical Reader Having a Color Imager" incorporated herein by reference. The array-based imaging assembly shown in FIG. 10a may be replaced by a laser array based imaging assembly comprising one or more laser sources, a scanning mechanism, emit and receive optics, at least one photodetector and accompanying signal processing circuitry.

Imaging device processor assembly 140 of the embodiment of FIG. 10a includes programmable control circuit 140 which preferably comprises an integrated circuit microprocessor 142 and field programmable gate array (FPGA 144). The function of FPGA 144 could also be provided by application specific integrated circuit (ASIC), which is also considered to be designated by reference character 144 in FIGS. 10a-10e. IC microprocessor 142 can be e.g. a Motorola Power PC, 82E IC Microprocessor as an INTEL, StrongArm, SA1110. FPGA 144 may be e.g. a Xilinx, SPARTAN, XCSXXXX FPGA IC.

Processor 142 and FPGA 144 are both programmable control devices which are able to receive, output and process data in accordance with a stored program stored in memory unit 145 which may comprise such memory elements as a volatile or non-volatile read/write random access memory or RAM 146, 146-1 and an erasable read only memory or EROM 147, 147-1. Memory 145 may also include one or more long term non-volatile memory storage devices (148, 145). For example, storage device 148, 145 may include e.g. a hard drive, or floppy disk to which data can be written to or read from. Storage device 148, 145 can be of a type that is securely installed in housing 111 (e.g. a hard drive) or can be of a type that can be removed from housing 111 and transported (e.g. floppy disk). Memory 145 can include what is referred to as a "flash" memory device. Several standardized formats are available for such flash memory devices including: "Multimedia" (MMC), "Smart Media," "Compact Flash," and "Memory Stick." Although the transfers of data between processor 140 and a flash memory device normally involve "blocks" of data and not "bytes" of data as in standardly known non-volatile RAM device, the operation of a "flash" memory device is similar to a standardly known non-volatile RAM memory device. Accordingly, a flash memory device can be considered to be represented by the one or more RAM blocks 146 of FIGS. 10a-10e. As is well known, flash memory devices are commonly available in a form that allows them to be removed from a first device and transported to a second device, e.g. between device 110 and device 168. Flash memory devices are particularly well suited for storing and archiving image data.

Processor 142 and FPGA 144 are also both connected to a common bus 149-1 through which program data and working data, including address data, may be received and transmitted in either direction to any circuitry that is also connected thereto. Processor 142 and FPGA 144 differ from one another, however, in how they are made and how they are used.

More particularly, processor 142 is preferably a general purpose, off-the-shelf VLSI integrated circuit microprocessor which has overall control of the circuitry of FIG. 8a, but which devotes most of its time to decoding decodable image data such as symbology or text character data stored in RAM 146, 146-1 in accordance with program data stored in EROM 147, 147-1. FPGA 144, on the other hand, is preferably a special purpose VLSI integrated circuit, such as a programmable logic or gate array, which is programmed to devote its time to functions other than decoding image data, and thereby relieve processor 142 from the burden of performing these functions.

The actual division of labor between processor 142 and FPGA 144 will naturally depend on the type of off-the-shelf microprocessors that are available, the type of image sensor which is used, the rate at which image data is output by imaging assembly 133, etc. There is nothing in principle, however, that requires that any particular division of labor be made between processors 142 and 144, or even that such a division be made at all.

With processor architectures of the type shown in FIG. 10a, a typical division of labor between processor 142 and FPGA 144 will be as follows. Processor 142 is preferably devoted primarily to such tasks as decoding image data in response to trigger 113t being activated, once such data has been stored in RAM 146, 146-1, controlling the outputting of user perceptible data via aural output 114A, good read indicator 114g and display 114d and, recognizing characters represented in stored image data according to an optical character recognition (OCR) scheme in response to an actuation of trigger 113t.

FPGA 144 is preferably devoted primarily to controlling the image acquisition process, the A/D conversion process and the storage of image data, including the ability to access memories 146-1 and 147-1 via a DMA channel. FPGA 144 may also perform many timing and communication operations. FPGA 144 may, for example, control the illumination of LEDs 16,18, the timing of image sensor 132 and an analog-to-digital (A/D) converter 136-1, the transmission and reception of data to and from a processor system external to assembly 130, through an RS-232, a network such as an Ethernet, a serial bus such as USB, a wireless communication link (or other) compatible I/O interface as is indicated by interface 137-2. FPGA 144 may also control the outputting of user perceptible data via an output device, such as aural output device 114a, a good read LED 114g and/or a display monitor which may be provided by a liquid crystal display such as display 114d. Control of output, display and I/O functions may also be shared between processors 142 and 144, as suggested by bus driver I/O interface 137-3 or duplicated, as suggested by microprocessor serial I/O interface 137-1 and interface 137-2. As explained earlier, the specifics of this division of labor is of no significance to the present invention. The imaging device described with reference to FIG. 10a can be adapted for use in connection with the invention by providing a display, e.g. display 168*d* that is external to handheld housing 111, but is in communication with control circuit 140.

Figure 10B:
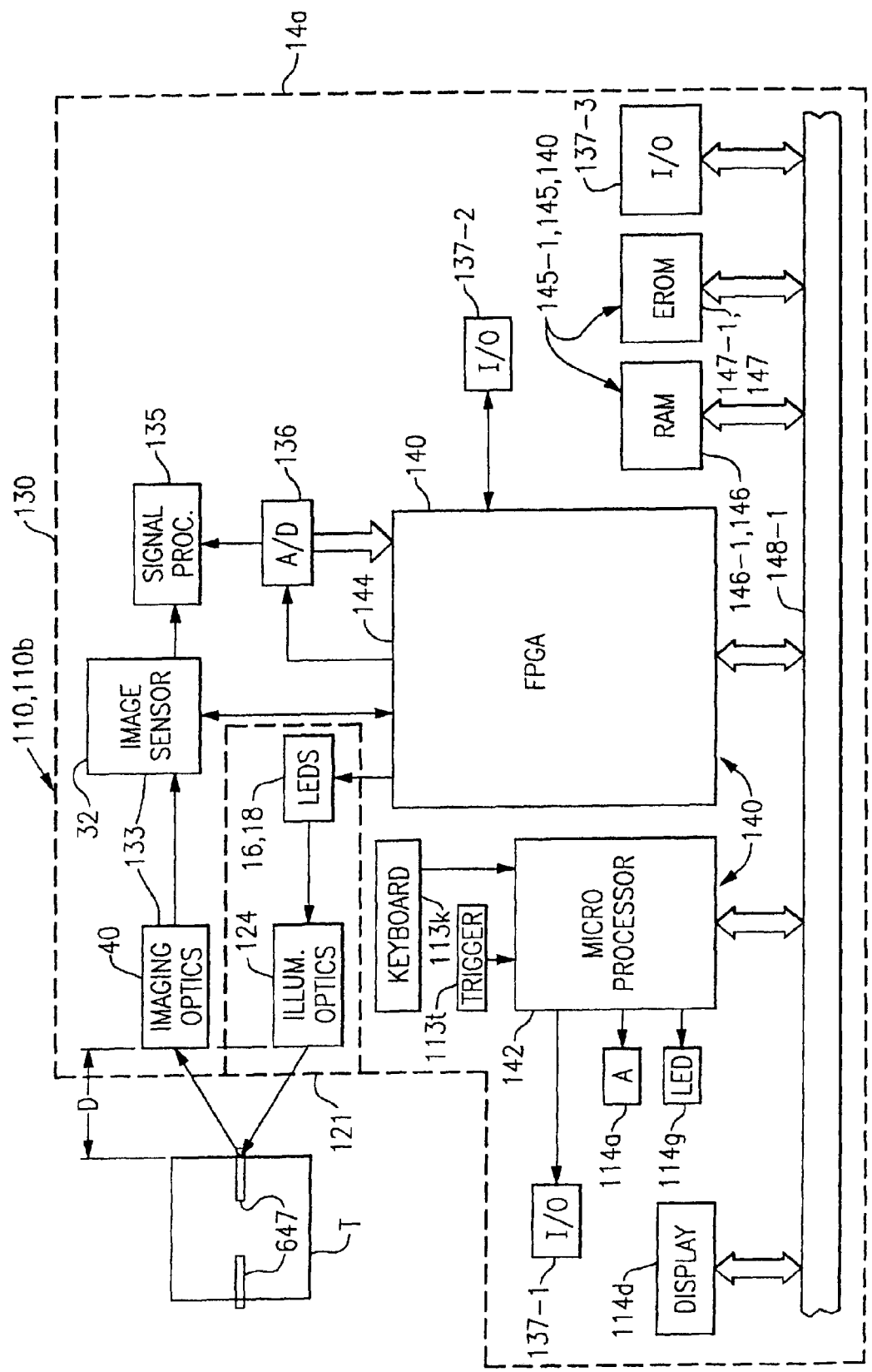

FIG. 10*b* shows a block diagram exemplary of an optical imaging device which is adapted to easily receive user-input control instructions resulting in a change in an operating program of an imaging device. In addition to having the elements of single state imaging device circuit of FIG. 10*a*, imaging device 10*b* includes a keyboard 113*k* for inputting data including instructional data and a display 114*d* for displaying text and/or graphical information to an operator. Keyboard 113*k* may be connected to bus 148-1, FPGA 144 or to processor 142 as indicated in FIG. 2*b*. Display 114*d* may be connected to FPGA 144, to processor 142 or to system bus 148-1 as is indicated in the particular embodiment of FIG. 10*b*.

An operator operating optical imaging device 110*b* can reprogram imaging device 110*b* in a variety of different ways. In one method for reprogramming imaging device 110-*b*, an operator actuates a control button of keyboard 113*k* which has been pre-configured to result in the reprogramming of imaging device 110*b*. In another method for reprogramming imaging device 110*b* an operator actuates control of a processor system not integral with imaging device 110*b* to transmit an instruction to reprogram imaging device 110*b*. According to another method for reprogramming imaging device 110*b*, an operator moves imaging device 110*b* so that a "menu symbol" is in the field of view of image sensor 32 and then activates trigger 113*t* of imaging device 110*b* to capture an image representation of the menu symbol. A menu symbol is a specially designed bar code symbol which, when read by an appropriately configured optical imaging device results in an imaging device being programmed. The reprogramming of an optical imaging device with use of a menu symbol is described in detail in commonly assigned U.S. Pat. No. 5,965, 863 incorporated herein by reference. Because the second and third of the above methodologies do not require actuation of a imaging device control button of keyboard 113*k* but nevertheless result in a imaging device being reprogrammed, it is seen that imaging device 110 may be keyboardless but nevertheless reprogrammable. It will be seen that the second or third of the above methodologies can be adapted for selecting operating modes described herein.

A typical software architecture for an application operating program typically executed by an optical imaging device as shown in FIG. 10*b* is shown in FIG. 10*f* depicting a memory map of a program stored in program memory 147-1. Application operating program 160 adapts an imaging device for a particular application. Three major applications or functions for an optical imaging device imaging device having image capture capability are: (1) comprehensive decoding; (2) data transfer; and (3) image capture, e.g. signature capture. In a comprehensive decoding application, imaging device 110 may preliminarily analyze and then decode a message corresponding to a bar code symbol or OCR decodable text character. In a data transfer application, imaging device 110 uploads character text files or image files to a processor system located externally relative to imaging device housing 111. In a signature capture application, imaging device 110 may capture an image corresponding to a scene having a signature, parse out from the image data that image data corresponding to a signature, and transmit the captured signature data to another processing system. It is seen that the third of such applications can be carried out by an optical imaging device imaging device that is not an optical imaging device decoder equipped with decoding capability. Numerous other application operating programs are, of course possible, including a specialized 1D decoding application, a specialized 2D bar code decoding algorithm, a specialized OCR decoding application which operates to decode OCR decodable text characters, but not bar code symbols.

Referring now to specific aspects of the software architecture of an operating program 160, program 160 includes an instruction section 162, and a parameter section 164. Further, instruction section 162 may include selectable routine section 162*s*. Instructions of instruction section 162 control the overall flow of operations of imaging device 110. Some instructions of instruction section 162 reference a parameter from a parameter table of parameter section 164. An instruction of instruction section 62 may state in pseudocode, for example, "set illumination to level determined by [value in parameter row x]." When executing such an instruction of instruction section 162, control circuit 140 may read the value of parameter row 164*x*. An instruction of instruction section 162 may also cause to be executed a selectable routine, that is selected depending on the status of a parameter value of parameter section 164. For example, if the application program is a bar code decoding algorithm then an instruction of instruction section 162 may state in pseudocode, for example, "launch Maxicode decoding if Maxicode parameter of parameter row 164*y* is set to "on." When executing such an instruction, control circuit 140 polls the contents of row 164*y* of parameter section 164 to determine whether to execute the routine called for by the instruction. If the parameter value indicates that the selectable routine is activated, control circuit 140, executes the appropriate instructions of routine instruction section 162*s* to execute the instruction routine.

It is seen, therefore, that the above described software architecture facilitates simplified reprogramming of imaging device 110. Imaging device 110 can be reprogrammed simply by changing a parameter of parameter section 164 of program 160, without changing the subroutine instruction section 162*s* or any other code of the instruction section 162 simply by changing a parameter of parameter section 164. The parameter of a parameter value of section 162 can be changed by appropriate user control entered via keyboard 113*k*, by reading a menu symbol configured to result in a change in parameter section 164, or by downloading a new parameter value or table via a processor system other than system 140 as shown in FIGS. 10*a* and 10*b*. The reprogramming of imaging device 110*b* can of course also be accomplished by downloading an entire operating program including sections 162 and 164 from a processor system other than a system as shown in FIGS. 10*a* and 10*b*.

Figure 10C:
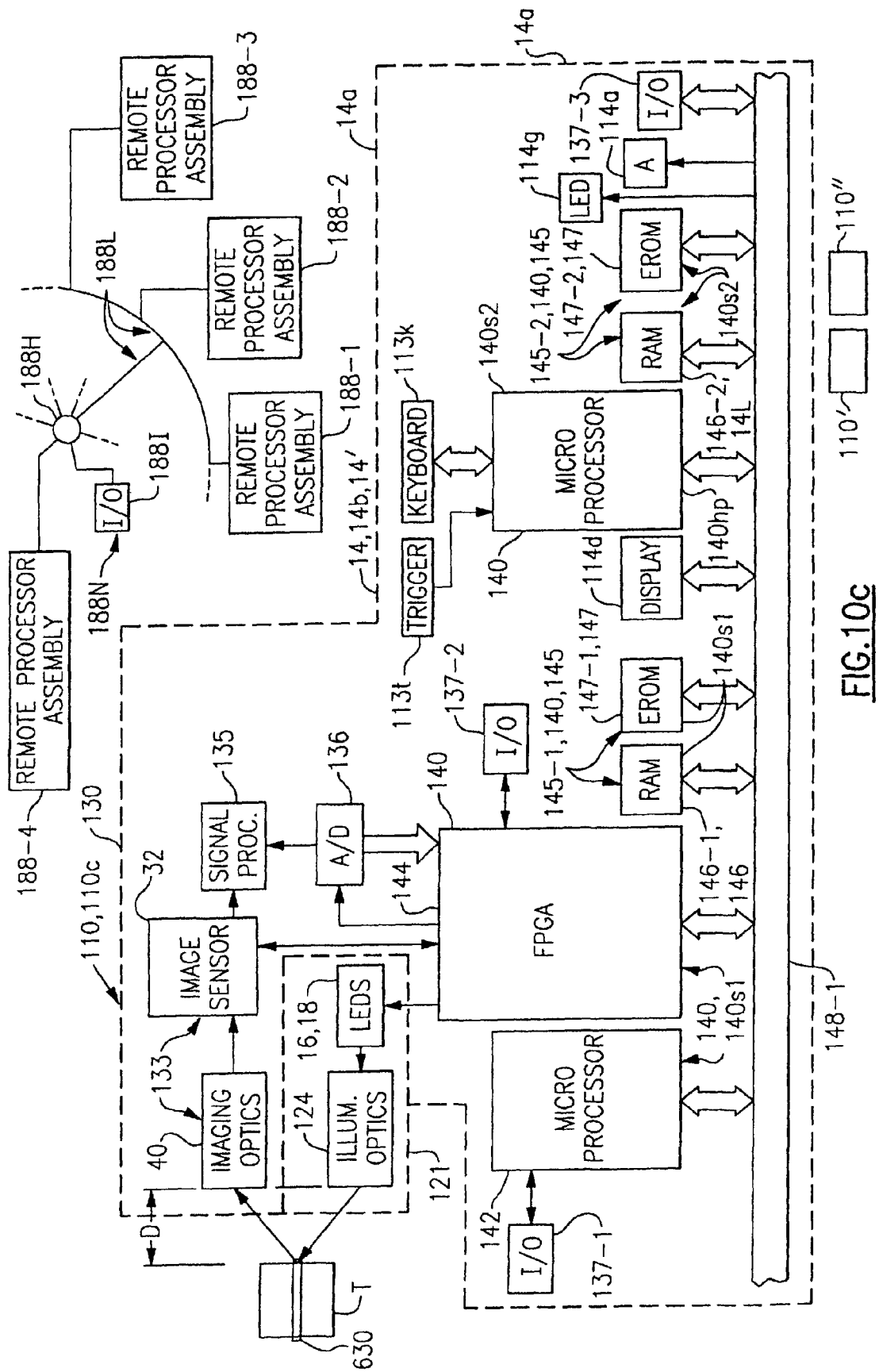

Another architecture typical of an optical imaging device which may be configured in accordance with the invention is shown in FIG. 10*c*. Imaging device 110*c* comprises a control circuit 140 having a processor system 140*s*1, and an integrated host processor system 140*s*2 which includes host processor 140*hp* and an associated memory 145-2. "Host processor system" herein shall refer to any processor system which stores a imaging device application operating program for transmission into a processor system controlling operation of a imaging device imaging system 133 or which exercises supervisory control over a processor system controlling operation of a imaging device imaging system 133, or which stores in its associated memory more than one application operating program that is immediately executable on reception of a command of a user. In a imaging device having two processors such as processor 142 and processor 140*hp*, processor 142 is typically dedicated to processing image data to decode decodable indicia, whereas processor 140*hp* is devoted to instructing processor 142 to execute decoding operations, receiving inputs from trigger 113*t* and keyboard 113k, coordinating display and other types of output by output devices 114d, 114g, and 114a and controlling transmissions of data between various processor systems.

In architectures shown in FIG. 10c having dedicated decoding processor system 140s1 and a powerful, supervisory host processor system 140s2, host processor system 140s2 commonly has stored thereon an operating system, such as DOS WINDOWS or WINDOWS, or an operating system specially tailored for portable devices such as, WINDOWS CE available from Microsoft, Inc. In the case that host processor system 140s2 includes an operating system such as DOS or WINDOWS CE, the instruction section and parameter section of the operating program controlling the operation of host processor system 140s2 normally are programmed in a high level programming language and assembled by an assembler before being stored in memory 147-2 and therefore may not reside in consecutive address locations as suggested by program 160 shown in FIG. 10f. Nevertheless, host processor system 140s2 having an operating system integrated thereon can readily assemble an operating program into such a form for loading into an external processor system that does not have an operating system stored thereon.

Referring to further aspects of imaging devices 110a, 110b, and 110c at least one I/O interface e.g. interface 137-1, 137-2, and 137-3 facilitates local "wired" digital communication such as RS-232, Ethernet, serial bus including Universal Serial Bus (USB), or local wireless communication technology including "Blue Tooth" communication technology. At least one I/O interface, e.g. interface 137-3, meanwhile, facilitates digital communication with remote processor assembly 188-1 in one of an available remote communication technologies including dial-up, ISDN, DSL, cellular or other RF, and cable. Remote processor assembly 88-1 may be part of a network 188N of processor systems as suggested by assemblies 188-2, 188-3, and 188-4 links 188L and hub 188H e.g. a personal computer or main frame computer connected to a network, or a computer that is in communication with imaging device 10c only and is not part of a network. The network 88N to which assembly 188-1 belongs may be part of the internet. Further, assembly 188-1 may be a server of the network and may incorporate web pages for viewing by the remaining processor assemblies of the network. In addition to being in communication with imaging device 110c, assembly 188-1 may be in communication with a plurality of additional imaging devices 110' and 110". Imaging device 110c may be part of a local area network (LAN). Imaging device 110 may communicate with system 188-1 via an I/O interface associated with system 188-1 or via an I/O interface 188I of network 188N such as a bridge or router. Further, a processor system external to processor system 140 such as processor system 170s may be included in the communication link between imaging device 110 and assembly 188-1. While the components of imaging devices 110a, 110b, and 110c are represented in FIGS. 10a-10c as discreet elements it is understood that integration technologies have made it possible to form numerous circuit components on a single integrated circuit chip. For example, with present fabrication technologies, it is common to form components such as components 142, 140, 146-1, 147-1, 137-2, and 137-1 on a single piece of silicone.

Furthermore, the number of processors of imaging device 110 is normally of no fundamental significance to the present invention. In fact if processor 142 is made fast enough and powerful enough special purpose FPGA processor 144 can be eliminated. Likewise, referring to imaging device 110c, a single fast and powerful processor can be provided to carry out all of the functions contemplated by processors 140hp, 142, and 144 as is indicated by the architecture of imaging device 110e of FIG. 10e. Still further, it is understood that if imaging device 110 includes multiple processors the processors may communicate via parallel data transfers rather than via the serial communication protocol indicated by serial buses 149-1 and 149-2. In addition, there is no requirement of a one-to-one correspondence between processors and memory. Processors 142 and 140hp shown in FIG. 10c could share the same memory, e.g. memory 145-1. A single memory e.g. memory 45-1 may service multiple processors e.g. processor 142 and processor 140 hp.

Referring to the embodiment of FIG. 10d, it is seen that it is not necessary that the entirety of electrical components of an optical imaging device 110 be incorporated in a portable device housing 111. The electrical components of imaging device 110d are spread out over more than one circuit board that are incorporated into separate device housings 111 and 171. It is understood that circuitry could be spread out into additional housings. Control circuit 140 in the embodiment of FIG. 10d is incorporated entirely in the housing 171 that is non-integral with portable device housing 111. Housing 171 is shown as being provided by a personal computer housing, but could also be provided by another type of housing such as a cash register housing, a transaction terminal housing or a housing of another portable device such as housing 111. At least one operating program for controlling imaging assembly 133 and for processing image signals generated from imaging assembly 133 is stored in EROM 147-1 located within PC housing 171. For facilitating processing of signals generated from imaging assembly 133 by a processor system that is not integrated into portable housing 111 a high speed data communication link should be established between imaging assembly 133 and processor system 140. In the embodiment of FIG. 10d, I/O interfaces 137-4 and 137-5 and communication link 139 may be configured to operate according to the USB data communication protocol. The configuration shown in FIG. 10d reduces the cost, weight, and size requirements of the portable components of imaging device 110d, which in imaging device 110-4 are the components housed within portable housing 111. Because the configuration of FIG. 10d results in fewer components being incorporated in the portable section 111 of imaging device 110d that are susceptible to damage, the configuration enhances the durability of the portable section of imaging device 110-4 delimited by housing 111.

The control circuit 140 as shown in the embodiment of FIG. 10d can be in communication with more than one "shell" processorless imaging device comprising a imaging device housing and a imaging device circuitry shown by the circuitry within dashed housing border 111 of FIG. 10d. In the case that a control circuit as shown in FIG. 10d services many "shell" imaging devices or processor-equipped imaging devices input/output port 137-5 should be equipped with multiplexing functionality to service the required data communications between several imaging devices and/or shell imaging devices and a single processor system.

Figure 10E:
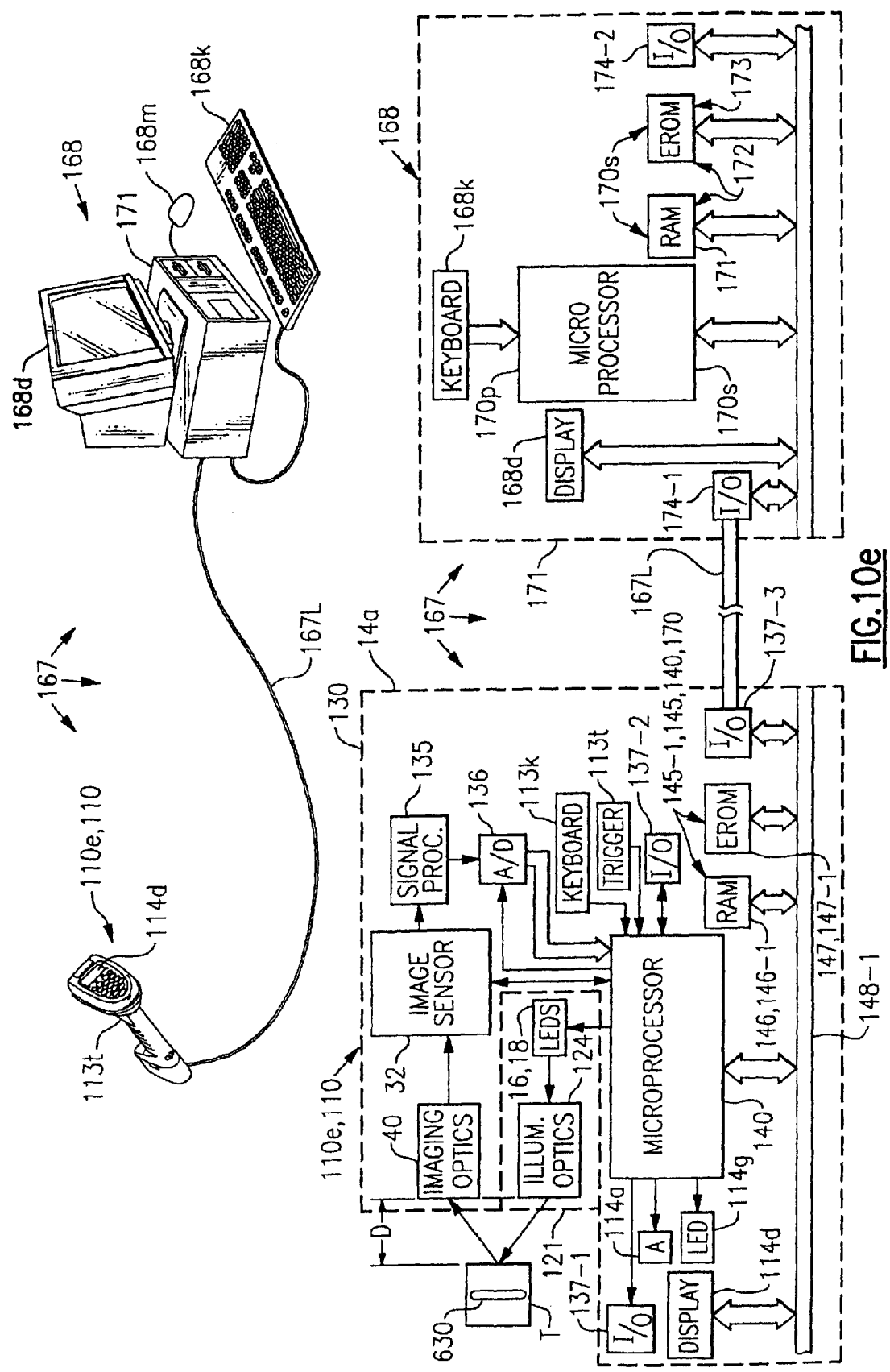

The imaging device communication system of FIG. 10e has a physical layout identical to imaging device 10d, but is optimized for a different operation. System 167 is a communication system in which imaging device processor system 140 communicates with a nonintegrated local host processor assembly 168 provided by a personal computer 168 having a PC housing 171, a processor system 170s, a storage device 175 (e.g. hard drive), a keyboard 168k, a mouse 168m, and a display 168d. Provided that link 167L is a high speed communication link, nonintegrated local host processor system 170s could be programmed to provide functioning identical to processor system 140s of imaging device 110d. However, because imaging device 110e comprises an integrated processor system 140 such programming is normally unnecessary, although as described in copending U.S. patent application Ser. No. 09/385,597, incorporated by reference herein it is useful to configure processor system 140 communication with a host processor system e.g. 170s so that certain components of imaging device 110 such as trigger 113t can be controlled remotely by host processor system 170s, which in one embodiment is nonintegrated. Accordingly, in imaging device-host communication systems as shown in FIG. 10e nonintegrated host processor assembly 168 typically is programmed to provide functions separate from those of the imaging device processor systems described in connection with FIGS. 10a-10d.

As described in U.S. Pat. No. 5,965,863, incorporated herein by reference, one function typically provided by nonintegrated local host processor system 70s is to create operating programs for downloading into imaging device 110. Processor system 170s typically has an operating system incorporated therein, such as WINDOWS, which enables an operator to develop operating programs using a graphical user interface, which may be operated with use of a pointer controller 168m. Nonintegrated local processor system 170s also can be configured to receive messages and/or image data from more than one imaging device, possibly in a keyboard wedge configuration as described in U.S. Pat. No. 6,161,760, incorporated herein by reference. It is also convenient to employ processor system 170 for data processing. For example a spreadsheet program can be incorporated in system 170s which is useful for analyzing data messages from imaging device 110e. An image processing application can be loaded into system 170s which is useful for editing, storing, or viewing electronic images received from imaging device 110e. It is also convenient to configure imaging device 110e to coordinate communication of data to and from a remote processor assembly such as assembly 188-1. Accordingly processor assembly 168 typically includes I/O interface 174-2 which facilitates remote communication with a remote processor assembly, e.g. assembly 188-1 as shown in FIG. 10c.

While the present invention has been described with reference to a number of specific embodiments in order to set forth the best mode thereof, it will be understood that the spirit and scope of the present invention should be determined with reference to the following claims.

We claim:

1. A bar code decoding optical reader comprising:
    an imaging module supporting in combination a solid state image sensor, imaging optics for focusing an image onto said solid state image sensor, and at least one light source, wherein said optical reader has a field of view, wherein the imaging module has a front portion extending substantially in a first plane, and wherein said imaging module is adapted so that light from said at least one light source is projected toward a target defined by said field of view; and
    a housing having an enlarged head portion and a straight elongated body portion, the straight elongated body portion extending from the head portion and having a shorter circumference than a circumference of said enlarged head portion, said optical reader further being configured so that said straight elongated body portion is adapted to be held in a hand, said optical reader further being configured so that said straight elongated body portion extends rearward from said enlarged head portion in a line substantially directed toward said target and substantially normally relative to the first plane,
    wherein disposed at said enlarged head portion of said housing is a trigger for actuation of decoding operations, and wherein said imaging module is disposed within said enlarged head portion, and further
    wherein said optical reader is configured to capture an electronic representation of said target while said optical reader is at a distance spaced apart from said target.

2. The optical reader of claim 1, wherein said housing encapsulates circuitry for wirelessly sending data to a device external from said housing.

3. The optical reader of claim 1, wherein said optical reader is configured so that said field of view is a two dimensional field of view.

4. The optical reader of claim 1, wherein a section of said housing is configured to be detachably attachable with a body external to said section.

5. The optical reader of claim 4, wherein said section is disposed at an interface between said enlarged head portion and said elongated body portion, and wherein said body external to said section is said elongated body portion of said housing.

6. The optical reader of claim 1, wherein said solid state image sensor is a 2D image sensor.

7. A bar code decoding optical reader comprising:
    an imaging module of generally rectangular parallelepiped configuration supporting in combination a solid state image sensor, imaging optics for focusing an image onto said solid state image sensor, and at least one light source, wherein said optical reader has a field of view, wherein the imaging module has a front portion extending substantially in a first plane, and wherein said imaging module is adapted so that light from said at least one light source is projected toward a target defined by said field of view; and
    a housing having an enlarged head portion and a straight elongated body portion, the straight elongated body portion extending from the head portion and having a shorter circumference than a circumference of said enlarged head portion, said optical reader further being configured so that said straight elongated body portion is adapted to be held in a hand, said optical reader further being configured so that said straight elongated body portion extends rearward from said enlarged head portion in direction substantially parallel with sides of said imaging module and substantially normally relative to the first plane,
    wherein disposed at said enlarged head portion of said housing is a trigger for actuation of decoding operations, the trigger being disposed at such position on said enlarged head portion that an imaginary line extending normally from the housing and through the trigger extends through the imaging module, and wherein said imaging module is disposed within said enlarged head portion, and further
    wherein said optical reader is configured to capture an electronic representation of said target while said optical reader is at a distance spaced apart from said target.

8. The optical reader of claim 7, wherein said housing encapsulates circuitry for wirelessly sending data to a device external from said housing.

9. The optical reader of claim 7, wherein said optical reader is configured so that said field of view is a two dimensional field of view.

10. The optical reader of claim 7, wherein a section of said housing is configured to be detachably attachable with a body external to said section.

11. The optical reader of claim 10, wherein said section is disposed at an interface between said enlarged head portion and said elongated body portion, and wherein said body external to said section is said elongated body portion of said housing.

12. The optical reader of claim 7, wherein said solid state image sensor is a 2D image sensor.

13. The optical reader of claim 7, wherein said imaging module includes conductive support posts.

14. The optical reader of claim 7, wherein said at least one light source comprises at least two light sources emitting light in different wavelength emission bands.

15. The optical reader of claim 7, wherein said at least one light source comprises an illuminating light source capable of emitting red light and an aiming light source capable of emitting green light.

16. The optical reader of claim 7, wherein the trigger is disposed at such position on said enlarged head portion that an imaginary line extending normally from the housing and through the trigger extends through the imaging module.

17. A bar code decoding optical reader comprising:
A two-dimensional solid state image sensor, imaging optics, a plurality of illumination light sources and a plurality of aiming light sources, wherein the optical reader has a substantially planar optical member extending substantially in a first plane, and wherein said optical reader is adapted so that light from said plurality of illumination light sources and said plurality of aiming light sources is projected toward a target spaced apart from the optical reader; and
a housing having a straight elongated body portion, said optical reader further being configured so that said straight elongated body portion is adapted to be held in a hand, said optical reader further being configured so that said straight elongated body portion extends substantially normally relative to the first plane,
wherein disposed on said housing is a trigger for actuation of decoding operations, wherein said optical reader is configured to capture an electronic representation while said optical reader is at a distance spaced apart from said target, wherein said plurality of illumination light sources are adapted to emit red light, and wherein said plurality of aiming light sources are adapted to emit blue light so that a projected aiming pattern is in color contrast with a projected illumination pattern.

18. The optical reader of claim 17, wherein said housing encapsulates circuitry for wirelessly sending data to a device external from said housing.

19. The optical reader of claim 17, wherein said substantially planar optical member includes first and second lenses for use in defining a shape of said projected aiming pattern.

20. The optical reader of claim 17, wherein a section of said housing is configured to be detachably attachable with a body external to said section.

21. The optical reader of claim 17, wherein the optical reader includes a support assembly disposed rearward of the substantially planar optical member, and forward of said two-dimensional solid state image sensor, the support assembly being a one piece member carrying first and second slit apertures for use in defining a shape of the projected aiming pattern.

22. The optical reader of claim 17, wherein the optical reader includes a housing disposed thereon a second trigger for use in actuation of decoding operations.

23. The optical reader of claim 17, wherein said two-dimensional solid state image sensor is a CMOS image sensor.

24. A bar code decoding optical reader comprising:
a two-dimensional solid state image sensor, imaging optics, a plurality of illumination light sources and a plurality of aiming light sources, wherein said optical reader has a substantially planar optical member extending substantially in a first plane, and a support assembly disposed rearward of the substantially planar optical member and forward of said two-dimensional solid state image sensor, the support assembly being a one piece member carrying first and second slit apertures, wherein a forward surface of the support assembly is flat in areas of the first and second slit apertures, and wherein said optical reader is adapted so that light emitted from said plurality of illumination light sources and said plurality of aiming light sources is projected toward a target spaced apart from the optical reader; and
a housing having a straight elongated body portion, said optical reader further being configured so that said straight elongated body portion is adapted to be held in a hand, said optical reader further being configured so that said straight elongated body portion extends substantially normally relative to the first plane,
wherein disposed on said housing is a trigger for actuation of decoding operations, wherein said optical reader is configured to capture an electronic representation while said optical reader is at a distance spaced apart from said target, wherein said substantially planar optical member carries first and second lenses for use in shaping aiming light transmitted through said first and second slit apertures, and wherein said plurality of aiming light sources have an emission wavelength band different from an emission wavelength band of said plurality of illumination light sources so that a projected aiming pattern of said optical reader is in color contrast with a projected illumination pattern of said optical reader.

25. The optical reader of claim 24, wherein a section of said housing is configured to be detachably attachable with a body external to said section.

26. The optical reader of claim 24, wherein said two-dimensional solid state image sensor is a CMOS image sensor.

27. The optical reader of claim 24, wherein said bar code decoding optical reader includes an imaging module having conductive support posts.

28. The optical reader of claim 24, wherein said plurality of illumination light sources are adapted to emit red light and wherein said plurality of aiming light sources are adapted to emit blue light.

29. The optical reader of claim 24, wherein the housing has disposed thereon a second trigger for use in actuation of decoding operations.

* * * * *